US012787597B2

(12) United States Patent
Takahashi et al.

(10) Patent No.: US 12,787,597 B2
(45) Date of Patent: Nov. 3, 2026

(54) DISPLAY DEVICE COMPRISING WIRING TRANSMITTING IMAGE DATA AND RECEIVED-LIGHT DATA

(71) Applicant: Semiconductor Energy Laboratory Co., Ltd., Atsugi (JP)

(72) Inventors: Kei Takahashi, Isehara (JP); Kensuke Yoshizumi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1087 days.

(21) Appl. No.: 17/911,200

(22) PCT Filed: Mar. 17, 2021

(86) PCT No.: PCT/IB2021/052198
§ 371 (c)(1),
(2) Date: Sep. 13, 2022

(87) PCT Pub. No.: WO2021/191735
PCT Pub. Date: Sep. 30, 2021

(65) Prior Publication Data

US 2023/0103995 A1 Apr. 6, 2023

(30) Foreign Application Priority Data

Mar. 27, 2020 (JP) ................................ 2020-057185

(51) Int. Cl.
*H10K 59/65* (2023.01)
*H10K 59/131* (2023.01)
(Continued)

(52) U.S. Cl.
CPC ........... *H10K 59/65* (2023.02); *H10K 59/131* (2023.02); *H10K 65/00* (2023.02); *G09G 3/3233* (2013.01);
(Continued)

(58) Field of Classification Search
CPC ...... H10K 59/65; H10K 59/131; H10K 65/00; H10K 59/8722; H10K 59/8731;
(Continued)

(56) References Cited

U.S. PATENT DOCUMENTS

| | | | |
|---|---|---|---|
| 8,357,961 | B2 | 1/2013 | Hanari |
| 9,155,498 | B2 | 10/2015 | Akiyama |

(Continued)

FOREIGN PATENT DOCUMENTS

| | | | |
|---|---|---|---|
| CN | 101751846 | A | 6/2010 |
| CN | 103022072 | A | 4/2013 |

(Continued)

OTHER PUBLICATIONS

International Search Report (Application No. PCT/IB2021/052198) Dated Jun. 22, 2021.

(Continued)

*Primary Examiner* — Rodney Amadiz
(74) *Attorney, Agent, or Firm* — Eric J. Robinson; Robinson Intellectual Property Law Office, P.C.

(57) ABSTRACT

A display device having an imaging function is provided. A display device that can easily achieve a higher resolution is provided. A display device that can perform imaging at higher speed is provided. The display device includes a first pixel, a second pixel, and a first wiring. The first pixel includes a light-emitting element. The second pixel includes a light-receiving element. The first pixel is supplied with image data from the first wiring. The second pixel outputs received-light data to the first wiring.

9 Claims, 27 Drawing Sheets

(51) Int. Cl.
*H10K 65/00* (2023.01)
*G09G 3/3233* (2016.01)
*H10K 59/80* (2023.01)

(52) U.S. Cl.
CPC ..... *H10K 59/8722* (2023.02); *H10K 59/8731* (2023.02)

(58) Field of Classification Search
CPC ............. H10K 59/351; H10K 59/1213; H10K 59/123; H10K 59/35; H10K 59/60; G09G 3/3233; G09G 3/3266; G09G 3/3275; G09G 2300/0426; G09G 2300/0452; G09G 2300/0819; G09G 2354/00; G09G 2360/148; G09G 9/30; G09G 9/335; H05B 33/02
See application file for complete search history.

(56) References Cited

U.S. PATENT DOCUMENTS

| | | | | |
|---|---|---|---|---|
| 9,167,994 | B2 | 10/2015 | Akiyama | |
| 9,841,843 | B2 | 12/2017 | Kurokawa et al. | |
| 10,115,777 | B2 | 10/2018 | Tanaka et al. | |
| 2007/0024547 | A1* | 2/2007 | Jang | G09G 3/3233 345/81 |
| 2007/0236429 | A1* | 10/2007 | Tseng | G09G 3/3225 345/81 |
| 2008/0252223 | A1 | 10/2008 | Toyoda et al. | |
| 2010/0084642 | A1 | 4/2010 | Hanari | |
| 2010/0149079 | A1 | 6/2010 | Yamashita et al. | |
| 2012/0154337 | A1 | 6/2012 | Kurokawa et al. | |
| 2013/0075761 | A1 | 3/2013 | Akiyama | |
| 2015/0302793 | A1* | 10/2015 | In | G09G 5/18 345/82 |
| 2017/0040404 | A1 | 2/2017 | Kusunoki | |
| 2017/0330920 | A1 | 11/2017 | Tanaka et al. | |
| 2021/0020106 | A1* | 1/2021 | Lee | H10K 59/13 |
| 2021/0280146 | A1 | 9/2021 | Kawashima et al. | |

FOREIGN PATENT DOCUMENTS

| | | | |
|---|---|---|---|
| JP | 2008-262176 | A | 10/2008 |
| JP | 2010-091610 | A | 4/2010 |
| JP | 2010-139895 | A | 6/2010 |
| JP | 2010-225157 | A | 10/2010 |
| JP | 2011-215353 | A | 10/2011 |
| JP | 2012-256020 | A | 12/2012 |
| JP | 2013-073965 | A | 4/2013 |
| JP | 2014-197522 | A | 10/2014 |
| JP | 2017-208173 | A | 11/2017 |
| KR | 2010-0069591 | A | 6/2010 |
| KR | 2012-0067292 | A | 6/2012 |
| KR | 2013-0033278 | A | 4/2013 |
| TW | 201246039 | | 11/2012 |

OTHER PUBLICATIONS

Written Opinion (Application No. PCT/IB2021/052198) Dated Jun. 22, 2021.

* cited by examiner

100E

DISPLAY DEVICE COMPRISING WIRING TRANSMITTING IMAGE DATA AND RECEIVED-LIGHT DATA

TECHNICAL FIELD

One embodiment of the present invention relates to a display device. One embodiment of the present invention relates to a display device having an imaging function. One embodiment of the present invention relates to an imaging device. One embodiment of the present invention relates to an electronic device including a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, electronic devices typified by information terminals such as smartphones, tablet terminals, and laptop PCs (personal computers) have been required to have a smaller size and lower power consumption. Display devices incorporated into such electronic devices have been required to have a variety of functions such as a touch panel function and a function of capturing images of fingerprints for authentication, in addition to a function of displaying images.

Light-emitting devices including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-constant voltage source, and have been used in display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device having an imaging function. An object of one embodiment of the present invention is to provide a display device that can easily achieve a higher resolution. An object of one embodiment of the present invention is to provide a display device that can perform imaging at higher speed. An object of one embodiment of the present invention is to provide a display device that can capture an image of fingerprints. An object of one embodiment of the present invention is to provide a display device that functions as a touch panel.

An object of one embodiment of the present invention is to reduce the number of components of an electronic device. An object of one embodiment of the present invention is to provide a multifunctional display device. An object of one embodiment of the present invention is to provide a display device, an imaging apparatus, or an electronic device that has a novel structure. An object of one embodiment of the present invention is to at least reduce at least one of problems of the conventional technique.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a display device including a first pixel, a second pixel, and a first wiring. The first pixel includes a light-emitting element. The second pixel includes a light-receiving element. The first pixel is supplied with image data from the first wiring. The second pixel outputs received-light data to the first wiring.

Another embodiment of the present invention is a display device including first to third wirings and first to sixth pixels. The first pixel, the third pixel, and the fifth pixel include light-emitting elements emitting light of different colors. The second pixel, the fourth pixel, and the sixth pixel each include a light-receiving element. The first pixel is supplied with first image data from the first wiring. The third pixel is supplied with second image data from the second wiring. The fifth pixel is supplied with third image data from the third wiring. The second pixel outputs first received-light data to the first wiring. The fourth pixel outputs second received-light data to the second wiring. The sixth pixel outputs third received-light data to the third wiring.

In the above, the second pixel, the fourth pixel, and the sixth pixel preferably include light-receiving elements receiving light of different colors.

In any of the above, it is preferable that fourth to seventh wirings be further included. In this case, the first pixel is supplied with a first selection signal from the fourth wiring. The second pixel is supplied with a second selection signal from the fifth wiring. The third pixel is supplied with a third selection signal from the sixth wiring. The fourth pixel, the fifth pixel, and the sixth pixel are supplied with a fourth selection signal from the seventh wiring.

In any of the above, the first pixel preferably includes a first transistor and a second transistor. In this case, it is preferable that one of a source and a drain of the first transistor be electrically connected to the first wiring, and the other of the source and the drain of the first transistor be electrically connected to a gate of the second transistor. It is preferable that one of a source and a drain of the second transistor be electrically connected to one electrode of the light-emitting element.

In any of the above, the second pixel preferably includes a third transistor, a fourth transistor, and a fifth transistor. In this case, it is preferable that one of a source and a drain of the third transistor be electrically connected to the first wiring, and the other of the source and the drain of the third transistor be electrically connected to one of a source and a drain of the fourth transistor. It is preferable that a gate of the fourth transistor be electrically connected to one of a source and a drain of the fifth transistor. It is preferable that the one of the source and the drain of the fifth transistor be electrically connected to one electrode of the light-receiving element.

Another embodiment of the present invention is a display device including a first pixel and a first wiring. The first pixel includes a light-emitting and light-receiving element. The light-emitting and light-receiving element has a function of emitting light in accordance with an electric field and a function of performing photoelectric conversion on incident light. The first pixel is supplied with image data from the first wiring. The first pixel outputs received-light data to the first wiring.

Another embodiment of the present invention is a display device including first to third wirings and first to fifth pixels. The first pixel, the second pixel, and the fourth pixel each include a light-emitting and light-receiving element. The light-emitting and light-receiving element has a function of emitting light in accordance with an electric field and a function of performing photoelectric conversion on incident light. The third pixel and the fifth pixel include light-emitting elements emitting light of different colors. The first pixel is supplied with first image data from the first wiring. The second pixel is supplied with second image data from the first wiring. The third pixel is supplied with third image data from the second wiring. The fourth pixel is supplied with fourth image data from the first wiring. The fifth pixel is supplied with fifth image data from the third wiring. The first pixel outputs first received-light data to the first wiring. The second pixel outputs second received-light data to the second wiring. The fourth pixel outputs third received-light data to the third wiring.

In the above, it is preferable that fourth to seventh wirings be further included. In this case, the first pixel is supplied with a first selection signal from the fourth wiring. The second pixel and the third pixel are supplied with a second selection signal from the fifth wiring. The fourth pixel and the fifth pixel are supplied with a third selection signal from the sixth wiring. The first pixel, the second pixel, and the fourth pixel are supplied with a fourth selection signal from the seventh wiring.

In any of the above, the first pixel preferably includes first to sixth transistors. In this case, it is preferable that one of a source and a drain of the first transistor be electrically connected to the first wiring, and the other of the source and the drain of the first transistor be electrically connected to a gate of the second transistor. It is preferable that one of a source and a drain of the second transistor be electrically connected to one of a source and a drain of the sixth transistor. It is preferable that one of a source and a drain of the third transistor be electrically connected to the first wiring, and the other of the source and the drain of the third transistor be electrically connected to one of a source and a drain of the fourth transistor. It is preferable that a gate of the fourth transistor be electrically connected one of a source and a drain of the fifth transistor. It is preferable that the one of the source and the drain of the fifth transistor be electrically connected to one electrode of the light-emitting and light-receiving element. It is preferable that the other of the source and the drain of the sixth transistor be electrically connected to the one electrode of the light-emitting and light-receiving element.

In any of the above, it is preferable that a selector circuit, a digital-analog converter circuit, an analog-digital converter circuit, an eighth wiring, and a ninth wiring be further included. In this case, it is preferable that the selector circuit have a function of selecting electrical continuity between the first wiring and any one of the eighth wiring and the ninth wiring. It is preferable that the digital-analog converter circuit include an output terminal electrically connected to the eighth wiring. It is preferable that the analog-digital converter circuit include an input terminal electrically connected to the ninth wiring.

Effect of the Invention

According to one embodiment of the present invention, a display device having an imaging function can be provided. A display device that can easily achieve a higher resolution can be provided. A display device that can perform imaging at higher speed can be provided. A display device that can capture an image of fingerprints can be provided. A display device functioning as a touch panel can be provided.

According to one embodiment of the present invention, the number of components of an electronic device can be reduced. A multifunctional display device can be provided. A display device, an imaging device, or an electronic device that has a novel structure can be provided. At least one of problems of the conventional technique can be at least reduced.

Note that the description of these effects does not preclude the existence of other effects. One embodiment of the present invention does not have to have all of these effects. Effects other than these can be derived from the description of the specification, the drawings, the claims, and the like.

MODE FOR CARRYING OUT THE INVENTION

Figure 1A:
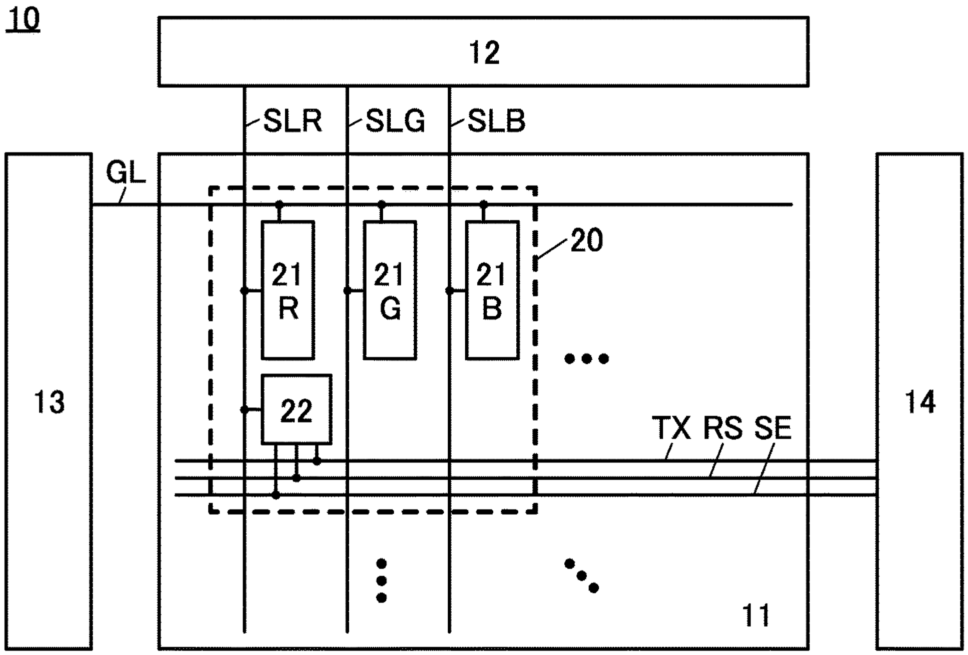
FIG. 1A is a diagram illustrating an example of a display device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

A transistor is a kind of semiconductor element and can achieve a function of amplifying a current or a voltage, a switching operation for controlling conduction or non-conduction, and the like. An IGFET (Insulated Gate Field Effect Transistor) and a thin film transistor (TFT) are in the category of a transistor in this specification.

Functions of a "source" and a "drain" are sometimes replaced with each other when a transistor of opposite polarity is used or when the direction of a current is changed in circuit operation, for example. Therefore, the terms "source" and "drain" can be switched with each other in this specification.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stacked body or the like is described, even in the case where a surface on which the stacked body is provided (e.g., a formation surface, a support surface, an adhesion surface, or a planar surface) is positioned above the stacked body in the drawings, the direction and the opposite direction are referred to as "under" and "over", respectively, in some cases.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of a display device of one embodiment of the present invention are described.

One embodiment of the present invention is a display device including a plurality of pixels arranged in a matrix. Each pixel includes one or more subpixels. Note that in this specification and the like, a subpixel is simply referred to as a pixel in some cases.

The pixel of one embodiment of the present invention includes a display pixel (also referred to as a first pixel or the like) and a light-receiving pixel (also referred to as a second pixel or the like), for example. The display pixel includes a light-emitting element functioning as a display element and a display pixel circuit. The light-receiving pixel includes a light-receiving element functioning as a photoelectric conversion element and a light-receiving pixel circuit. In one embodiment of the present invention, an image can be displayed by the plurality of light-emitting elements arranged in a matrix. In addition, an image can be captured by the plurality of light-receiving elements arranged in a matrix. Accordingly, one embodiment of the present invention can be regarded as a display device having an imaging function.

The light-emitting element can be also referred to as an electroluminescent element, and can emit light at a luminance corresponding to the amount of current flowing through the light-emitting element by being supplied with a voltage between a pair of electrodes. The light-receiving element functions as a photoelectric conversion element and can generate electric charge whose amount corresponds to the intensity of the received light.

The display device includes a first wiring electrically connected to the display pixel and the light-receiving pixel. Image data is input to the display pixel through the first wiring. The image data is data including a data potential, and the display pixel can make the light-emitting element emit light at an emission luminance based on the potential included in first data. The first wiring thus functions as a signal line, a source line, an image signal line, or the like.

The light-receiving pixel can output received-light data to the first wiring. The received-light data is data including information on the intensity of light received by the light-receiving element. The light-receiving pixel has a function of outputting, to the first wiring, data corresponding to the amount of electric charge generated by the light-receiving element, as a current or a potential. The first wiring thus functions as a read line, a read signal line, or the like.

As described above, the first wiring can have both a function of transmitting the image data to the display pixel and a function of transmitting the received-light data output from the light-receiving pixel. This can reduce the number of wirings compared with the case where these functions are assigned to different wirings. Thus, the display device can easily have a higher resolution.

The display pixel and the light-receiving pixel are preferably supplied with different selection signals. For example, in a period during which a first selection signal is supplied to the display pixel, image data supplied from the first wiring can be written to the display pixel. In addition, in a period during which a second selection signal is supplied to the light-receiving pixel, received-light data can be output from the light-receiving pixel to the first wiring. By using different selection signals in this manner, writing operation and reading operation can be performed in different periods.

One pixel preferably includes three display pixels exhibiting different colors and one light-receiving pixel. The display pixels are supplied with image data from different wirings. In this case, in three pixels adjacent to each other in the extending direction of the wiring (also referred to as a column direction), the light-receiving pixels preferably output received-light data to the different wirings. It is further preferable that the three pixels be supplied with a selection signal from the same selection signal line. This enables simultaneous reading of received-light data of three rows, leading to a significant reduction in reading time and an improvement in reading operation speed compared with the case where reading is performed for every column.

Alternatively, the display device may include a light-emitting and light-receiving element that has both a light-emitting function and a light-receiving function. It can also be said that the light-emitting and light-receiving element has a function of emitting light in accordance with an electric field and a function of performing photoelectric conversion on incident light.

In this case, for example, a subpixel electrically connected to the first wiring can include the light-emitting and light-receiving element and a pixel circuit. At this time, the pixel circuit can have a function of controlling light emission of the light-emitting and light-receiving element and a function of controlling light reception and reading of the light-emitting and light-receiving element. The subpixel can make the light-emitting and light-receiving element emit light at a luminance corresponding to image data supplied from the first wiring, and can output received-light data corresponding to the intensity of light received by the light-emitting and light-receiving element to the first wiring.

As described above, one subpixel is made to have a light-emitting function for display and a light-receiving function for imaging, and a signal line and a read line are made common, whereby a display device having an extremely high resolution can be achieved.

More specific examples are described below with reference to drawings.

[Structure Example 1 of Display Device]

[Structure Example 1-1]

FIG. 1A is a circuit diagram of a display device 10. The display device 10 includes a display portion 11, a circuit portion 12, a circuit portion 13, and a circuit portion 14.

The display portion 11 includes a plurality of pixels 20 arranged in a matrix. The pixels 20 each include a pixel 21R, a pixel 21G, a pixel 21B, and a light-receiving pixel 22. The pixel 21R, the pixel 21G, and the pixel 21B can each be referred to as a subpixel. The light-receiving pixel 22 can also be referred to as a subpixel.

The pixel 21R, the pixel 21G, and the pixel 21B each include a light-emitting element. For example, the pixel 21R includes a light-emitting element emitting red light, the pixel 21G includes a light-emitting element emitting green light, and the pixel 21B includes a light-emitting element emitting blue light. Note that a structure may be employed in which the pixel 21R, the pixel 21G, and the pixel 21B each include a light-emitting element emitting white light and use different color filters to emit light of different colors.

The light-receiving pixel 22 includes a light-receiving element functioning as a photoelectric conversion element. The light-receiving element included in the light-receiving pixel 22 has sensitivity with respect to one or more of wavelength ranges of visible light, infrared light, and ultraviolet light.

A wiring GL and a wiring SLR are electrically connected to the pixel 21R. The wiring GL and a wiring SLG are electrically connected to the pixel 21G. The wiring GL and a wiring SLB are electrically connected to the pixel 21B. The light-receiving pixel 22 is electrically connected to a wiring TX, a wiring RS, a wiring SE, and the wiring SLR. The light-receiving pixel 22 is electrically connected to the wiring SLR in the example described here, but may be electrically connected to the wiring SLG or the wiring SLB.

The wiring SLR, the wiring SLG, and the wiring SLB are electrically connected to the circuit portion 12. The wiring GL is electrically connected to the circuit portion 13. The wiring TX, the wiring RS, and the wiring SE are electrically connected to the circuit portion 14.

The circuit portion 12 has a function of a source line driver circuit (also referred to as a source driver) and a function of a read circuit. The circuit portion 12 supplies image data (also referred to as a data signal, an image signal, a source signal, a data potential, or the like) to the pixel 21R, the pixel 21G, the pixel 21B, and the like through the wiring SLR, the wiring SLG, and the wiring SLB. To the circuit portion 12, received-light data (also referred to as a received-light signal, a received-light potential, or the like) is input from the light-receiving pixel 22 through the wiring SLR. The circuit portion 12 has a function of converting the input received-light data into digital imaging data and outputting it to the outside. Note that a circuit portion functioning as a source line driver circuit and a circuit portion functioning as a read circuit may be provided separately. In this case, the two circuit portions may be placed to be connected to opposite ends of the wiring SLR or the like and to face each other with the display portion 11 therebetween.

The circuit portion 13 functions as a gate line driver circuit (also referred to as a gate driver). The circuit portion 13 supplies a selection signal (also referred to as a scan signal, a gate signal, or the like) to the wiring GL. The circuit portion 14 has a function of generating a signal to be supplied to the light-receiving pixel 22 and outputting it to the wiring TX, the wiring RS, and the wiring SE. A signal supplied to the wiring SE can be particularly referred to as a selection signal. Although the circuit portion 13 and the circuit portion 14 are illustrated separately, one circuit portion may have their functions.

[Structure Example 1-1 of Pixel]

Figure 1B:
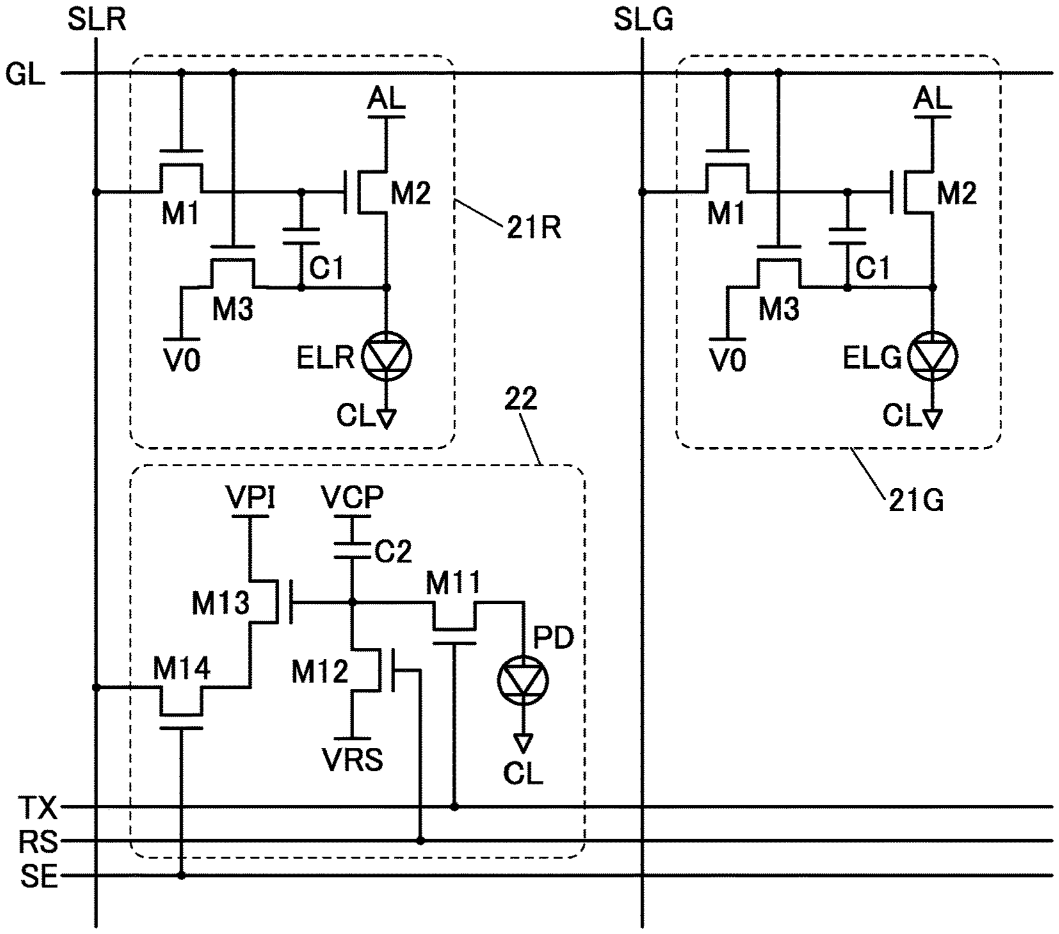
FIG. 1B is a diagram illustrating an example of a pixel.

FIG. 1B illustrates an example of a circuit diagram of the pixel 20. FIG. 1B is a circuit diagram including the pixel 21R, the pixel 21G, and the light-receiving pixel 22. Note that the pixel 21B is omitted because it can have a structure similar to that of the pixel 21G except that the light-emitting element is different and the wiring SLB is electrically connected.

The pixel 21R includes a transistor M1, a transistor M2, a transistor M3, a capacitor C1, and a light-emitting element ELR.

A gate of the transistor M1 is electrically connected to the wiring GL, one of a source and a drain of the transistor M1 is electrically connected to the wiring SLR, and the other thereof is electrically connected to a gate of the transistor M2 and one electrode of the capacitor C1. One of a source and a drain of the transistor M2 is electrically connected to an anode of the light-emitting element ELR, the other electrode of the capacitor C1, and one of a source and a drain of the transistor M3, and the other of the source and the drain of the transistor M2 is electrically connected to a wiring AL. A gate of the transistor M3 is electrically connected to the wiring GL, and the other of the source and the drain of the transistor M3 is electrically connected to a wiring V0. A cathode of the light-emitting element ELR is electrically connected to a wiring CL.

The wiring AL and the wiring CL are supplied with an anode potential and a cathode potential, respectively. Here, the anode potential is a potential higher than the cathode potential. The wiring V0 is supplied with a ground potential, a common potential, or a given potential. For example, the wiring V0 is preferably supplied with a positive potential that is higher than the cathode potential and lower than the anode potential.

Although an example is described here in which the anode of the light-emitting element ELR is electrically connected to the one of the source and the drain of the transistor M2, a structure may be employed in which the anode and the cathode of the light-emitting element ELR are inverted and the cathode is electrically connected to the one of the source and the drain of the transistor M2. In this case, the wiring AL and the wiring CL are supplied with the cathode potential and the anode potential, respectively.

The wiring GL is supplied with a selection signal for controlling the conduction and non-conduction of the transistor M1 and the transistor M3. The transistor M1 and the transistor M3 are brought into a conduction state when the wiring GL is supplied with a high-level potential, and the transistor M1 and the transistor M3 are brought into a non-conduction state when the wiring GL is supplied with a low-level potential. The wiring SLR is supplied with image data including a potential (data potential) to be written to the pixel 21R.

When the transistor M1 and the transistor M3 are in a conduction state, a data potential is supplied from the wiring SLR to the gate of the transistor M2 through the transistor M1, and the capacitor C1 is charged with a voltage corresponding to a potential difference between the wiring V0 and the wiring SLR. Then, the transistor M1 and the transistor M3 are brought into a non-conduction state, whereby the gate potential of the transistor M2 is held. At this time, a current corresponding to the gate potential of the transistor M2 flows through the light-emitting element ELR, and the light-emitting element ELR emits light at a luminance corresponding to the amount of the current.

The pixel 21G is different from the pixel 21R in that the light-emitting element ELR is replaced with a light-emitting element ELG and the wiring SLR is replaced with the wiring SLG. Since the other components are similar to those of the pixel 21R, the above description is referred to for the detailed description.

The light-receiving pixel 22 includes a transistor M11, a transistor M12, a transistor M13, a transistor M14, a capacitor C2, and a light-receiving element PD.

A gate of the transistor M11 is electrically connected to the wiring TX, one of a source and a drain of the transistor M11 is electrically connected to an anode of the light-receiving element PD, and the other thereof is electrically connected to one of a source and a drain of the transistor M12, a gate of the transistor M13, and one electrode of the capacitor C2. A gate of the transistor M12 is electrically connected to the wiring RS, and the other of the source and the drain of the transistor M12 is electrically connected to a wiring VRS. The other electrode of the capacitor C2 is electrically connected to a wiring VCP. One of a source and a drain of the transistor M13 is electrically connected to one of a source and a drain of the transistor M14, and the other of the source and the drain of the transistor M13 is electrically connected to a wiring VPI. A gate of the transistor M14 is electrically connected to the wiring SE, and the other of the source and the drain of the transistor M14 is electrically connected to the wiring SLR.

The wiring CL electrically connected to a cathode of the light-receiving element PD is preferably common to the wirings CL electrically connected to the cathodes of the light-emitting element ELR, the light-emitting element ELG, a light-emitting element ELB (not illustrated), and the like. This can reduce the number of types of power supply potential, so that a power supply circuit or the like can be omitted.

The wiring VCP is supplied with a fixed potential. The wiring VRS is supplied with a fixed potential as a reset potential. The reset potential supplied to the wiring VRS is preferably a potential lower than the cathode potential. The wiring VPI is supplied with a fixed potential for reading. The potential supplied to the wiring VPI can be determined as appropriate in accordance with the structure of the read circuit electrically connected to the wiring SLR, and can be a potential higher than the cathode potential, for example.

Although an example is described here in which the anode of the light-receiving element PD is electrically connected to the one of the source and the drain of the transistor M11, the cathode may be electrically connected to the transistor M11. In that case, the reset potential supplied to the wiring VRS can be a potential higher than the potential supplied to the wiring CL.

The wiring RS is supplied with a potential for controlling the conduction and non-conduction of the transistor M12 as a reset signal. The wiring TX is supplied with a potential for controlling the conduction and non-conduction of the transistor M11 as a transfer signal. The wiring SE is supplied with a potential for controlling the conduction and non-conduction of the transistor M14 as a selection signal. The transistor M11 has a function of transferring electric charge (carriers) accumulated in the anode of the light-receiving element PD to a node connected to the gate of the transistor M13, and thus can also be referred to as a transfer transistor. The transistor M12 has a function of resetting, with a potential supplied to the wiring VRS, a potential of the node electrically connected to the gate of the transistor M13, and thus can also be referred to as a reset transistor. The transistor M14 functions as a switch for controlling electrical continuity and discontinuity between the transistor M13 and the wiring SLR. When the transistor M14 is in a conduction state, a current corresponding to the gate potential of the transistor M13 flows to the wiring SLR, whereby received-light data can be output. Thus, the transistor M14 can also be referred to as a read transistor.

The light-receiving pixel 22 is electrically connected to the wiring SLR in the example illustrated in FIG. 1A and FIG. 1B, but may be electrically connected to the wiring SLG or the wiring SLB.

[Structure Example 1-1 of Display Portion]

Figure 2:
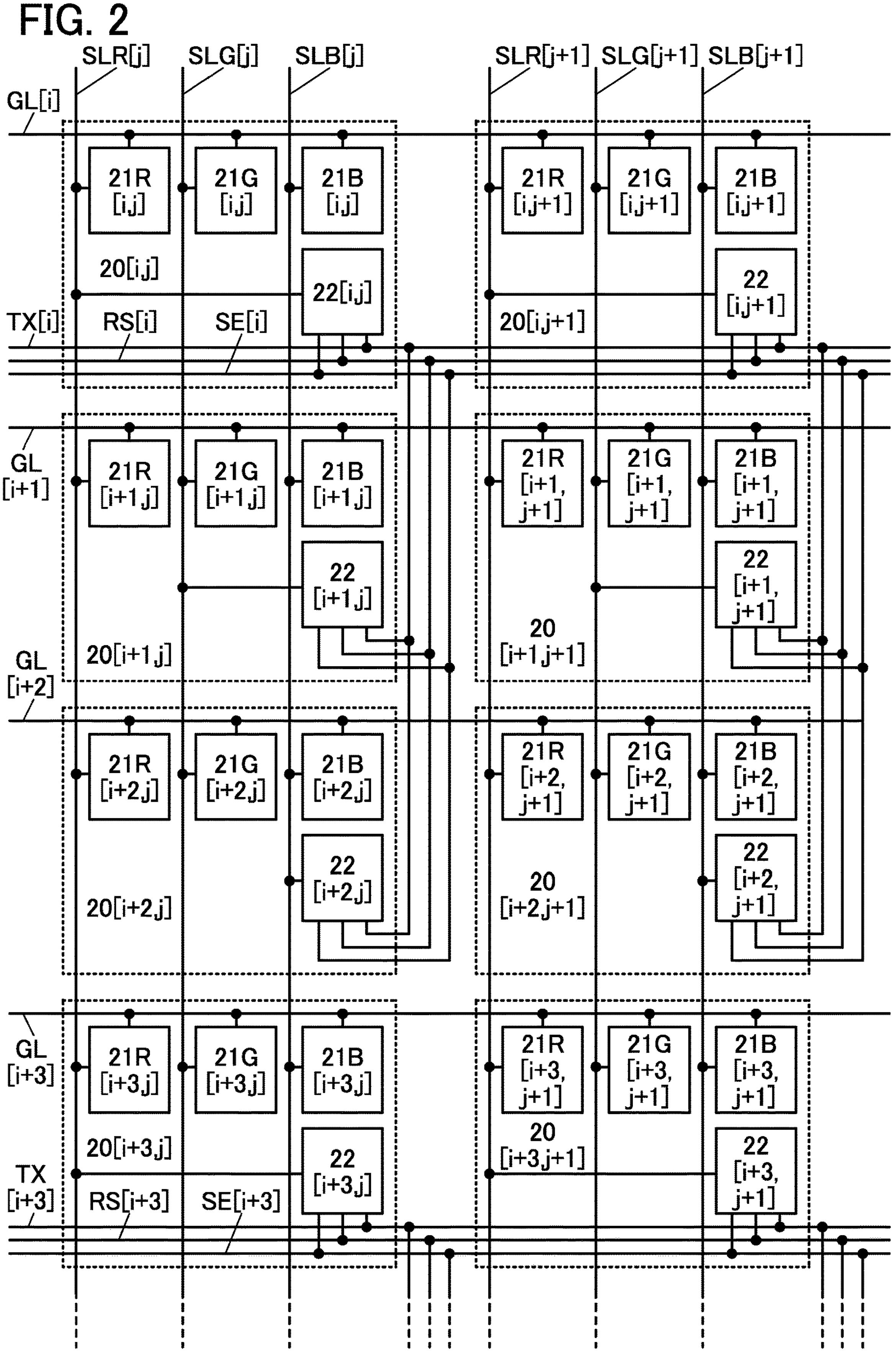
FIG. 2 is a diagram illustrating an example of a display portion.

FIG. 2 illustrates a structure example of part of a display portion. In the display portion, the pixels 20 are arranged in M rows and N columns (each of M and N is independently an integer of 2 or more). FIG. 2 illustrates eight pixels 20 in four rows and two columns. Specifically, eight pixels from a pixel 20[*i,j*] in the i-th row and the j-th column (i is an integer greater than or equal to 1 and less than or equal to M−3, and j is an integer greater than or equal to 1 and less than or equal to N−1) to a pixel 20[*i*+3, j+1] in the (i+3)th row and the (j+1)th column are illustrated.

Note that in this specification and the drawings, [i], [j], [i,j], or the like corresponding to the i-th row (i-th), the j-th column (j-th), the i-th row and the j-th column, or the like is added after a reference numeral in order to distinguish a plurality of components such as the pixels 20 and the wirings from each other.

The pixel 20[*i,j*] includes a pixel 21R[i,j], a pixel 21G[i,j], a pixel 21B[i,j], and a light-receiving pixel 22[*i,j*]. The pixel 21R[i,j] is electrically connected to a wiring GL[i] and a wiring SLR[j]. The pixel 21G[i,j] is electrically connected to the wiring GL[i] and a wiring SLG[j]. The pixel 21B[i,j] is electrically connected to the wiring GL[i] and a wiring SLB[j].

Here, a wiring TX[i], a wiring RS[i], and a wiring SE[i] are electrically connected to the light-receiving pixel 22[*i,j*] positioned in the i-th row, a light-receiving pixel 22[*i*+1,j] positioned in the (i+1)th row, and a light-receiving pixel 22[*i*+2,j] positioned in the (i+2)th row. That is, three light-receiving pixels 22 adjacent to each other in the column direction are supplied with a signal from one wiring TX, one wiring RS, and one wiring SE.

Furthermore, the light-receiving pixel 22[*i,j*] in the i-th row is electrically connected to the wiring SLR[j], the light-receiving pixel 22[*i*+1, j] in the (i+1)th row is electrically connected to the wiring SLG[j], and the light-receiving pixel 22[*i*+2, j] in the (i+2)th row is electrically connected to the wiring SLB[j].

Similarly, the light-receiving pixels 22 in the (i+3)th and subsequent rows are electrically connected to SLR[j], SLG [j], and SLB[j] sequentially. One wiring TX, one wiring RS, and one wiring SE are electrically connected to the light-receiving pixels 22 in three rows.

Such a structure enables simultaneous reading of received-light data from the light-receiving pixels 22 in three rows. Specifically, in accordance with a selection signal supplied to the wiring SE[i], received-light data is output from the light-receiving pixel 22[*i,j*] in the i-th row to the wiring SLR[j], received-light data is output from the light-receiving pixel 22[*i*+1, j] in the (i+1)th row to the wiring SLG[j], and received-light data is output from the light-receiving pixel 22[*i*+2, j] in the (i+2)th row to the wiring SLB[j]. Accordingly, high-speed reading operation can be achieved.

In addition, the number of the wirings TX, the wirings RS, and the wirings SE can be reduced to one-third as compared with a structure where reading is performed for every row. This can achieve a display device having a high resolution. Furthermore, the structure of a driver circuit (e.g., the circuit portion 14) can be simplified.

[Structure Example of Circuit Portion 12]

Structure examples of the circuit portion 12 having both a function of a source driver and a function of a read circuit are described below.

Figure 3:
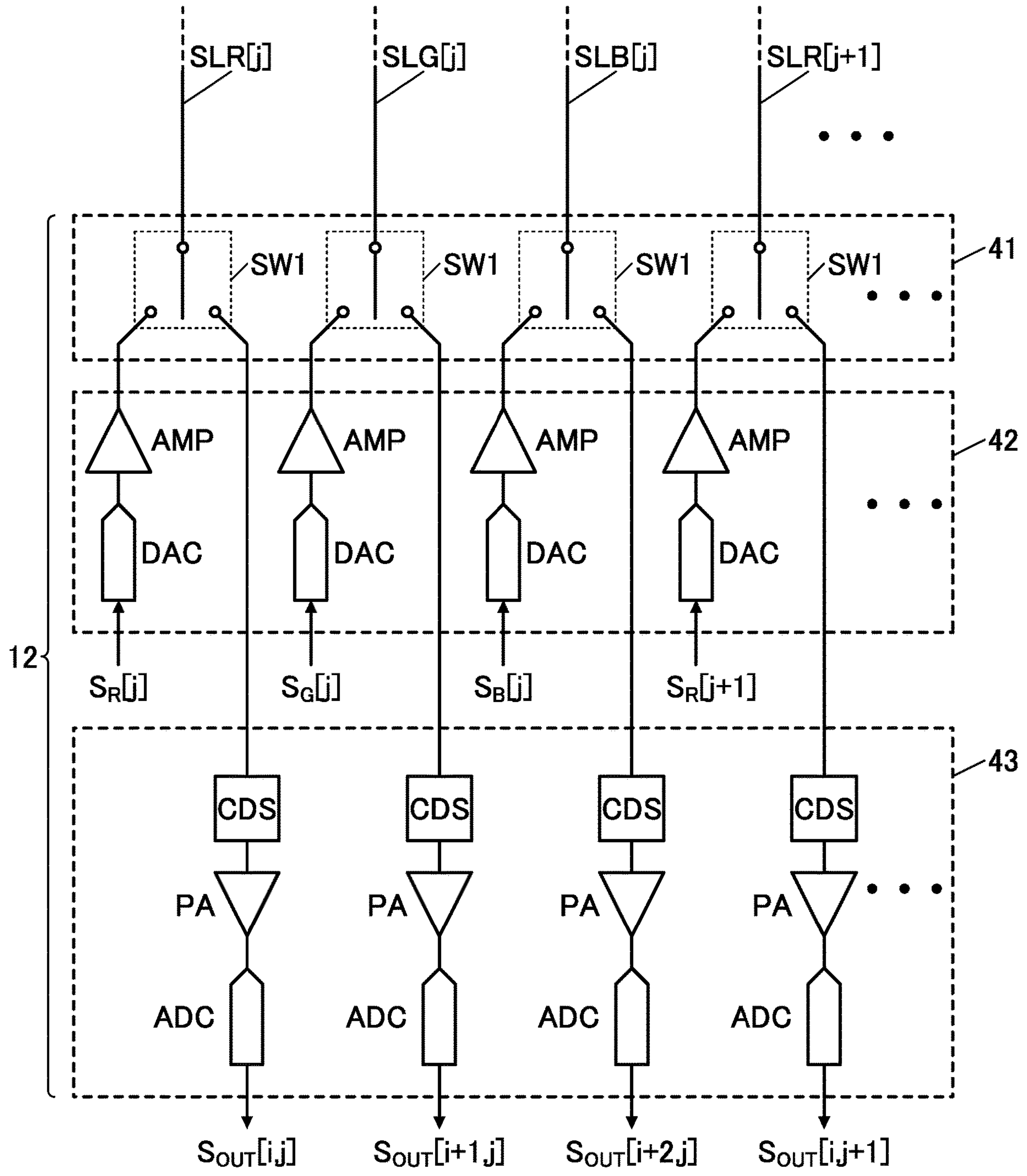
FIG. 3 is a diagram illustrating an example of a circuit portion.

FIG. 3 is a circuit diagram illustrating part of the circuit portion 12. The circuit portion 12 includes a circuit portion 41, a circuit portion 42, and a circuit portion 43. The circuit portion 12 is electrically connected to the wiring SLR, the wiring SLG, and the wiring SLB. FIG. 3 illustrates the wiring SLR[j], the wiring SLG[j], the wiring SLB[j], and a wiring SLR[j+1] as an example.

The circuit portion 42 functions as a source driver (a source line driver circuit or a signal line driver circuit) and can output image data to the wiring SLR and the like.

The circuit portion 43 functions as a read circuit and can convert received-light data input from the wiring SLR and the like into a digital signal and output the digital signal.

The circuit portion 41 functions as a selector circuit and includes a plurality of switches SW1. The circuit portion 41 selects, with the use of the switches SW1, whether to electrically connect the wiring SLR and the like and the circuit portion 42 or to electrically connect the wiring SLR or the like and the circuit portion 43.

The circuit portion 42 includes a plurality of converter circuits DAC functioning as digital-analog converter circuits and a plurality of amplifier circuits AMP. An output terminal of the converter circuit DAC is electrically connected to an input terminal of the amplifier circuit AMP through a wiring, and an output terminal of the amplifier circuit AMP is electrically connected to one of the switches SW1 included in the circuit portion 42. The converter circuit DAC has a function of receiving a video signal $S_R$, a video signal $S_G$, a video signal $S_B$, or the like that is a digital signal, converting the video signal into a signal that is an analog signal (corresponding to image data), and outputting the signal.

The circuit portion 43 includes a plurality of CDS circuits CDS, a plurality of amplifier circuits PA, and a plurality of converter circuits ADC. An input terminal of the converter circuit ADC is electrically connected to an output terminal of the amplifier circuit PA through a wiring, an input terminal of the amplifier circuit PA is electrically connected to an output terminal of the CDS circuit CDS, and an input terminal of the CDS circuit is electrically connected to one of the switches SW1 included in the circuit portion 42 through a wiring. The CDS circuit CDS is a circuit capable of performing correlated double sampling. The amplifier circuit PA is a circuit that amplifies an output signal of the CDS circuit CDS and output it to the converter circuit ADC. The converter circuit ADC has a function of converting a signal that is an analog signal (corresponding to received-light data) input through the wiring SLR or the like into an output signal $S_{OUT}$ that is a digital signal, and outputting the output signal $S_{OUT}$.

The circuit portion 41 selects (controls) electrical continuity between the wiring SLR (the wiring SLG or the wiring SLB) and any one of a wiring connected to the output terminal of the amplifier circuit AMP included in the circuit portion 42 and a wiring connected to the input terminal of the CDS circuit CDS included in the circuit portion 43. For example, in operation of writing image data to the pixel 20, electrical continuity is established between the wiring SLR or the like and the output terminal of the amplifier circuit AMP in the circuit portion 42. Meanwhile, in operation of reading received-light data from the light-receiving pixel 22, electrical continuity is established between the wiring SLR or the like and the input terminal of the CDS circuit CDS in the circuit portion 43.

Figure 4:
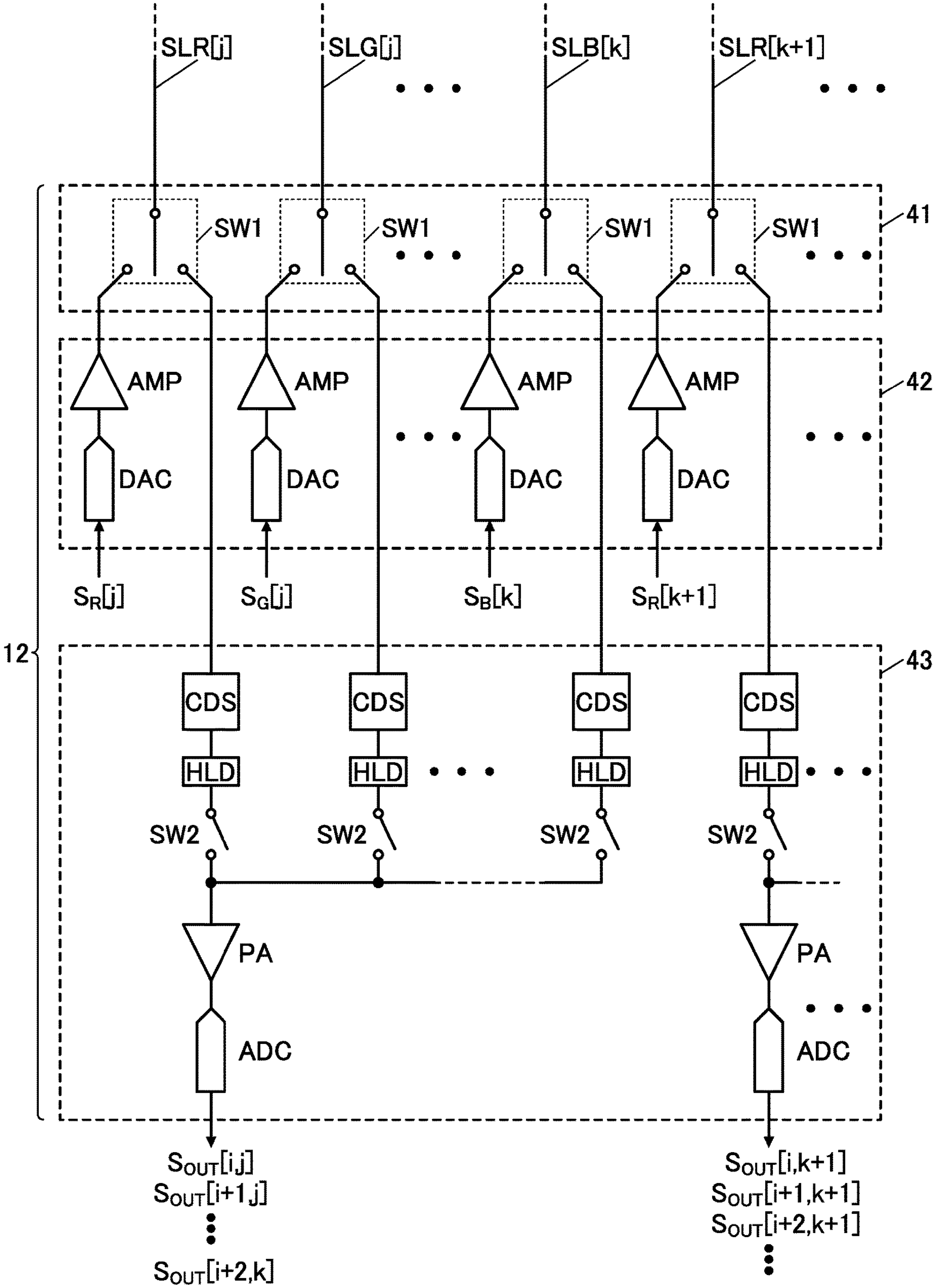
FIG. 4 is a diagram illustrating an example of a circuit portion.

FIG. 4 illustrates an example of the circuit portion 12 whose structure is partly different from that of the above. The circuit portion 12 illustrated in FIG. 4 is different from the above mainly in the structure of the circuit portion 43.

In the circuit portion 43 illustrated in FIG. 4, one amplifier circuit PA and one converter circuit ADC are provided for 3(k−j) wirings (k is an integer greater than or equal to 2 and less than or equal to M, and greater than j) from the wiring SLR[j] in the j-th column to a wiring SLB[k] in the k-th column. Each of the wirings SLR and the like is electrically connected to the input terminal of the CDS circuit CDS through the switch SW1 and a wiring. The output terminal of the CDS circuit CDS is electrically connected to an input terminal of a holding circuit HLD. An output terminal of the holding circuit HLD is electrically connected to the input terminal of the amplifier circuit PA through a switch SW2.

The wirings SLR and the like in the (k+1)th and subsequent columns and in the (j−1)th and previous columns (not illustrated) can each have a structure similar to the above.

The holding circuit HLD has a function of holding analog data input from the CDS circuit CDS. When the switch SW2 is brought into a conduction state, the analog data held in the holding circuit HLD is output to the amplifier circuit PA.

When one of the plurality of switches SW2 is in a conduction state, the others are all controlled to be in a non-conduction state. In addition, the plurality of switches SW2 are controlled to be brought into a conduction state sequentially.

The circuit portion 43 can sequentially read received-light data that are input from the plurality of wirings SLR and the like in the same period, and can output the received-light data as serial digital signals. FIG. 4 illustrates an example in which 3(k−j) signals from a signal $S_{OUT}$[i,j] to a signal $S_{OUT}$[i+2, k] are sequentially output from the converter circuit ADC.

Such a structure can greatly reduce the number of the converter circuits ADC and the amplifier circuits PA. In particular, the converter circuit ADC has a relatively large circuit scale, and thus the reduction in the number of the converter circuits ADC leads to a great reduction in the area occupied by the circuit portion 12.

Figure 5:
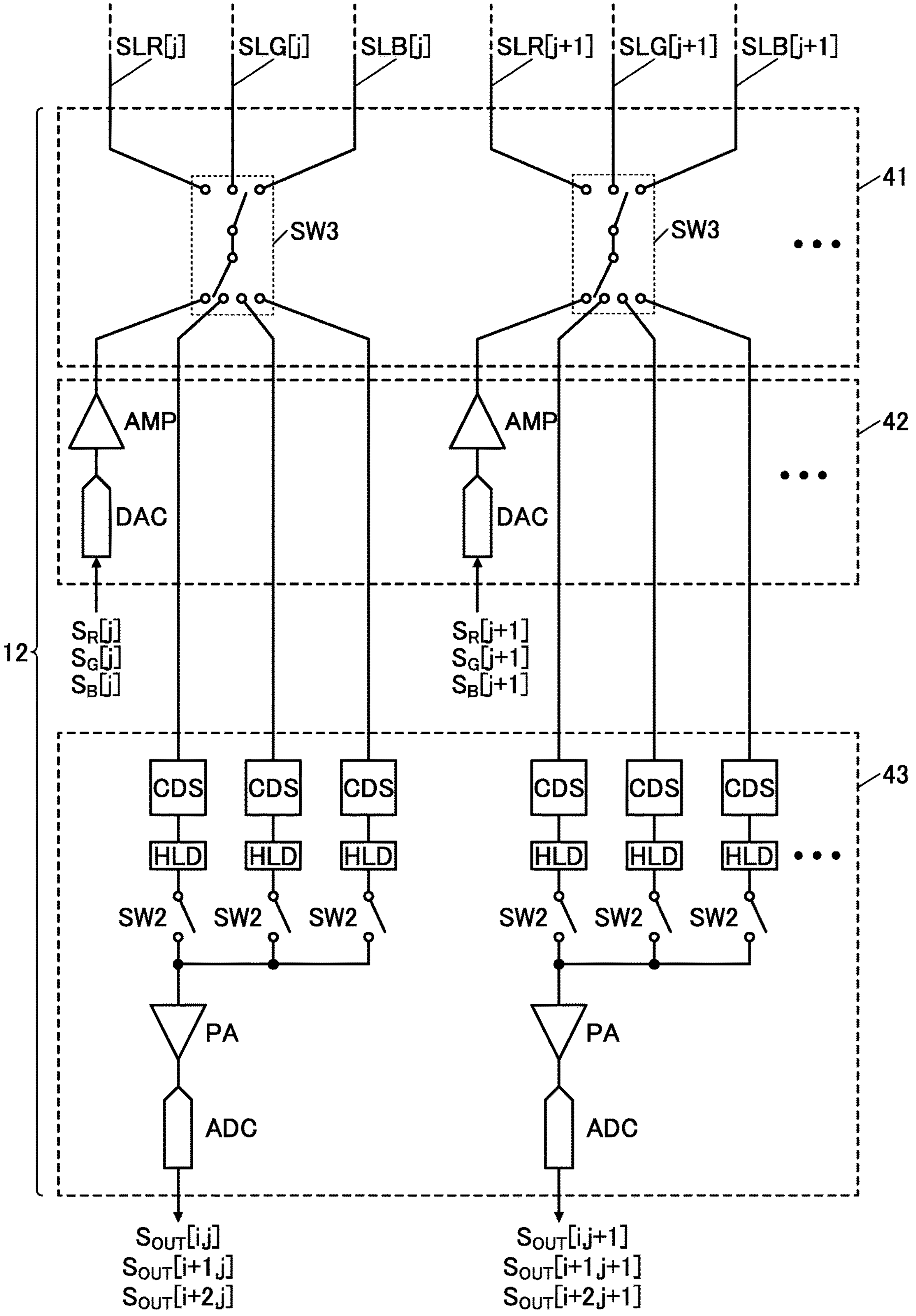
FIG. 5 is a diagram illustrating an example of a circuit portion.

FIG. 5 illustrates an example of the circuit portion 12 whose structure is partly different from that of the above.

The circuit portion 41 includes a plurality of switches SW3. For example, the switch SW3 positioned in the j-th column can establish electrical continuity between any one of the wiring SLR[j], the wiring SLB[j], and the wiring SLB[j] and any one of four terminals. One of the four terminals electrically connected to the switch SW3 is electrically connected to the output terminal of the amplifier circuit AMP in the circuit portion 42. The other three terminals are electrically connected to the input terminals of the CDS circuits CDS included in the circuit portion 43. As in FIG. 4, each CDS circuit CDS is electrically connected to the amplifier circuit PA and the converter circuit ADC through the holding circuit HLD and the switch SW2.

That is, in the example illustrated in FIG. 5, one amplifier circuit AMP, one converter circuit DAC, one amplifier circuit PA, and one converter circuit ADC are provided for three wirings (the wiring SLR, the wiring SLG, and the wiring SLB).

Although an example in which the three wirings (the wiring SLR and the like) are electrically connected to the switch SW3 is described here, four or more wirings may be connected.

Such a structure can reduce the number of the amplifier circuits AMP, the converter circuits DAC, the amplifier circuits PA, and the converter circuits ADC. In particular, the converter circuit DAC has a relatively large circuit scale like the converter circuit ADC, and thus the reduction in the number of the converter circuits DAC and the converter circuits ADC leads to a great reduction in the area occupied by the circuit portion 12.

[Structure Example 2 of Display Device]

Structure examples of the display device in the case of employing a light-emitting and light-receiving element are described below.

Note that hereinafter, portions common to the above are denoted by the same reference numerals and the detailed description thereof is omitted in some cases. Unless otherwise specified, the above description can be referred to for components denoted by the same reference numerals as the above. Unless otherwise specified, the description relating to the components denoted by the same reference numerals as the above can be referred to for the components mentioned above as an example.

A light-emitting and light-receiving element (also referred to as a light-emitting and light-receiving device) is an element having a function of a light-emitting element (also referred to as a light-emitting device) that emits light of the first color, and a function of a photoelectric conversion element (also referred to as a photoelectric conversion device) that receives light of the second color. The light-emitting and light-receiving element can also be referred to as a multifunctional element, a multifunctional diode, a light-emitting photodiode, a bidirectional photodiode, or the like.

A plurality of subpixels each including a light-emitting and light-receiving element are arranged in a matrix, whereby the display device can have a function of displaying images and a function of capturing images. Thus, the display device can also be referred to as a composite device or a multifunctional device.

[Structure Example 2-1]

Figure 6A:
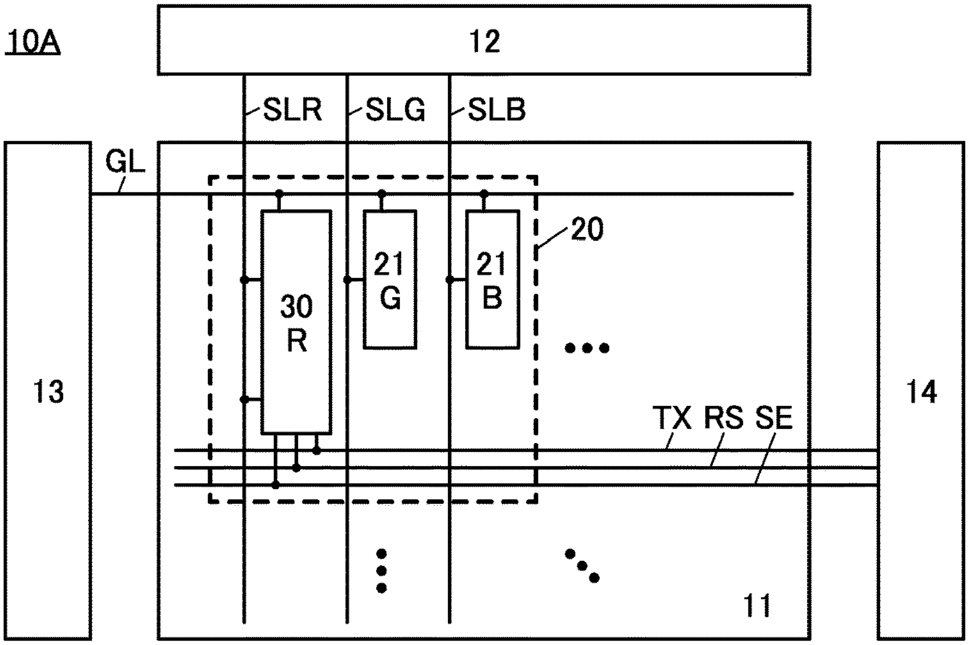
FIG. 6A is a diagram illustrating an example of a display device.

FIG. 6A is a circuit diagram for illustrating a structure of a display device 10A. The display device 10A is different from the display device 10 illustrated in FIG. 1A mainly in the structure of the pixel 20.

The pixel 20 includes a pixel 30R, the pixel 21G, and the pixel 21B functioning as subpixels. The pixel 30R includes a light-emitting and light-receiving element. The pixel 21G and the pixel 21B each include a light-emitting element.

The pixel 30R includes a light-emitting and light-receiving element that emits red light and receives one or both of green light and blue light, for example. Furthermore, the pixel 21G includes a light-emitting element that emits green light, and the pixel 21B includes a light-emitting element that emits blue light. Thus, a full-color image can be displayed on the display portion 11. When imaging is performed with the use of the light-emitting and light-receiving element, light from the light-emitting element included in the pixel 21G or the pixel 21B can be used as a light source, which is preferable because there is no need to additionally provide a light source for imaging.

The pixel 30R is electrically connected to the wiring GL, the wiring SLR, the wiring TX, the wiring RS, and the wiring SE.

Although an example is described here in which the pixel 21R and the light-receiving pixel 22 in the display device 10 are replaced with one pixel 30R, the structure is not limited thereto. For example, the pixel 21G or the pixel 21B and the light-receiving pixel 22 may be replaced with a pixel including a light-emitting and light-receiving element.

[Structure Example 2-1 of Pixel]

Figure 6B:
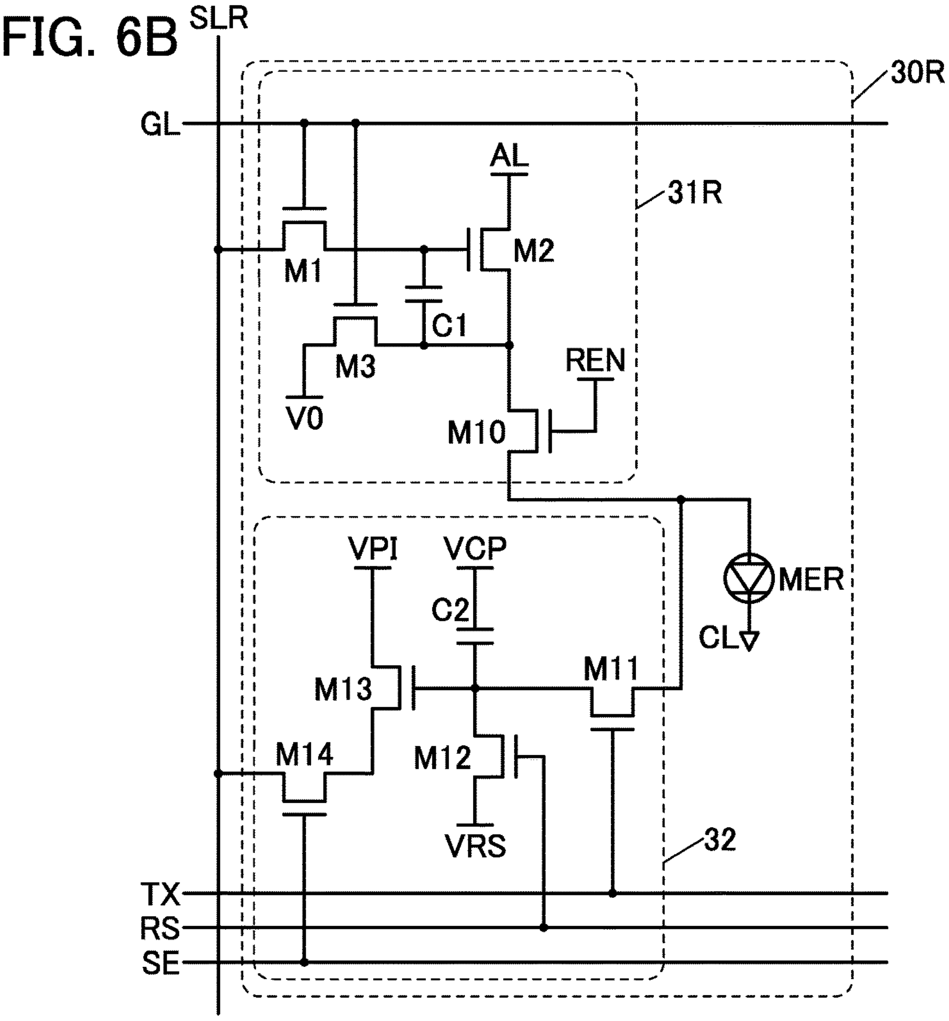
FIG. 6B is a diagram illustrating an example of a pixel.

FIG. 6B illustrates an example of a circuit diagram of the pixel 30R. Note that the above description can be referred to for the pixel 21G and the pixel 21B, and thus the description thereof is omitted.

The pixel 30R includes a circuit 31R, a circuit 32, and a light-emitting and light-receiving element MER. The circuit 31R includes the transistors M1 to M3, a transistor M10, and the capacitor C1. The circuit 32 includes the transistors M11 to M14 and the capacitor C2.

The circuit 31R functions as a circuit for controlling light emission of the light-emitting and light-receiving element MER when the light-emitting and light-receiving element MER is used as a light-emitting element. The circuit 31R has a function of controlling a current flowing through the light-emitting and light-receiving element MER in accordance with the value of a data potential supplied from the wiring SLR.

The circuit 32 functions as a sensor circuit for controlling the operation of the light-emitting and light-receiving element MER in the case where the light-emitting and light-receiving element MER is used as a light-receiving element. The circuit 32 has a function of applying a reverse bias voltage to the light-emitting and light-receiving element MER, a function of controlling the light exposure period of the light-emitting and light-receiving element MER, a function of holding a potential based on electric charge transferred from the light-emitting and light-receiving element MER, a function of outputting a signal (received-light data) based on the potential to the wiring SLR, and the like.

A gate of the transistor M1 is electrically connected to the wiring GL, one of a source and a drain of the transistor M1 is electrically connected to the wiring SLR, and the other thereof is electrically connected to a gate of the transistor M2 and one electrode of the capacitor C1. One of a source and a drain of the transistor M2 is electrically connected to one of a source and a drain of the transistor M10, the other electrode of the capacitor C1, and one of a source and a drain of the transistor M3, and the other of the source and the drain of the transistor M2 is electrically connected to the wiring AL. A gate of the transistor M3 is electrically connected to the wiring GL, and the other of the source and the drain of the transistor M3 is electrically connected to the wiring V0. A gate of the transistor M10 is electrically connected to a wiring REN, and the other of the source and the drain of the transistor M10 is electrically connected to an anode of the light-emitting and light-receiving element MER.

A cathode of the light-emitting and light-receiving element MER is electrically connected to the wiring CL.

A constant potential is supplied to the wiring V0. An anode potential is supplied to the wiring AL. A cathode potential is supplied to the wiring CL. In the structure illustrated in FIG. 6B, the anode potential is a potential higher than the cathode potential. A signal for controlling the conduction state and non-conduction state of the transistor M10 is supplied to the wiring REN.

A gate of the transistor M11 is electrically connected to the wiring TX, one of a source and a drain of the transistor M11 is electrically connected to the anode of the light-emitting and light-receiving element MER, and the other thereof is electrically connected to one of a source and a drain of the transistor M12, a gate of the transistor M13, and one electrode of the capacitor C2. A gate of the transistor M12 is electrically connected to the wiring RS, and the other of the source and the drain of the transistor M12 is electrically connected to the wiring VRS. The other electrode of the capacitor C2 is electrically connected to the wiring VCP. One of a source and a drain of the transistor M13 is electrically connected to one of a source and a drain of the transistor M14, and the other of the source and the drain of the transistor M13 is electrically connected to the wiring VPI. A gate of the transistor M14 is electrically connected to the wiring SE, and the other of the source and the drain of the transistor M14 is electrically connected to the wiring SLR.

The transistor M1, the transistor M3, the transistor M10, the transistor M11, the transistor M12, and the transistor M14 each function as a switch. The conduction state of the transistor M2 and the transistor M13 changes in accordance with potentials of nodes connected to the gates. The transistor M2 and the transistor M13 can be referred to as a drive transistor and a read transistor, respectively.

Here, transistors with an extremely low off-state leakage current are preferably used as the above transistors functioning as switches. In particular, transistors including an oxide semiconductor in a semiconductor layer where a channel is formed can be favorably used. It is preferable to use transistors including an oxide semiconductor also as the transistor M2 and the transistor M13, in which case all the transistors can be formed through the same manufacturing steps. Note that as for the transistor M2 and the transistor M13, silicon (including amorphous silicon, polycrystalline silicon, and single crystal silicon) may be used in a semiconductor layer where a channel is formed. Without limitation to the above, transistors containing silicon can be used as some or all of the transistors. Alternatively, transistors including an inorganic semiconductor other than silicon, a compound semiconductor, an organic semiconductor, or the like can be used as some or all of the transistors.

Here, the transistor M10 has a function of controlling electrical continuity between the transistor M2 and the light-emitting and light-receiving element MER. For example, the transistor M10 can be in a non-conduction state in a period during which the light-emitting and light-receiving element MER is used as a light-receiving element. Meanwhile, the transistor M10 can be in a conduction state in the case where the light-emitting and light-receiving element MER is used as a light-emitting element. When the transistor M10 functioning as a switch is provided between the transistor M2 and the light-emitting and light-receiving element MER in this manner, a period for electrically separating the circuit 31R and the light-emitting and light-receiving element MER can be provided.

Specifically, the transistor M10 is set in a conduction state in a period for writing data to the circuit 31R and a holding and light-emitting period, whereby the light-emitting and light-receiving element MER and the circuit 31R can be electrically connected to each other. At this time, the light-emitting and light-receiving element MER and the circuit 32 may be electrically separated from each other by bringing the transistor M11 into a non-conduction state.

Meanwhile, the transistor M10 is set in a non-conduction state in a reset period, a light exposure period, a holding period, and a reading period in the circuit 32. Accordingly, the light-emitting and light-receiving element MER and the circuit 31R can be electrically separated from each other. This state can prevent light emission due to a current flowing to the light-emitting and light-receiving element MER through the transistor M2, even in a state where data is held in the circuit 31R.

[Structure Example 2-2 of Pixel]

A structure example of a pixel whose structure is partly different from that of the above is described below.

Figure 7:
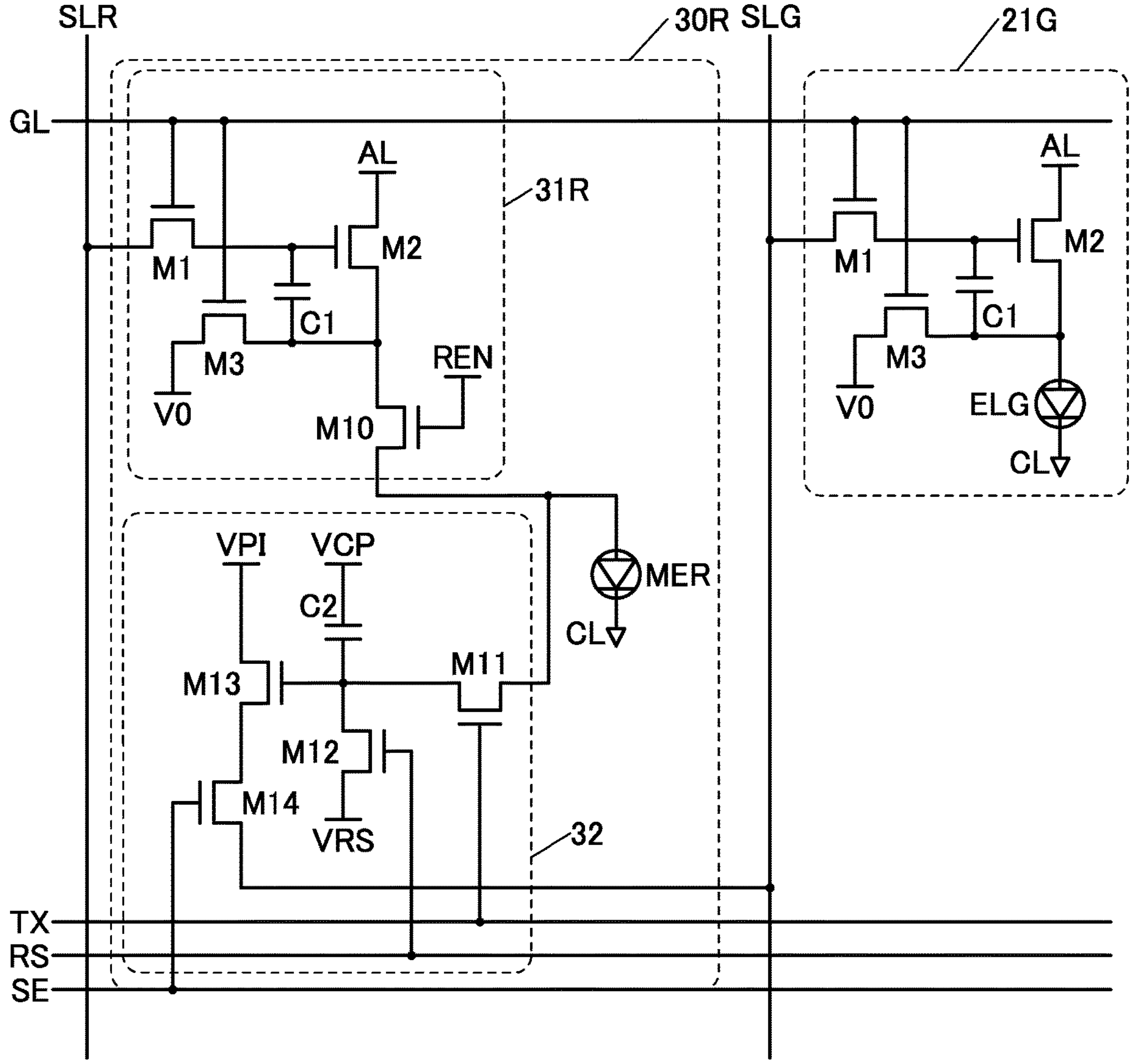
FIG. 7 is a diagram illustrating an example of a pixel.

FIG. 7 illustrates the pixel 30R and the pixel 21G. In the pixel 30R illustrated in FIG. 7, the circuit 31R is electrically connected to the wiring SLR and the circuit 32 is electrically connected to the wiring SLG. The pixel 30R illustrated in FIG. 7 is different from that in FIG. 6B mainly in the connection of the transistor M14. The pixel 21G has a structure similar to that in FIG. 1B.

In the circuit 32, the other of the source and the drain of the transistor M14 is electrically connected to the wiring SLG.

In the pixel 30R, image data can be input from the wiring SLR and received-light data can be output to the wiring SLG.

Although an example in which the received-light data is output to the wiring SLG is described here, a similar structure may be employed in the case where the received-light data is output to the wiring SLB. Specifically, the other of the source and the drain of the transistor M14 is electrically connected to the wiring SLB.

[Structure Example 2-1 of Display Portion]

Figure 8:
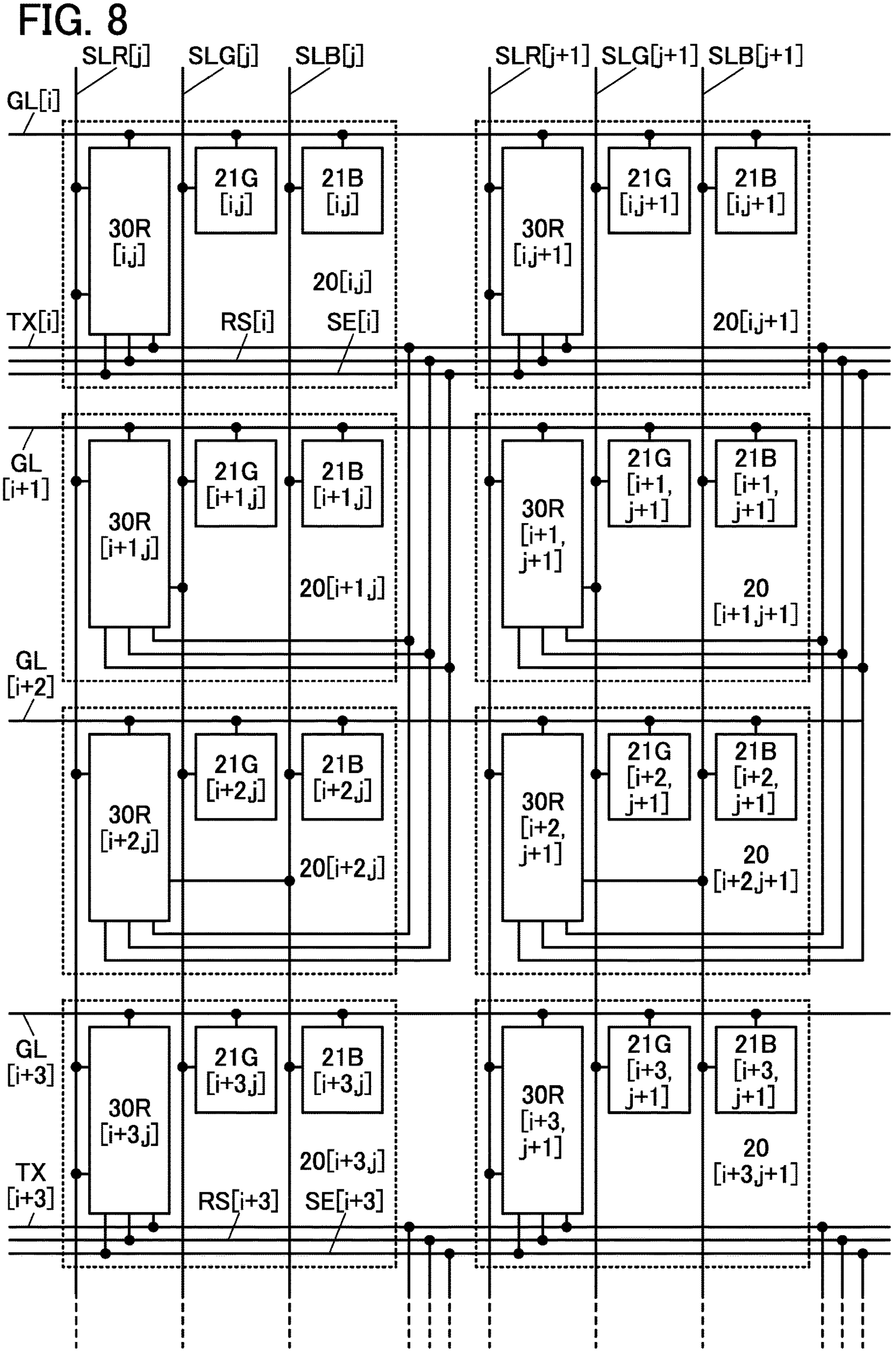
FIG. 8 is a diagram illustrating an example of a display portion.

FIG. 8 illustrates a structure example of part of a display portion including the pixel 30R. FIG. 8 is an example in which the pixel 21R and the light-receiving pixel 22 in FIG. 2 are replaced with the pixel 30R.

A pixel 30R[i,j] and a pixel 30R[i, j+1] in the i-th row can output received-light data to the wiring SLR[j] and the wiring SLR[j+1], respectively. A pixel 30R[i+1, j] and a pixel 30R[i+1, j+1] in the (i+1)th row can output received-light data to the wiring SLG[j] and the wiring SLG[j+1], respectively. A pixel 30R[i+2, j] and a pixel 30R[i+2, j+1] in the (i+2)th row can output received-light data to the wiring SLB[j] and the wiring SLB[j+1], respectively.

As illustrated in FIG. 8, the plurality of pixels 30R provided in the i-th row, the (i+1)th row, and the (i+2)th row are each electrically connected to the wiring TX[i], the wiring RS[i], and the wiring SE[i]. Accordingly, the received-light data of three rows of the i-th row, the (i+1)th row, and the (i+2)th row can be output to the wiring SLR, the wiring SLG, and the wiring SLB simultaneously.

The circuit portion 12 connected to the wiring SLR, the wiring SLG, and the wiring SLB can have any of the structures described in the above structure example of the circuit portion 12 and FIG. 3 and FIG. 4.

[Structure Example 3 of Display Device]

An example of a display device in which one pixel includes a plurality of light-receiving elements or a plurality of light-emitting and light-receiving elements is described below.

[Structure Example 3-1]

Figure 9A:
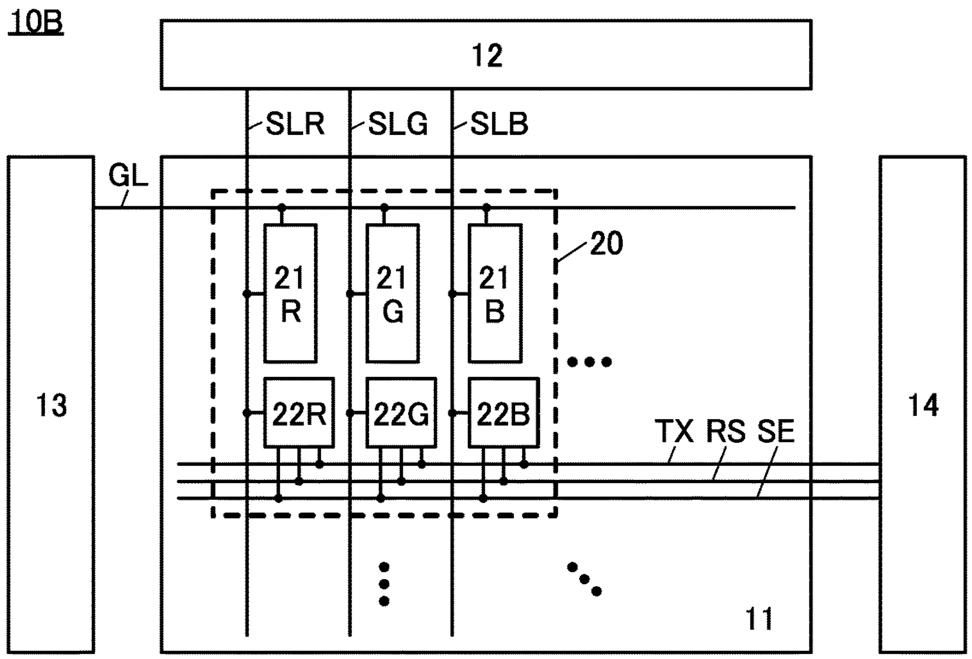
FIG. 9A is a diagram illustrating an example of a display device.

FIG. 9A is a circuit diagram for illustrating a structure of a display device 10B. The display device 10B is different from the display device 10 illustrated in FIG. 1A mainly in the structure of the pixel 20.

The pixel 20 includes the pixel 21R, the pixel 21G, and the pixel 21B each including a light-emitting element and a light-receiving pixel 22R, a light-receiving pixel 22G, and a light-receiving pixel 22B each including a light-receiving element.

The light-receiving pixel 22R, the light-receiving pixel 22G, and the light-receiving pixel 22B include light-receiving elements that receive light of different colors. For example, the light-receiving pixel 22R includes a light-receiving element that receives red light, the light-receiving pixel 22G includes a light-receiving element that receives green light, and the light-receiving pixel 22B includes a light-receiving element that receives blue light. Note that the display device 10B may include a pixel including a light-receiving element that receives visible light of any other color, infrared light, or ultraviolet light, instead of any of the above pixels or in addition to the above pixels.

The light-receiving elements included the light-receiving pixel 22R, the light-receiving pixel 22G, and the light-receiving pixel 22B may be photoelectric conversion elements containing different materials. Alternatively, photoelectric conversion elements containing the same material and color filters transmitting light with different wavelengths may be combined to obtain light-receiving elements receiving light of different colors.

The light-receiving pixel 22R can output received-light data to the wiring SLR. The light-receiving pixel 22G can output received-light data to the wiring SLG. The light-receiving pixel 22B can output received-light data to the wiring SLB. In addition, the light-receiving pixel 22R, the light-receiving pixel 22G, and the light-receiving pixel 22B are each electrically connected to the wiring TX, the wiring RS, and the wiring SE.

[Structure Example 3-1 of Pixel]

Figure 9B:
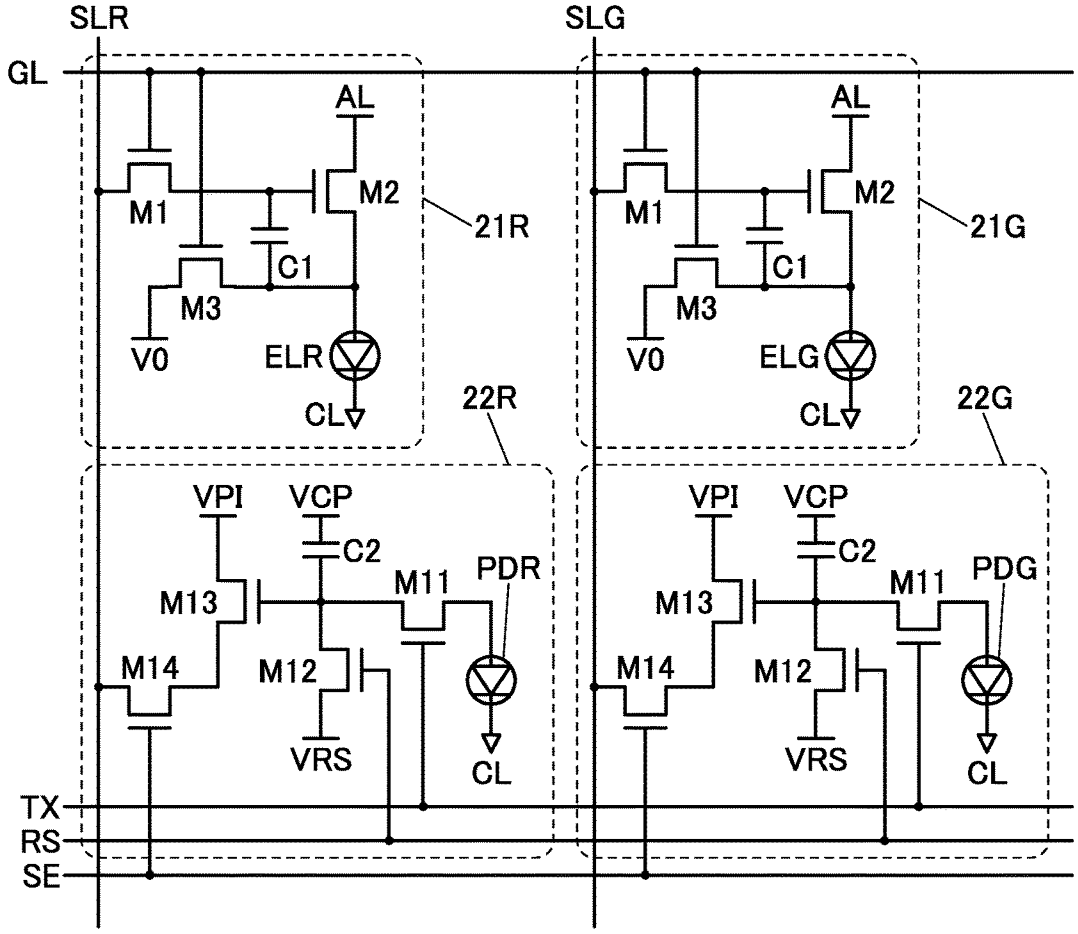
FIG. 9B is a diagram illustrating an example of a pixel.

FIG. 9B illustrates an example of a circuit diagram of part of the pixel 20. The circuit diagram in FIG. 9B illustrates the pixel 21R, the pixel 21G, the light-receiving pixel 22R, and the light-receiving pixel 22G. Note that the pixel 21B can have a structure similar to those of the pixel 21R and the pixel 21G except that the light-emitting element is different and the wiring SLB is connected. The light-receiving pixel 22B can have a structure similar to those of the light-receiving pixel 22R and the light-receiving pixel 22G except that the light-receiving element is different and the wiring SLB is connected.

For the structures of the pixel 21R and the pixel 21G in FIG. 9B, those of the pixel 21R and the pixel 21G illustrated in FIG. 1B can be referred to. The light-emitting element ELR included in the pixel 21R is a light-emitting element that emits red light, for example. The light-emitting element ELG included in the pixel 21G is a light-emitting element that emits green light, for example.

For the structures of the light-receiving pixel 22R and the light-receiving pixel 22G, the structure of the light-receiving pixel 22 illustrated in FIG. 1B can be referred to. A light-receiving element PDR included in the light-receiving pixel 22R is a photoelectric conversion element that receives red light, for example. A light-receiving element PDG included in the light-receiving pixel 22G is a photoelectric conversion element that receives green light, for example.

The other of the source and the drain of the transistor M14 included in the light-receiving pixel 22R is electrically connected to the wiring SLR. The other of the source and the drain of the transistor M14 included in the light-receiving pixel 22G is electrically connected to the wiring SLG.

[Structure Example 3-1 of Display Portion]

Figure 10:
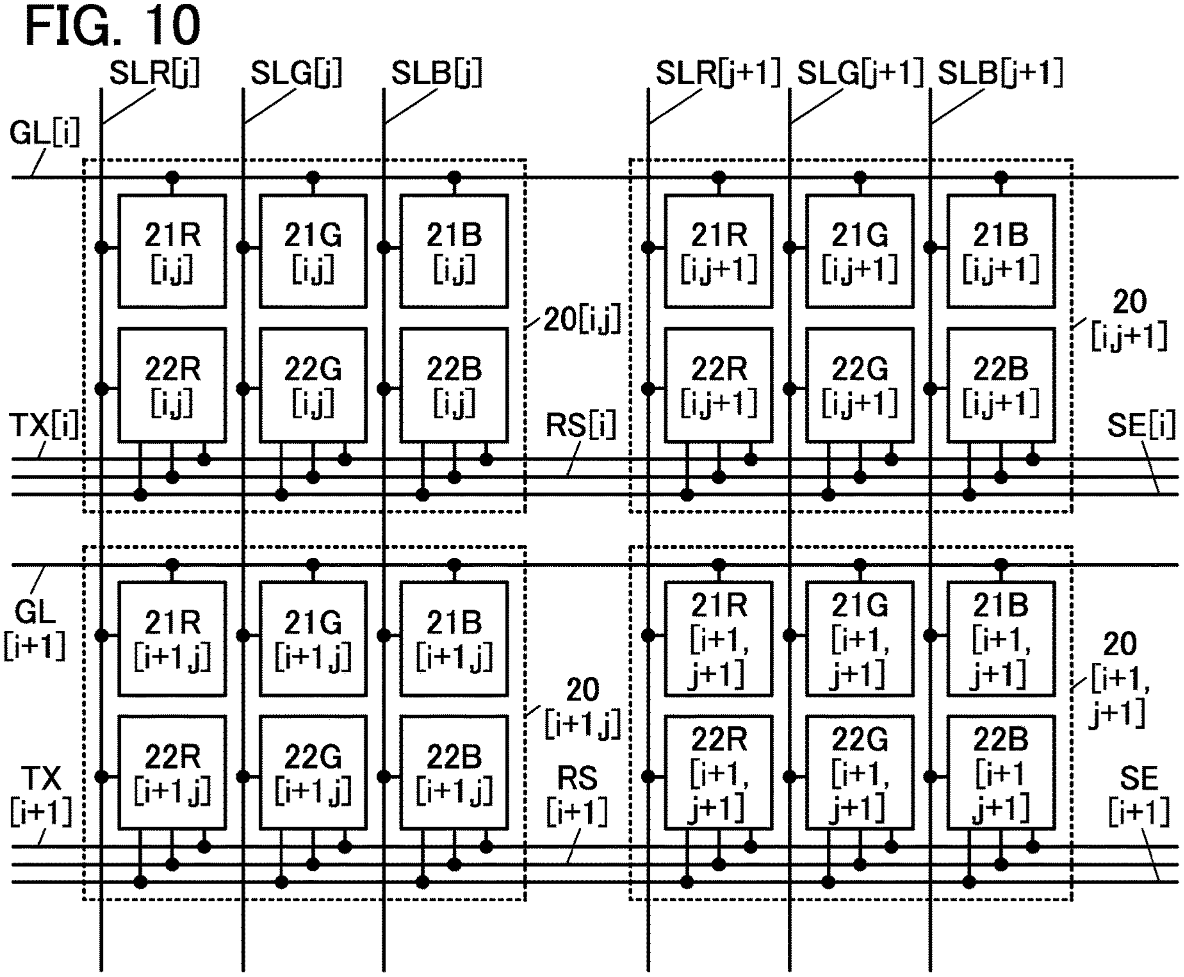
FIG. 10 is a diagram illustrating an example of a display portion.

FIG. 10 illustrates a structure example of part of a display portion including the light-receiving pixel 22R, the light-receiving pixel 22G, and the light-receiving pixel 22B. FIG. 10 illustrates 2×2 pixels 20.

A light-receiving pixel 22R[i,j] and a light-receiving pixel 22R[i, j+1] in the i-th row outputs received-light data to the wiring SLR[j] and the wiring SLR[j+1], respectively. A light-receiving pixel 22G[i,j] and a light-receiving pixel 22G[i, j+1] in the i-th row can output received-light data to the wiring SLG[j] and the wiring SLG[j+1], respectively. A light-receiving pixel 22B[i,j] and a light-receiving pixel 22B [i, j+1] in the i-th row can output received-light data to the wiring SLB[j] and the wiring SLB[j+1], respectively.

The plurality of light-receiving pixels 22R, light-receiving pixels 22G, and light-receiving pixels 22B provided in the i-th row are each electrically connected to the wiring TX[i], the wiring RS[i], and the wiring SE[i]. Thus, received-light data of all of the light-receiving pixels 22R, the light-receiving pixels 22G, and the light-receiving pixels 22B arranged in the i-th row can be output simultaneously.

Although received-light data is read for every row in the example illustrated in FIG. 10, three light-receiving elements are provided in one pixel 20; thus, three times the amount of data can be read simultaneously compared with the case where one pixel includes one light-receiving element.

[Structure Example 3-2]

Figure 11A:
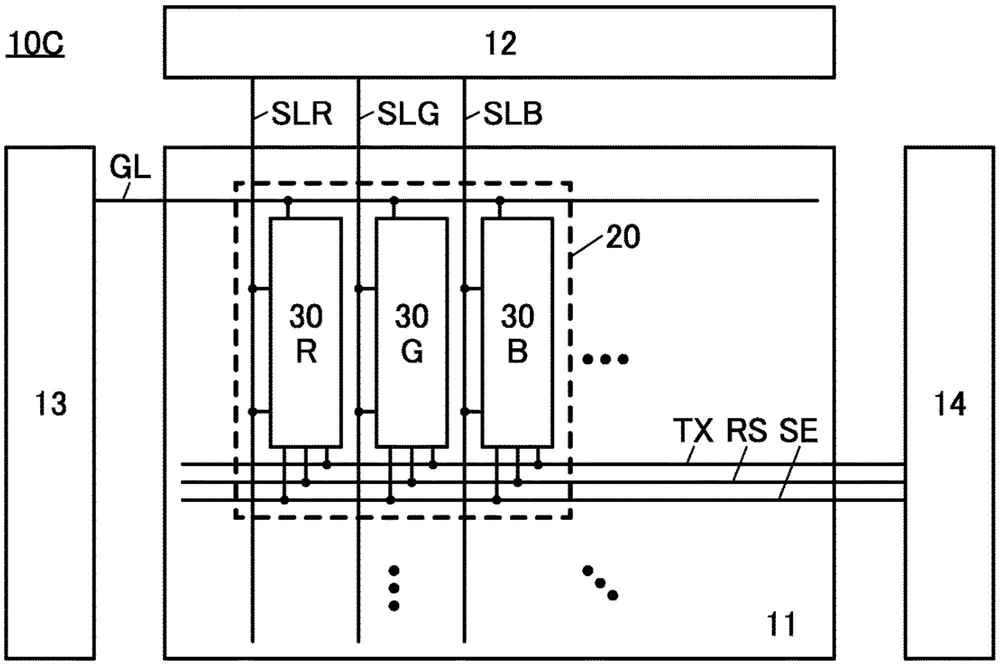
FIG. 11A is a diagram illustrating an example of a display device.

FIG. 11A is a circuit diagram for illustrating a structure of a display device 10C. The display device 10C is different from the display device 10B illustrated in FIG. 9A mainly in the structure of the pixel 20.

Specifically, the display device 10C includes the pixel 30R instead of the pixel 21R and the light-receiving pixel 22R in the display device 10B, a pixel 30G instead of the pixel 21G and the light-receiving pixel 22G, and the pixel 30R instead of the pixel 21B and the light-receiving pixel 22B.

The pixel 30R, the pixel 30G, and a pixel 30B each include a light-emitting and light-receiving element. The light-emitting and light-receiving elements receive light of different colors and emit light of different colors. For the specific structure of the pixel 30R, the structure illustrated in FIG. 6A and FIG. 6B can be referred to. Since the pixel 30G and the pixel 30B can have a structure in which the light-emitting and light-receiving element included in the pixel 30R is replaced, the detailed description thereof is omitted.

The light-emitting and light-receiving elements included in the light-receiving pixel 22R, the light-receiving pixel 22G, and the light-receiving pixel 22B can be elements containing different materials.

It is preferable that the color (wavelength range) of light emitted from a light-emitting and light-receiving element do not overlap with the color (wavelength range) of light received by the light-emitting and light-receiving element. In this case, the light emitted from the light-emitting and light-receiving element can be inhibited from being absorbed by the light-emitting and light-receiving element itself, leading to an improvement in emission efficiency.

For example, the light-emitting and light-receiving element provided in the light-receiving pixel 22R is preferably an element that emits red light and receives one or both of green light and blue light. The light-emitting and light-receiving element provided in the light-receiving pixel 22G is preferably an element that emits green light and receives one or both of red light and blue light. The light-emitting and light-receiving element provided in the light-receiving pixel 22B is preferably an element that emits blue light and receives one or both of red light and green light. Note that without limitation to visible light, each of the light-emitting and light-receiving elements may emit infrared light or ultraviolet light, or may receive infrared light or ultraviolet light.

To the pixel 30R, the pixel 30G, and the pixel 30B, a selection signal used in writing image data is supplied from the wiring GL and a selection signal used in outputting received-light data is supplied from the wiring SE. The pixel 30R can receive image data from the wiring SLR and output received-light data to the wiring SLR. The pixel 30G can receive image data from the wiring SLG and output received-light data to the wiring SLG. The pixel 30B can receive image data from the wiring SLB and output received-light data to the wiring SLB.

[Structure Example 3-2 of Display Portion]

Figure 11B:
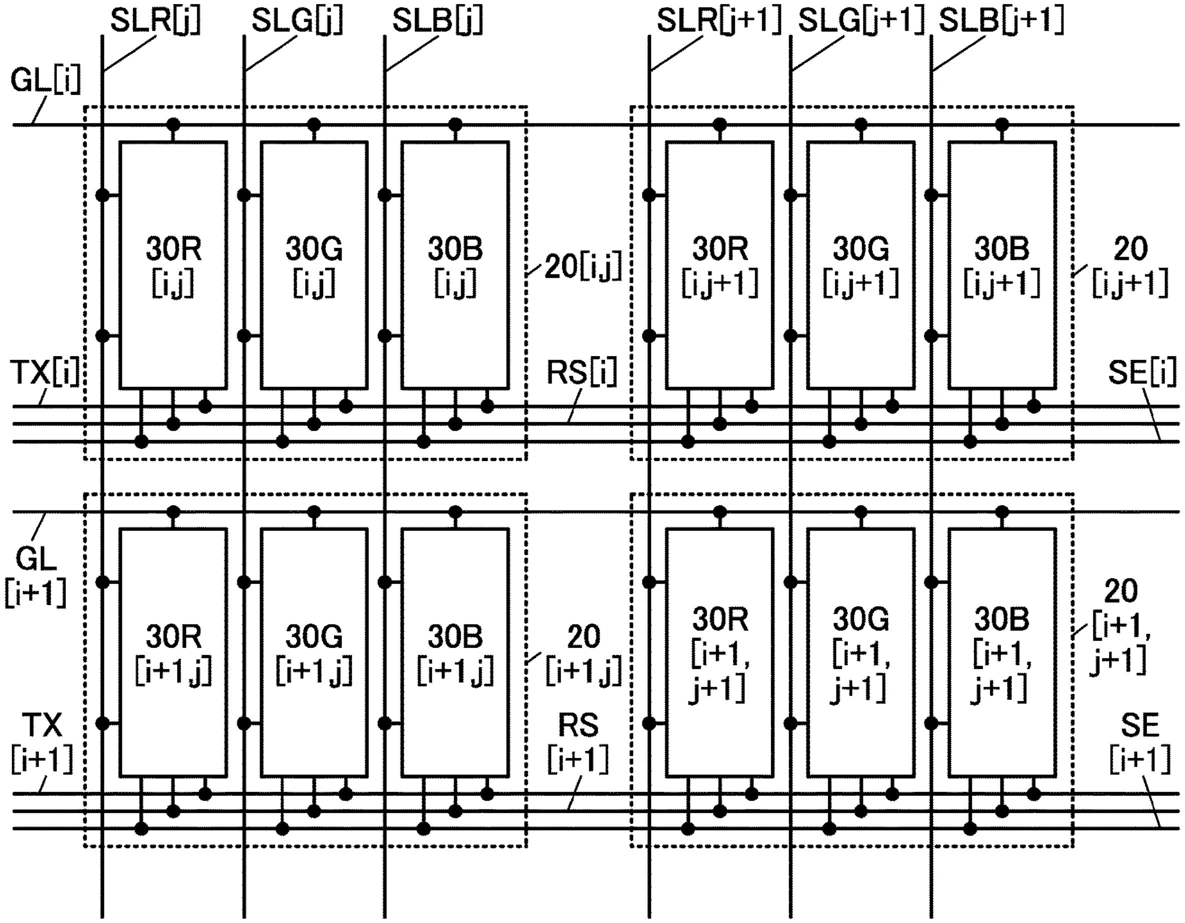
FIG. 11B is a diagram illustrating an example of a display portion.

FIG. 11B illustrates an example of a display portion including the pixel 30R, the pixel 30G, and the pixel 30B. FIG. 11B illustrates 2×2 pixels 20.

The pixel 30R[i,j] and the pixel 30R[i, j+1] in the i-th row can receive image data respectively from the wiring SLR[j] and the wiring SLR[j+1] and output received-light data to the corresponding wirings. A pixel 30G[i,j] and a pixel 30G[i, j+1] in the i-th row can receive image data respectively from the wiring SLG[j] and the wiring SLG[j+1] and output received-light data to the corresponding wirings. A pixel 30B[i,j] and a pixel 30B[i, j+1] in the i-th row can receive image data respectively from the wiring SLB[j] and the wiring SLB[j+1] and output received-light data to the corresponding wirings.

The plurality of pixels 30R, pixels 30G, and pixels 30B provided in the i-th row are each electrically connected to the wiring TX[i], the wiring RS[i], and the wiring SE[i]. Thus, received-light data of all of the pixels 30R, the pixels 30G, and the pixels 30B arranged in the i-th row can be output simultaneously.

Although FIG. 11B illustrates a structure example in which received-light data is read in every row, three light-emitting and light-receiving elements are provided in one pixel 20; thus, three times the amount of data can be read simultaneously compared with the case where one pixel includes one light-emitting and light-receiving element.

Figure 12:
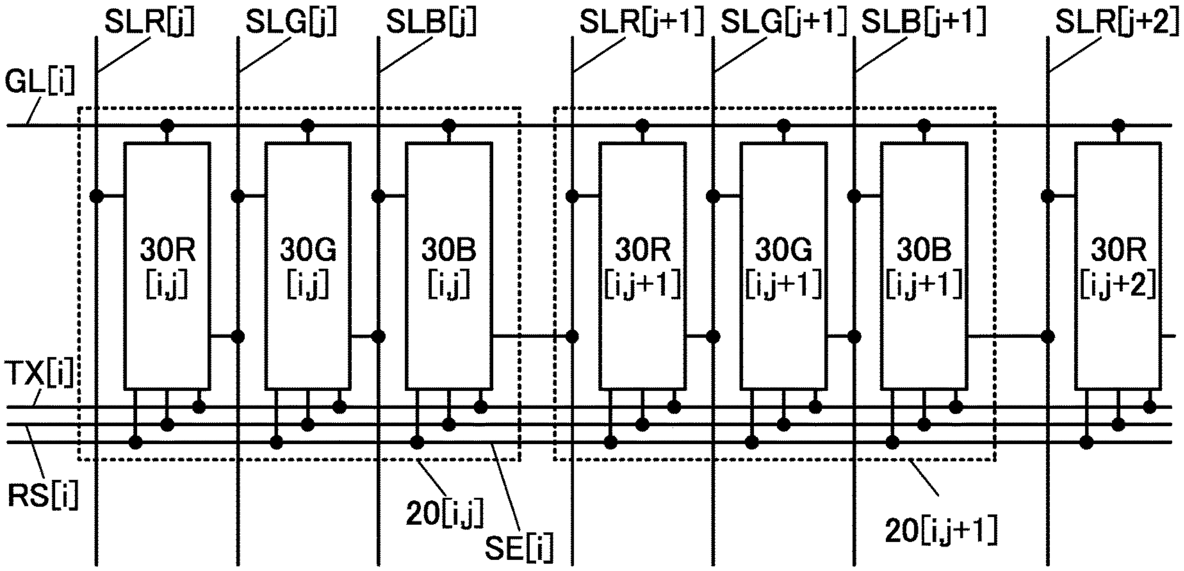
FIG. 12 is a diagram illustrating an example of a display portion.

Note that as illustrated in FIG. 12, a wiring for supplying image data to the pixel 30R, the pixel 30G, and the pixel 30B may be different from a wiring to which received-light data is output.

In FIG. 12, the pixel 30R[i,j] can be supplied with image data from the wiring SLR[j] and output received-light data to the wiring SLG[j]. The pixel 30G[i,j] can be supplied with image data from the wiring SLG[j] and output received-light data to the wiring SLB[j]. The pixel 30B[i,j] can receive image data from the wiring SLB[j] and output received-light data to the wiring SLR[j+1].

Such a structure enables writing image data to the pixel 30R and reading received-light data therefrom to be performed simultaneously. It is also possible, for example, to perform writing image data and reading received-light data on the pixels 30 in odd-numbered rows during the same period, and then perform writing and reading on the pixels 30 in even-numbered rows in a similar manner.

[Driving Method Example]

An example of a method for driving the display device is described below. Description is made here using, as an example, a method for driving a display device that includes a light-emitting and light-receiving element and is capable of simultaneous data reading for three rows, which is described in Structure example 2.

In the following description, the display device includes a display portion in which a plurality of pixels are arranged in a matrix of M rows and N columns (each of M and N is independently an integer greater than or equal to 2).

Figure 13:
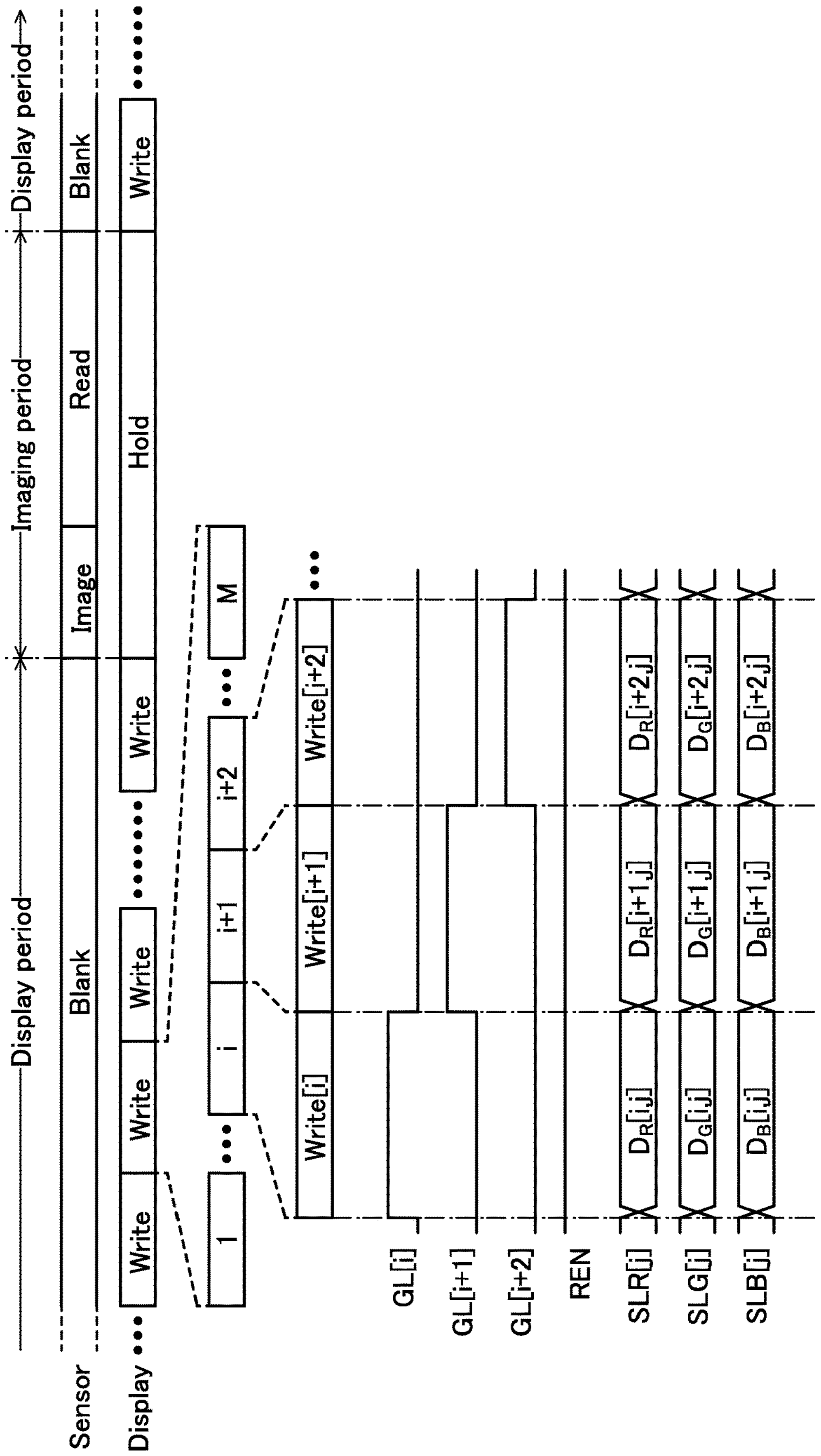
FIG. 13 is a diagram showing an example of a method for driving a display device.
Figure 14:
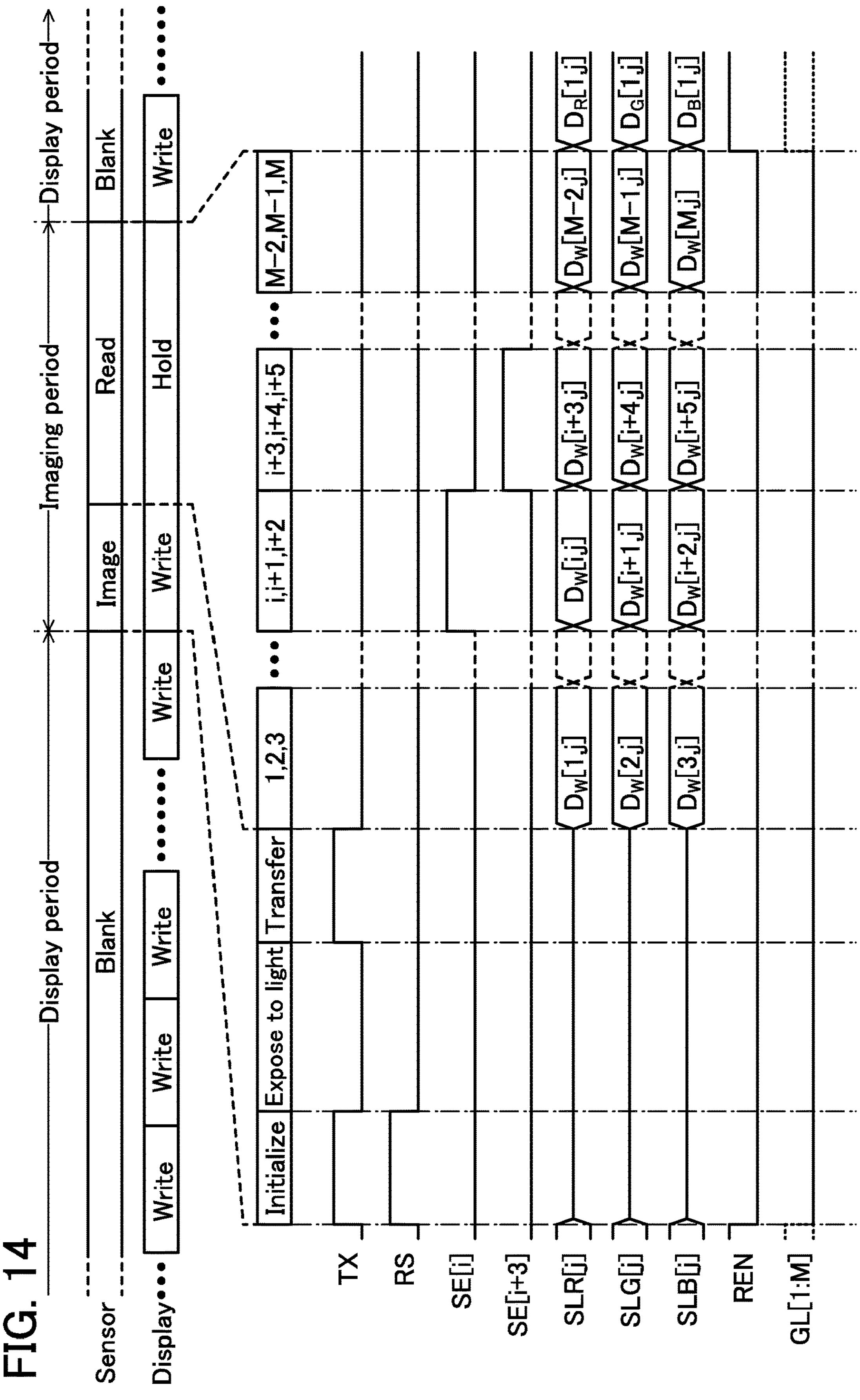
FIG. 14 is a diagram showing an example of a method for driving a display device.

FIG. 13 and FIG. 14 schematically show the operation of the display device. The operation of the display device is roughly divided into a period during which an image is displayed using the light-emitting elements or the light-emitting and light-receiving elements (a display period) and a period during which imaging is performed using the light-emitting and light-receiving elements (also referred to as sensors) (an imaging period). The display period is a period during which image data is written to pixels and display based on the image data is performed. The imaging period is a period during which imaging with the light-receiving elements or the light-emitting and light-receiving elements is performed and received-light data is read out.

First, the operation in the display period is described with reference to FIG. 13.

In the display period, operation of writing image data to pixels is performed repeatedly. In the period, no sensor operation is performed (denoted as "blank"). Alternatively, imaging operation can be performed in the display period.

FIG. 12 shows a timing chart for the operation of writing data in the i-th row, the (i+1)th row, and the (i+2)th row. Here, changes in the potentials of the wiring GL[i], the wiring GL[i+1], the wiring GL[i+2], the wiring REN, the wiring SLR[j], the wiring SLG[j], and the wiring SLB[j] are shown. Structure example 2 can be referred to for connection relations between the wirings and the pixels.

In a writing period in the i-th row (Write[i]), the wiring GL[i] is set to a high-level potential and the other wirings GL are set to a low-level potential. In addition, image data DR[i,j], image data DG[i,j], and image data DB[i,j] are supplied to the wiring SLR[j], the wiring SLG[j], and the wiring SLB[j], respectively. In the writing period, a high-level potential is supplied to the wiring REN.

Writing in the (i+1)th and subsequent rows can be performed in a manner similar to the above: the corresponding wiring GL is set to a high-level potential and then image data is supplied to the wiring SLR, the wiring SLG, and the wiring SLB, whereby writing can be performed.

Such writing operation is performed from the first row to the M-th row, so that one-frame data writing is completed. Repetition of the above operation in the display period enables display of moving images.

Next, the operation in the imaging period is described with reference to FIG. 14. The case of performing imaging operation in a global shutter mode is described here. Note that without limitation to a global shutter mode, a driving method with a rolling shutter mode can also be employed.

The imaging period is divided into a period during which imaging is performed in all the pixels at once (denoted by Image, and hereinafter also referred to as an imaging operation period to be distinguished from the imaging period) and a period during which received-light data are sequentially read (denoted by Read). The imaging operation period is divided into an initialization period, a light exposure period, and a transfer period. In the reading period here, reading of received-light data is performed for every three rows from the first row to the M-th row.

Note that description is made here on the assumption that M is a multiple of 3. That is, the wiring TX, the wiring SE, and the wiring RS are each arranged at a ratio of 1 in 3 rows, and M/3 wirings are provided in the display device. Note that M is not necessarily a multiple of 3, and in that case, one or more periods during which received-light data of two rows are simultaneously read or one or more periods during which received-light data of one row is read are provided in the imaging period.

FIG. 14 is a timing chart of the imaging operation period and the reading period. Here, changes in potentials of the wiring TX, the wiring RS, the wiring SE[i], a wiring SE[i+3], the wiring SLR[j], the wiring SLG[j], the wiring SLB[j], the wiring REN, and the wirings GL[1:M] are shown. Here, the wirings TX and the wirings RS from the first row to the (M−2)th row (M/3 wirings) are collectively referred to as the wiring TX and the wiring RS. M wirings GL from the first row to the M-th row are collectively referred to as the wirings GL[1:M].

In the initialization period, the wiring TX and the wiring RS are set to a high-level potential to bring the transistor M11 and the transistor M12 into a conduction state, so that a predetermined potential is supplied from the wiring VRS to the node to which the gate of the transistor M13 is connected and the anode of the light-emitting and light-receiving element MER. Thus, the operation of resetting all the pixels is performed (see FIG. 6B, for example).

Then, in the light exposure period, the wiring TX and the wiring RS are set to a low-level potential. When the light-emitting and light-receiving element MER receives light in this period, electric charge is accumulated in the anode.

Next, in the transfer period, the wiring TX is set to a high-level potential. Thus, the electric charge accumulated in the light-emitting and light-receiving element MER can be transferred to the node connected to the gate of the transistor M13. After that, setting the wiring TX to a low-level potential brings about a state where the potential of the node is held.

Then, received-light data is read for every three rows. In the reading period, a high-level potential is sequentially supplied to the wiring SE[1] to the wiring SE[M−2], whereby received-light data can be read from all the pixels for every three rows.

As shown in FIG. 14, in reading in the i-th row, the (i+1)th row, and the (i+2)th row, for example, the wiring SE[i] is set to a high-level potential; thus, simultaneously, received-light data Dw[i,j] is output from the pixel in the i-th row and the j-th column to the wiring SLR[j], received-light data Dw[i+1, j] is output from the pixel in the (i+1)th row and the j-th column to the wiring SLG[j], and received-light data Dw[i+2, j] is output from the pixel in the (i+2)th row and the j-th column to the wiring SLB[j].

Then, in reading in the (i+3)th row, the (i+4)th row, and the (i+5)th row, the wiring SE[i+3] is set to a high-level potential; thus, simultaneously, received-light data Dw[i+3, j] is output to the wiring SLR[j], received-light data Dw[i+4, j] is output to the wiring SLG[j], and received-light data Dw[i+5, j] is output from the pixel in the (i+5)th row and the j-th column to the wiring SLB[j].

In the whole imaging period, the wiring REN is set to a low-level potential. Accordingly, the transistors M10 are brought into a non-conduction state and the light-emitting and light-receiving elements MER are electrically separated from the circuits 31R in all of the pixels (see FIG. 6B and the like). Consequently, noise is reduced and imaging with high accuracy can be performed.

In the imaging period, each pixel is preferably set in a state of holding image data that is most recently written (denoted as "Hold"). Thus, when the imaging period ends and the potential of the wiring REN changes from a low-level potential to a high-level potential, an image corresponding to the held image data can be displayed immediately. When image data written to the pixel 21G or the pixel 21B is held in the imaging period, crosstalk noise affecting the anode of the light-emitting and light-receiving element MER in the pixel 30R can be reduced.

In the case of a display device that includes a light-emitting element and a light-receiving element and is capable of simultaneous reading for three rows, as in Structure example 1, the above driving method can be employed except that the wiring REN is not included.

In the case where one pixel includes a plurality of light-receiving elements or light-emitting and light-receiving elements as in Structure example 3, the above driving method can be employed except that the received-light data Dw is output row by row in reading.

The above is the description of the driving method example.

The display device described in this embodiment can perform simultaneous reading of many pixels, and thus can achieve high-speed reading operation. In addition, one wiring can have both a function of a source signal line and a function of a read line, whereby the number of wirings can be reduced and a display device that can easily achieve a higher resolution can be provided.

At least part of the structure examples, the drawings corresponding thereto, and the like shown in this embodiment as an example can be implemented in combination with the other structure examples, the other drawings, and the like as appropriate.

At least part of this embodiment can be implemented in combination with the other embodiments described in this specification as appropriate.

Embodiment 2

In this embodiment, display devices of embodiments of the present invention are described with reference to FIG. 15 to FIG. 24.

The display device of this embodiment can be favorably used in the display portion of the display device described in Embodiment 1.

The display portion of the display device of one embodiment of the present invention has a function of displaying an image with the use of a light-emitting element (also referred to as a light-emitting device). Furthermore, the display portion also has one or both of an imaging function and a sensing function.

The display device of one embodiment of the present invention includes a light-receiving element (also referred to as a light-receiving device) and a light-emitting element. Alternatively, the display device of one embodiment of the present invention includes a light-emitting and light-receiving element (also referred to as a light-emitting and light-receiving device) and a light-emitting element.

First, a display device including a light-receiving element and a light-emitting element is described.

The display device of one embodiment of the present invention includes a light-receiving element and a light-emitting element in a display portion. In the display device of one embodiment of the present invention, the light-emitting elements are arranged in a matrix in the display portion, and an image can be displayed on the display portion. Furthermore, the light-receiving elements are arranged in a matrix in the display portion, and the display portion has one or both of an imaging function and a sensing function. The display portion can be used as an image sensor, a touch sensor, or the like. That is, by detecting light with the display portion, an image can be captured and touch operation of an object (e.g., a finger or a stylus) can be detected. Furthermore, in the display device of one embodiment of the present invention, the light-emitting elements can be used as a light source of the sensor. Accordingly, a light-receiving portion and a light source do not need to be provided separately from the display device; hence, the number of components of an electronic device can be reduced.

In the display device of one embodiment of the present invention, when an object reflects (or scatters) light emitted from the light-emitting element included in the display portion, the light-receiving element can detect the reflected light (or the scattered light); thus, imaging or touch operation detection are possible even in a dark place.

The display device of one embodiment of the present invention has a function of displaying an image with the use of a light-emitting element. That is, the light-emitting element functions as a display element (also referred to as a display device).

As the light-emitting element, an EL element (also referred to as an EL device) such as an OLED (Organic Light Emitting Diode) or a QLED (Quantum-dot Light Emitting Diode) is preferably used. As a light-emitting substance contained in the EL element, a substance exhibiting fluorescence (a fluorescent material), a substance exhibiting phosphorescence (a phosphorescent material), an inorganic compound (such as a quantum dot material), a substance exhibiting thermally activated delayed fluorescence (a thermally activated delayed fluorescence (TADF) material), or the like can be given. Alternatively, an LED (Light Emitting Diode) such as a micro-LED can be used as the light-emitting element.

The display device of one embodiment of the present invention has a function of detecting light with the use of a light-receiving element.

When the light-receiving element is used as an image sensor, the display device can capture an image using the light-receiving element. For example, the display device of this embodiment can be used as a scanner.

For example, data on biological information of a fingerprint, a palm print, or the like can be obtained with the use of the image sensor. That is, a biometric authentication sensor can be incorporated in the display device. When the display device incorporates a biometric authentication sensor, the number of components of an electronic device can be reduced as compared with the case where a biometric authentication sensor is provided separately from the display device; thus, the size and weight of the electronic device can be reduced.

When the light-receiving element is used as the touch sensor, the display device can detect touch operation of an object with the use of the light-receiving element.

As the light-receiving element, a pn photodiode or a pin photodiode can be used, for example. The light-receiving element functions as a photoelectric conversion element (also referred to as a photoelectric conversion device) that detects light entering the light-receiving element and generates electric charge. The amount of electric charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display device including the organic EL elements.

If all the layers of the organic EL elements and the organic photodiodes are formed separately, the number of deposition steps becomes extremely large. Since a large number of layers of the organic photodiodes can have structures in common with the organic EL elements, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer is preferably a layer shared by the light-receiving element and the light-emitting element.

As another example, the light-receiving element and the light-emitting element can have the same structure except that the light-receiving element includes an active layer and the light-emitting element includes a light-emitting layer. In other words, the light-receiving element can be manufactured by only replacing the light-emitting layer of the light-emitting element with an active layer. When the light-receiving element and the light-emitting element include common layers in such a manner, the number of deposition steps and the number of masks can be reduced, thereby reducing the number of manufacturing steps and the manufacturing cost of the display device. Furthermore, the display device including the light-receiving element can be manufactured using an existing manufacturing apparatus and an existing manufacturing method for the display device.

Note that a layer shared by the light-receiving element and the light-emitting element might have functions different between the light-receiving element and the light-emitting element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element. Note that a layer shared by the light-receiving element and the light-emitting element may have the same functions in the light-receiving element and the light-emitting element. A hole-transport layer functions as a hole-transport layer in both of the light-emitting element and the light-receiving element, and an electron-transport layer functions as an electron-transport layer in both of the light-emitting element and the light-receiving element.

Next, a display device including a light-emitting and light-receiving element and a light-emitting element is described.

In the display device of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the display portion of the display device of one embodiment of the present invention has a function of displaying an image using both a light-emitting and light-receiving element and a light-emitting element.

The light-emitting and light-receiving element functions as both a light-emitting element and a light-receiving element, whereby the pixel can be provided with a light-receiving function without an increase in the number of subpixels included in the pixel. Thus, the display portion of the display device can be provided with one or both of an imaging function and a sensing function while keeping the aperture ratio of the pixel (aperture ratio of each subpixel) and the resolution of the display device. Accordingly, in the display device of one embodiment of the present invention, the aperture ratio of the pixel can be more increased and the resolution can be increased more easily than in a display device provided with a subpixel including a light-receiving element separately from a subpixel including a light-emitting element.

In the display portion of the display device of one embodiment of the present invention, the light-emitting and light-receiving elements and the light-emitting elements are arranged in a matrix, and an image can be displayed on the display portion. The display portion can be used as an image sensor, a touch sensor, or the like. In the display device of one embodiment of the present invention, the light-emitting elements can be used as a light source of the sensor. Accordingly, a light-receiving portion and a light source do not need to be provided separately from the display device; hence, the number of components of an electronic device can be reduced.

In the display device of one embodiment of the present invention, when an object reflects (or scatters) light emitted from the light-emitting element included in the display portion, the light-emitting and light-receiving element can detect the reflected light (or the scattered light); thus, imaging, touch operation detection, or the like is possible even in a dark place.

The light-emitting and light-receiving element can be manufactured by combining an organic EL element and an organic photodiode. For example, by adding an active layer of an organic photodiode to a layered structure of an organic EL element, the light-emitting and light-receiving element can be manufactured. Furthermore, in the light-emitting and light-receiving element formed of a combination of an organic EL element and an organic photodiode, concurrently depositing layers that can be shared with the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer is preferably a layer shared by the light-emitting and light-receiving element and the light-emitting element. As another example, the light-emitting and light-receiving element and the light-emitting element can have the same structure except for the presence or absence of an active layer of the light-receiving element. In other words, the light-emitting and light-receiving element can be manufactured by only adding the active layer of the light-receiving element to the light-emitting element. When the light-emitting and light-receiving element and the light-emitting element include common layers in such a manner, the number of deposition steps and the number of masks can be reduced, thereby reducing the number of manufacturing steps and the manufacturing cost of the display device. Furthermore, the display device including the light-emitting and light-receiving element can be manufactured using an existing manufacturing apparatus and an existing manufacturing method for the display device.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element. For example, a hole-injection layer functions as a hole-injection layer in the case where the light-emitting and light-receiving element functions as a light-emitting element, and functions as a hole-transport layer in the case where the light-emitting and light-receiving element functions as a light-receiving element. Similarly, an electron-injection layer functions as an electron-injection layer in the case where the light-emitting and light-receiving element functions as a light-emitting element, and functions as an electron-transport layer in the case where the light-emitting and light-receiving element functions as a light-receiving element. A layer included in the light-emitting and light-receiving element may have the same function in both the case where the light-emitting and light-receiving element functions as a light-receiving element and the case where the light-emitting and light-receiving element functions as a light-emitting element. The hole-transport layer functions as a hole-transport layer in the case where the light-emitting and light-receiving element functions as either a light-emitting element or a light-receiving element, and the electron-transport layer functions as an electron-transport layer in the case where the light-emitting and light-receiving element functions as either a light-emitting element or a light-receiving element.

The display device of this embodiment has a function of displaying an image with the use of a light-emitting element and a light-emitting and light-receiving element. That is, the light-emitting element and the light-emitting and light-receiving element function as display elements.

The display device of this embodiment has a function of detecting light with the use of a light-emitting and light-receiving element. The light-emitting and light-receiving element can detect light having a shorter wavelength than light emitted from the light-emitting and light-receiving element itself.

When the light-emitting and light-receiving element is used as an image sensor, the display device of this embodiment can capture an image using the light-emitting and light-receiving element. For example, the display device of this embodiment can be used as a scanner.

When the light-emitting and light-receiving element is used as the touch sensor, the display device of this embodiment can detect touch operation of an object with the use of the light-emitting and light-receiving element.

The light-emitting and light-receiving element functions as a photoelectric conversion element that detects light entering the light-emitting and light-receiving element and generates electric charge. The amount of electric charge generated from the light-emitting and light-receiving element depends on the amount of light entering the light-emitting and light-receiving element.

The light-emitting and light-receiving element can be manufactured by adding an active layer of the light-receiving element to the above-described structure of the light-emitting element.

For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of display devices.

The display device of one embodiment of the present invention is specifically described below with reference to drawings.

[Display Device]

FIG. 15A to FIG. 15D and FIG. 15F are cross-sectional views of display devices of embodiments of the present invention.

Figure 15A:
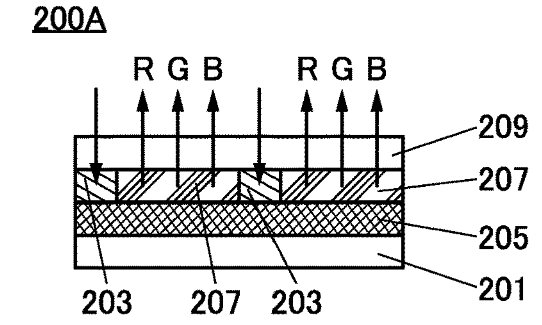
FIG. 15A to FIG. 15D and FIG. 15F are cross-sectional views illustrating examples of a display device.

A display device 200A illustrated in FIG. 15A includes a layer 203 including a light-receiving element, a functional layer 205, and a layer 207 including a light-emitting element between a substrate 201 and a substrate 209.

In the display device 200A, red (R) light, green (G) light, and blue (B) light are emitted from the layer 207 including a light-emitting element.

The light-receiving element included in the layer 203 including a light-receiving element can detect light entering from the outside of the display device 200A.

Figure 15B:
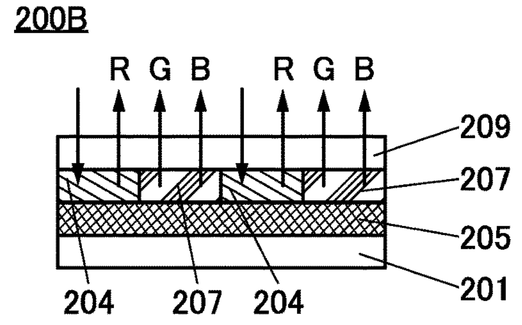

A display device 200B illustrated in FIG. 15B includes a layer 204 including a light-emitting and light-receiving element, the functional layer 205, and the layer 207 including a light-emitting element between the substrate 201 and the substrate 209.

In the display device 200B, green (G) light and blue (B) light are emitted from the layer 207 including a light-emitting element, and red (R) light is emitted from the layer 204 including a light-emitting and light-receiving element. In the display device of one embodiment of the present invention, the color of light emitted from the layer 204 including a light-emitting and light-receiving element is not limited to red. Furthermore, the color of light emitted from the layer 207 including a light-emitting element is not limited to the combination of green and blue.

The light-emitting and light-receiving element included in the layer 204 including a light-emitting and light-receiving element can detect light entering from the outside of the display device 200B. The light-emitting and light-receiving element can detect one or both of green (G) light and blue (B) light, for example.

The functional layer 205 includes a circuit for driving the light-receiving element or the light-emitting and light-receiving element and a circuit for driving the light-emitting element. A switch, a transistor, a capacitor, a resistor, a wiring, a terminal, and the like can be provided in the functional layer 205. Note that in the case where the light-emitting element and the light-receiving element are driven by a passive-matrix method, a structure not provided with a switch, a transistor, or the like may be employed.

Figure 15C:
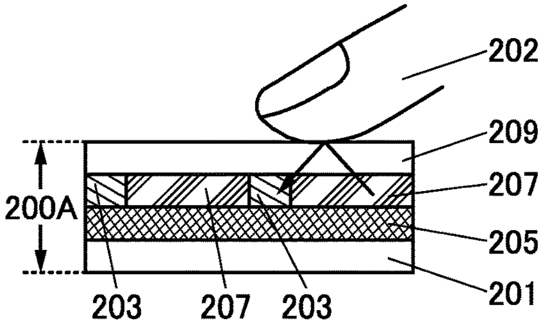

The display device of one embodiment of the present invention may have a function of detecting an object such as a finger that is touching the display device (a function of a touch panel). For example, after light emitted from the light-emitting element in the layer 207 including a light-emitting element is reflected by a finger 202 that is touching the display device 200A as illustrated in FIG. 15C, the light-receiving element in the layer 203 including a light-receiving element detects the reflected light. Thus, the touch of the finger 202 on the display device 200A can be detected. Furthermore, in the display device 200B, after light emitted from the light-emitting element in the layer 207 including a light-emitting element is reflected by a finger that is touching the display device 200B, the light-emitting and light-receiving element in the layer 204 including a light-emitting and light-receiving element can detect the reflected light. Although a case where light emitted from the light-emitting element is reflected by an object is described below as an example, light might be scattered by an object.

Figure 15D:
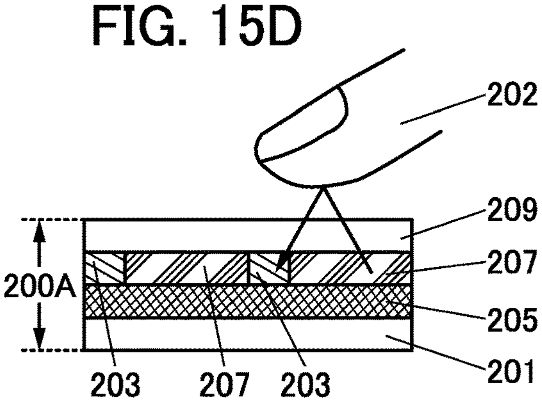

The display device of one embodiment of the present invention may have a function of detecting an object that is close to (but is not touching) the display device as illustrated in FIG. 15D or capturing an image of such an object.

Figure 15E:
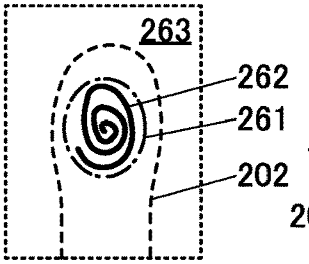
FIG. 15E and FIG. 15G are diagrams illustrating examples of an image captured by the display device.

The display device of one embodiment of the present invention may have a function of detecting a fingerprint of the finger 202. FIG. 15E is a diagram of an image captured by the display device of one embodiment of the present invention. In an imaging range 263 in FIG. 15E, the outline of the finger 202 is indicated by a dashed line and the outline of a contact portion 261 is indicated by a dashed-dotted line. In the contact portion 261, a high-contrast image of a fingerprint 262 can be captured owing to a difference in the amount of light entering the light-receiving element (or the light-emitting and light-receiving element).

Figure 15F:
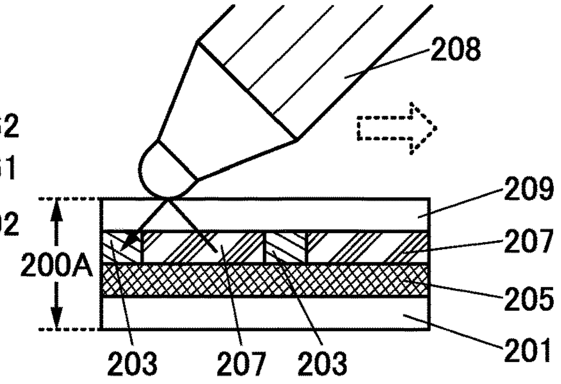

The display device of one embodiment of the present invention can also function as a pen tablet. FIG. 15F illustrates a state in which a tip of a stylus 208 slides in a direction indicated by a dashed arrow while the tip of the stylus 208 touches the substrate 209.

As illustrated in FIG. 15F, when the scattered light scattered by the contact surface between the tip of the stylus 208 and the substrate 209 enters the light-receiving element (or the light-emitting and light-receiving element) that is positioned in a portion overlapping with the contact surface, the position of the tip of the stylus 208 can be detected with high accuracy.

Figure 15G:
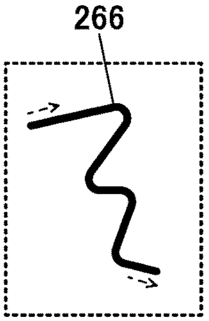

FIG. 15G illustrates an example of a path 266 of the stylus 208 that is detected by the display device of one embodiment of the present invention. The display device of one embodiment of the present invention can detect the position of an object to be detected, such as the stylus 208, with high position accuracy, so that high-definition drawing can be performed using a drawing application or the like. Unlike the case of using a capacitive touch sensor, an electromagnetic induction touch pen, or the like, the display device can detect even the position of a highly insulating object to be detected, the material of a tip portion of the stylus 208 is not limited, and a variety of writing materials (e.g., a brush, a glass pen, a quill pen, and the like) can be used.

[Pixel]

The display device of one embodiment of the present invention includes a plurality of pixels arranged in a matrix. One pixel includes a plurality of subpixels. One subpixel includes one light-emitting element, one light-emitting and light-receiving element, or one light-receiving element.

The plurality of pixels each include one or more of a subpixel including a light-emitting element, a subpixel including a light-receiving element, and a subpixel including a light-emitting and light-receiving element.

For example, the pixel includes a plurality of (e.g., three or four) subpixels each including a light-emitting element and one subpixel including a light-receiving element.

Note that the light-receiving element may be provided in all the pixels or may be provided in some of the pixels. In addition, one pixel may include a plurality of light-receiving elements. One light-receiving element may be provided across a plurality of pixels. The resolution of the light-receiving element and the resolution of the light-emitting element may be different from each other.

In the case where the pixel includes three subpixels each including a light-emitting element, as the three subpixels, subpixels of three colors of R, G, and B, subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

FIG. 15H, FIG. 15(J), FIG. 15(K), and FIG. 15(L) illustrate examples of a pixel which includes a plurality of subpixels each including a light-emitting element and includes one subpixel including a light-receiving element. Note that the arrangement of subpixels is not limited to the illustrated order in this embodiment. For example, the positions of a subpixel (B) and a subpixel (G) may be reversed.

Figure 15H:
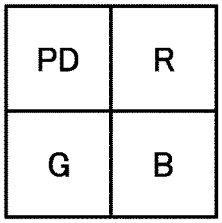
FIG. 15H and FIG. 15(J) to FIG. 15(L) are top views illustrating examples of a pixel.
Figure 15J:
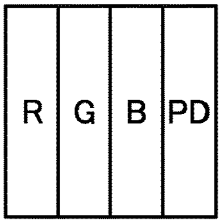
Figure 15K:
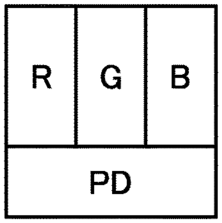

The pixels illustrated in FIG. 15H, FIG. 15(J), and FIG. 15(K) each include a subpixel (PD) having a light-receiving function, a subpixel (R) exhibiting red light, a subpixel (G) exhibiting green light, and a subpixel (B) exhibiting blue light.

Matrix arrangement is applied to the pixel illustrated in FIG. 15H, and stripe arrangement is applied to the pixel illustrated in FIG. 15(J). FIG. 15(K) illustrates an example in which the subpixel (R) exhibiting red light, the subpixel (G) exhibiting green light, and the subpixel (B) exhibiting blue light are arranged laterally in one row and the subpixel (PD) having a light-receiving function is arranged thereunder. In other words, in FIG. 15(K), the subpixel (R), the subpixel (G), and the subpixel (B) are arranged in the same row, which is different from the row in which the subpixel (PD) is provided.

Figure 15L:
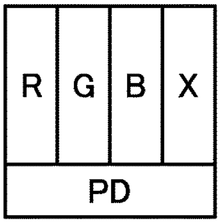

The pixel illustrated in FIG. 15(L) includes a subpixel (X) exhibiting light of a color other than R, G, and B, in addition to the components of the pixel illustrated in FIG. 15(K). The light of a color other than R, G, and B can be white (W) light, yellow (Y) light, cyan (C) light, magenta (M) light, infrared light (IR), or the like. In the case where the subpixel X emits infrared light, the subpixel (PD) having a light-receiving function preferably has a function of detecting infrared light. The subpixel (PD) having a light-receiving function may have a function of detecting both visible light and infrared light. The wavelength of light detected by the light-receiving element can be determined depending on the application of a sensor.

Alternatively, for example, the pixel includes a plurality of subpixels each including a light-emitting element and one subpixel including a light-emitting and light-receiving element.

The display device including the light-emitting and light-receiving element has no need to change the pixel arrangement when incorporating a light-receiving function into pixels; thus, a display portion can be provided with one or both of an imaging function and a sensing function without reductions in aperture ratio and resolution.

Note that the light-emitting and light-receiving element may be provided in all the pixels or may be provided in some of the pixels. In addition, one pixel may include a plurality of light-emitting and light-receiving elements.

FIG. 16A to FIG. 16D illustrate examples of a pixel which includes a plurality of subpixels each including a light-emitting element and includes one subpixel including a light-emitting and light-receiving element.

Figure 16A:
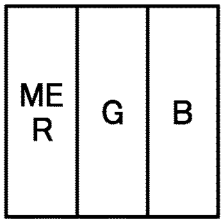
FIG. 16A to FIG. 16G are top views illustrating examples of a pixel.

A pixel illustrated in FIG. 16A employs stripe arrangement and includes a subpixel (MER) emitting red light and having a light-receiving function, a subpixel (G) emitting green light, and a subpixel (B) emitting blue light. In a display device including a pixel composed of three subpixels of R, G, and B, a light-emitting element used in the R subpixel can be replaced with a light-emitting and light-receiving element, so that the display device having a light-receiving function in the pixel can be manufactured.

Figure 16B:
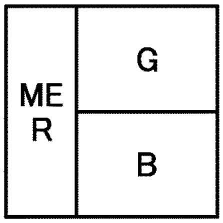

A pixel illustrated in FIG. 16B includes the subpixel (MER) emitting red light and having a light-receiving function, a subpixel (G) emitting green light, and a subpixel (B) emitting blue light. The subpixel (MER) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

Figure 16E:
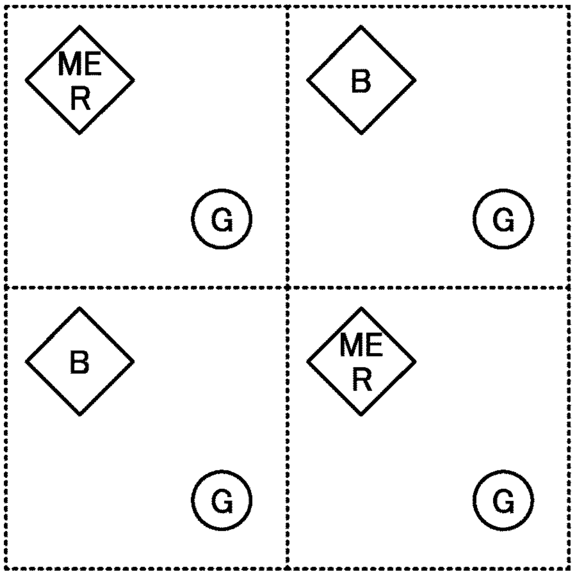
Figure 16C:
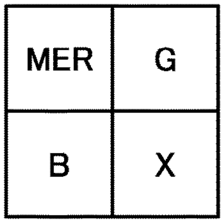

A pixel illustrated in FIG. 16C employs matrix arrangement and includes the subpixel (MER) emitting red light and having a light-receiving function, a subpixel (G) emitting green light, a subpixel (B) emitting blue light, and a subpixel (X) emitting light of a color other than R, G, and B. Also in a display device including a pixel composed of four subpixels of R, G, B, and X, a light-emitting element used in the R subpixel can be replaced with a light-emitting and light-receiving element, so that the display device having a light-receiving function in the pixel can be manufactured.

Figure 16D:
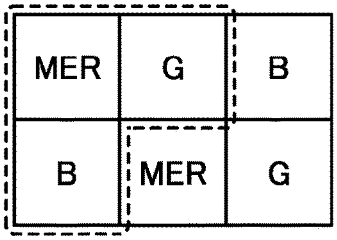

FIG. 16D illustrates two pixels, each of which is composed of three subpixels surrounded by dotted lines. The pixels illustrated in FIG. 16D each include a subpixel (MER) emitting red light and having a light-receiving function, a subpixel (G) emitting green light, and a subpixel (B) emitting blue light. In the pixel on the left in FIG. 16D, the subpixel (G) is positioned in the same row as the subpixel (MER), and the subpixel (B) is positioned in the same column as the subpixel (MER). In the pixel on the right in FIG. 16D, the subpixel (G) is positioned in the same row as the subpixel (MER), and the subpixel (B) is positioned in the same column as the subpixel (G). In every odd-numbered row and every even-numbered row of the pixel layout illustrated in FIG. 16D, the subpixel (MER), the subpixel (G), and the subpixel (B) are repeatedly arranged. In addition, subpixels of different colors are arranged in the odd-numbered row and the even-numbered row in every column.

Figure 16F:
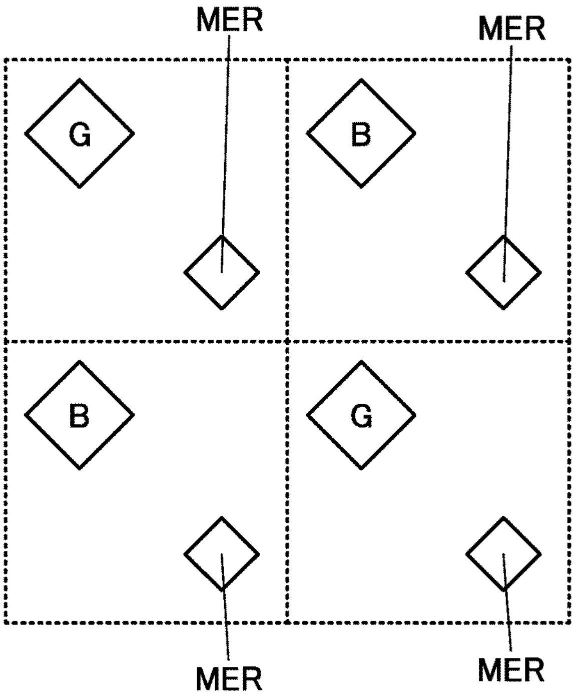

FIG. 16E illustrates four pixels which employ pentile arrangement; adjacent two pixels each have a different combination of two subpixels emitting light of different colors. Note that the shapes of the subpixels illustrated in FIG. 16E each indicate a top-surface shape of the light-emitting element or the light-emitting and light-receiving element included in the subpixel. FIG. 16F is a variation example of the pixel arrangement illustrated in FIG. 16E.

The upper-left pixel and the lower-right pixel illustrated in FIG. 16E each include the subpixel (MER) emitting red light and having a light-receiving function and a subpixel (G) emitting green light. The lower-left pixel and the upper-right pixel illustrated in FIG. 16E each include a subpixel (G) emitting green light and a subpixel (B) emitting blue light.

The upper-left pixel and the lower-right pixel illustrated in FIG. 16F each include the subpixel (MER) emitting red light and having a light-receiving function and a subpixel (G) emitting green light. The lower-left pixel and the upper-right pixel illustrated in FIG. 16F each include the subpixel (MER) emitting red light and having a light-receiving function and a subpixel (B) emitting blue light.

In FIG. 16E, the subpixel (G) emitting green light is provided in each pixel. Meanwhile, in FIG. 16F, the subpixel (MER) emitting red light and having a light-receiving function is provided in each pixel. The structure illustrated in FIG. 16F achieves higher-resolution imaging than the structure illustrated in FIG. 16E because of including a subpixel having a light-receiving function in each pixel. Thus, the accuracy of biometric authentication can be increased, for example.

The top-surface shapes of the light-emitting elements and the light-emitting and light-receiving elements are not particularly limited and can be a circular shape, an elliptical shape, a polygonal shape, a polygonal shape with rounded corners, or the like. The top-surface shape of the light-emitting elements included in the subpixels (G) is a circular in the example illustrated in FIG. 16E and square in the example illustrated in FIG. 16F. The top-surface shape of the light-emitting elements and the light-emitting and light-receiving elements may vary depending on the color thereof, or the light-emitting elements and the light-emitting and light-receiving elements of some colors or every color may have the same top-surface shape.

The aperture ratio of subpixels may vary depending on the color of the subpixels, or may be the same among the subpixels of some colors or every color. For example, the aperture ratio of a subpixel of a color provided in each pixel (the subpixel (G) in FIG. 16E, and the subpixel (MER) in FIG. 16F) may be made lower than those of subpixels of the other colors.

Figure 16G:
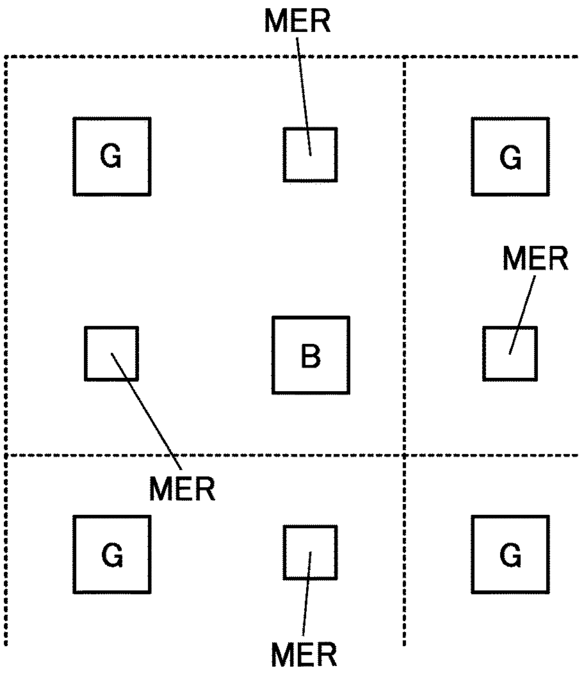

FIG. 16G is a variation example of the pixel arrangement illustrated in FIG. 16F. Specifically, the structure of FIG. 16G is obtained by rotating the structure of FIG. 16F by 45°. Although one pixel is regarded as being formed of two subpixels in FIG. 16F, one pixel can be regarded as being formed of four subpixels as illustrated in FIG. 16G.

In the description with reference to FIG. 16G, one pixel is regarded as being formed of four subpixels surrounded by dotted lines. A pixel includes two subpixels (MER), one subpixel (G), and one subpixel (B). The pixel including a plurality of subpixels each having a light-receiving function allows high-resolution imaging. Accordingly, the accuracy of biometric authentication can be increased. For example, the resolution of imaging can be the square root of 2 times the resolution of display.

A display device that employs the structure illustrated in FIG. 16F or FIG. 16G includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emit green light, and the other light-emitting elements emit blue light. The light-emitting and light-receiving elements emit red light and have a light-receiving function.

In the case where touch operation is detected with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light.

As described above, the display device of this embodiment can employ any of various types of pixel arrangements.

[Device Structure]

Next, detailed structures of the light-emitting element, the light-receiving element, and the light-emitting and light-receiving element which can be used in the display device of one embodiment of the present invention are described.

The display device of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

In this embodiment, a top-emission display device is described as an example.

In this specification and the like, unless otherwise specified, in describing a structure including a plurality of components (e.g., light-emitting elements or light-emitting layers), alphabets are not added when a common part for the components is described. For example, when a common part of a light-emitting layer 283R, a light-emitting layer 283G, and the like is described, the light-emitting layers are simply referred to as a light-emitting layer 283, in some cases.

Figure 17A:
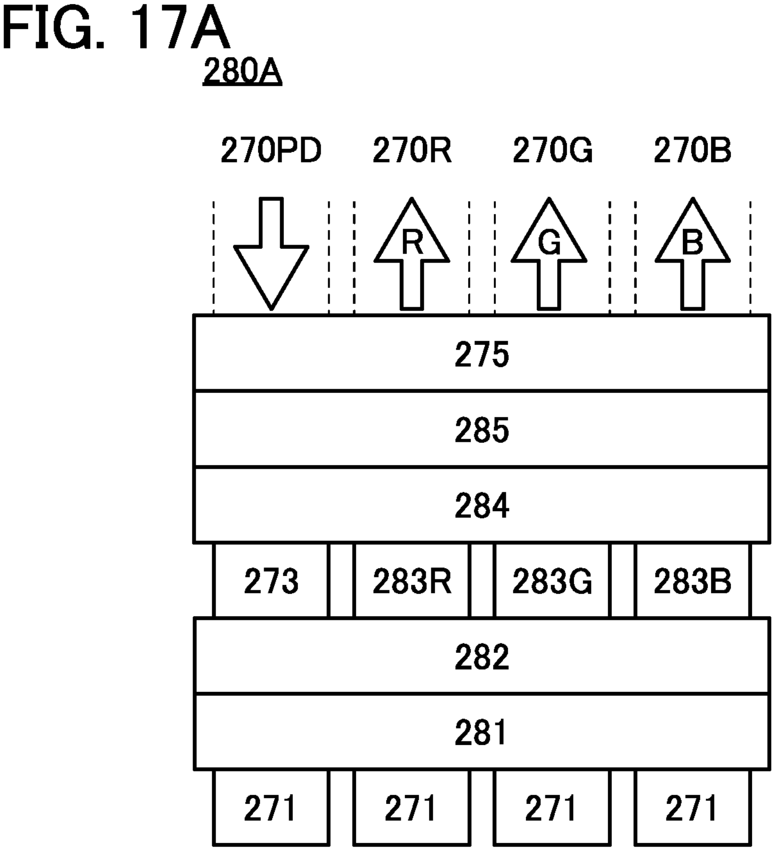
FIG. 17A and FIG. 17B are cross-sectional views illustrating examples of display devices.

A display device 280A illustrated in FIG. 17A includes a light-receiving element 270PD, a light-emitting element 270R that emits red (R) light, a light-emitting element 270G that emits green (G) light, and a light-emitting element 270B that emits blue (B) light.

Each of the light-emitting elements includes a pixel electrode 271, a hole-injection layer 281, a hole-transport layer 282, a light-emitting layer, an electron-transport layer 284, an electron-injection layer 285, and a common electrode 275 which are stacked in this order. The light-emitting element 270R includes the light-emitting layer 283R, the light-emitting element 270G includes the light-emitting layer 283G, and the light-emitting element 270B includes a light-emitting layer 283B. The light-emitting layer 283R includes a light-emitting substance that emits red light, the light-emitting layer 283G includes a light-emitting substance that emits green light, and the light-emitting layer 283B includes a light-emitting substance that emits blue light.

The light-emitting elements are electroluminescent elements that emit light to the common electrode 275 side by being supplied with a voltage between the pixel electrodes 271 and the common electrode 275.

The light-receiving element 270PD includes the pixel electrode 271, the hole-injection layer 281, the hole-transport layer 282, an active layer 273, the electron-transport layer 284, the electron-injection layer 285, and the common electrode 275 which are stacked in this order.

The light-receiving element 270PD is a photoelectric conversion element that receives light entering from the outside of the display device 280A and converts it into an electric signal.

This embodiment is described assuming that the pixel electrode 271 functions as an anode and the common electrode 275 functions as a cathode in both of the light-emitting element and the light-receiving element. In other words, when the light-receiving element is driven by application of reverse bias between the pixel electrode 271 and the common electrode 275, light entering the light-receiving element can be detected and electric charge can be generated and extracted as a current.

In the display device of this embodiment, an organic compound is used for the active layer 273 of the light-receiving element 270PD. In the light-receiving element 270PD, the layers other than the active layer 273 can have structures in common with the layers in the light-emitting elements. Therefore, the light-receiving element 270PD can be formed concurrently with the formation of the light-emitting elements only by adding a step of depositing the active layer 273 in the manufacturing process of the light-emitting elements. The light-emitting elements and the light-receiving element 270PD can be formed over one substrate. Accordingly, the light-receiving element 270PD can be incorporated into the display device without a significant increase in the number of manufacturing steps.

The display device 280A is an example in which the light-receiving element 270PD and the light-emitting elements have a common structure except that the active layer 273 of the light-receiving element 270PD and the light-emitting layers 283 of the light-emitting elements are separately formed. Note that the structures of the light-receiving element 270PD and the light-emitting elements are not limited thereto. The light-receiving element 270PD and the light-emitting elements may include separately formed layers other than the active layer 273 and the light-emitting layers 283. The light-receiving element 270PD and the light-emitting elements preferably include at least one layer used in common (common layer). Thus, the light-receiving element 270PD can be incorporated into the display device without a significant increase in the number of manufacturing steps.

A conductive film that transmits visible light is used as the electrode through which light is extracted, which is either the pixel electrode 271 or the common electrode 275. A conductive film that reflects visible light is preferably used as the electrode through which light is not extracted.

The light-emitting elements included in the display device of this embodiment preferably employs a micro optical resonator (microcavity) structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode).

The light transmittance of the transparent electrode is greater than or equal to 40%. For example, an electrode having a visible light (light with a wavelength greater than or equal to 400 nm and less than 750 nm) transmittance higher than or equal to 40% is preferably used in the light-emitting elements. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 283. The light-emitting element may further include, as a layer other than the light-emitting layer 283, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer injecting holes from an anode to the hole-transport layer, and a layer containing a material with a high hole-injection property. As the material with a high hole-injection property, a composite material containing a hole-transport material and an acceptor material (electron-accepting material), an aromatic amine compound, or the like can be used.

In the light-emitting element, the hole-transport layer is a layer transporting holes, which are injected from the anode by the hole-injection layer, to the light-emitting layer. In the light-receiving element, the hole-transport layer is a layer transporting holes, which are generated in the active layer on the basis of incident light, to the anode. The hole-transport layer is a layer containing a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer transporting electrons, which are injected from the cathode by the electron-injection layer, to the light-emitting layer. In the light-receiving element, the electron-transport layer is a layer transporting electrons, which are generated in the active layer on the basis of incident light, to the cathode. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 283 is a layer containing a light-emitting substance. The light-emitting layer 283 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 283 may contain one or more kinds of organic compounds (e.g., a host material and an assist material) in addition to the light-emitting substance (a guest material). As the one or more kinds of organic compounds, one or both of the hole-transport material and the electron-transport material can be used. As the one or more kinds of organic compounds, a bipolar material or a TADF material may be used.

The light-emitting layer 283 preferably includes a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 273 includes a semiconductor. Examples of the semiconductor include an inorganic semiconductor such as silicon and an organic semiconductor including an organic compound. This embodiment shows an example in which an organic semiconductor is used as the semiconductor included in the active layer 273. The use of an organic semiconductor is preferable because the light-emitting layer 283 and the active layer 273 can be formed by the same method (e.g., a vacuum evaporation method) and thus the same manufacturing apparatus can be used.

Examples of an n-type semiconductor material contained in the active layer 273 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases; however, since fullerene has a spherical shape, fullerene has a high electron-accepting property even when π-electrons widely spread. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 273 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 273 is preferably formed by co-evaporation of an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

Figure 17B:
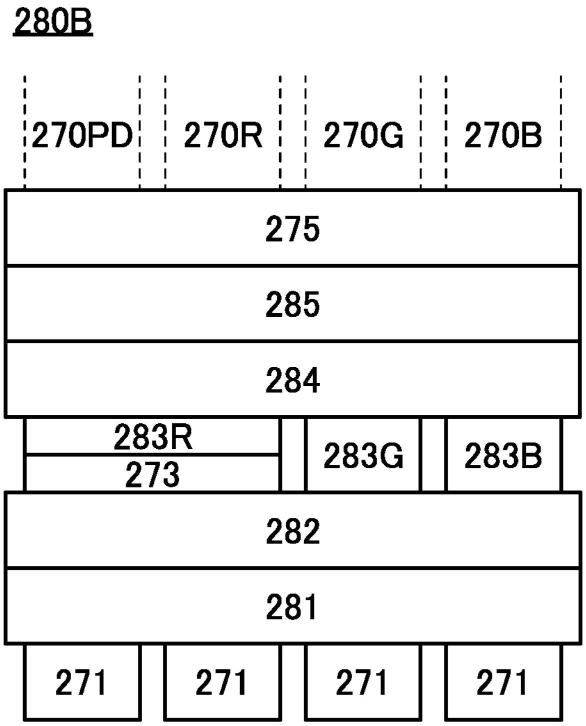

A display device 280B illustrated in FIG. 17B is different from the display device 280A in that the light-receiving element 270PD and the light-emitting element 270R have the same structure.

The light-receiving element 270PD and the light-emitting element 270R share the active layer 273 and the light-emitting layer 283R.

Here, it is preferable that the light-receiving element 270PD have a structure in common with the light-emitting element that emits light with a wavelength longer than that of the light desired to be detected. For example, the light-receiving element 270PD having a structure in which blue light is detected can have a structure which is similar to that of one or both of the light-emitting element 270R and the light-emitting element 270G. For example, the light-receiving element 270PD having a structure in which green light is detected can have a structure similar to that of the light-emitting element 270R.

When the light-receiving element 270PD and the light-emitting element 270R have a common structure, the number of deposition steps and the number of masks can be smaller than those for the structure in which the light-receiving element 270PD and the light-emitting element 270R include separately formed layers. As a result, the number of manufacturing steps and the manufacturing cost of the display device can be reduced.

When the light-receiving element 270PD and the light-emitting element 270R have a common structure, a margin for misalignment can be narrower than that for the structure in which the light-receiving element 270PD and the light-emitting element 270R include separately formed layers. Accordingly, the aperture ratio of a pixel can be increased, so that the light extraction efficiency of the display device can be increased. This can extend the life of the light-emitting element. Furthermore, the display device can exhibit a high luminance. Moreover, the resolution of the display device can also be increased.

The light-emitting layer 283R contains a light-emitting material that emits red light. The active layer 273 contains an organic compound that absorbs light with a wavelength shorter than that of red light (e.g., one or both of green light and blue light). The active layer 273 preferably contains an organic compound that does not easily absorb red light and that absorbs light with a wavelength shorter than that of red light. In this way, red light can be efficiently extracted from the light-emitting element 270R, and the light-receiving element 270PD can detect light with a wavelength shorter than that of red light at high accuracy.

Although the light-emitting element 270R and the light-receiving element 270PD have the same structure in an example of the display device 280B, the light-emitting element 270R and the light-receiving element 270PD may include optical adjustment layers with different thicknesses.

Figure 18A:
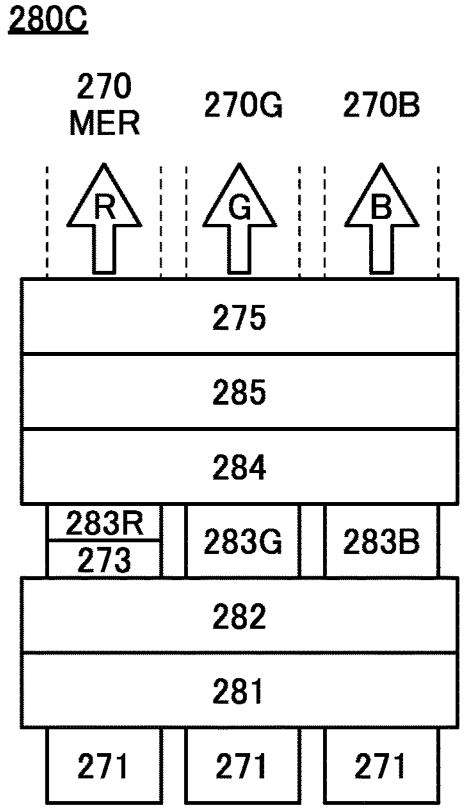
FIG. 18A and FIG. 18B are cross-sectional views illustrating examples of a display device.
Figure 18B:
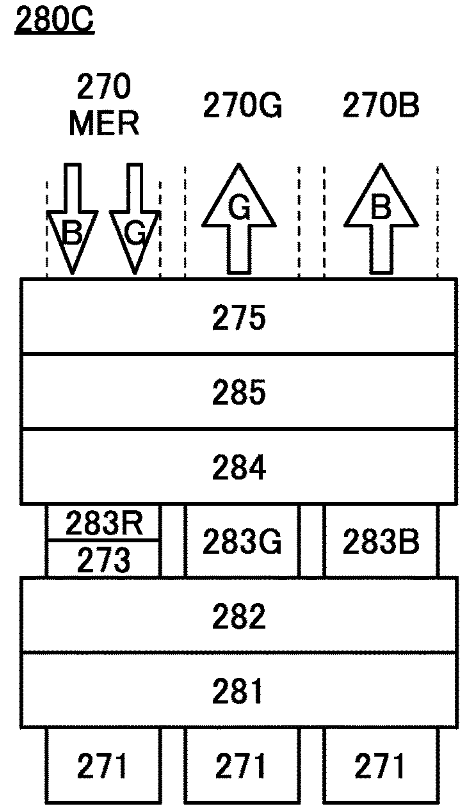

A display device 280C illustrated in FIG. 18A and FIG. 18B includes a light-emitting and light-receiving element 270MER that emits red (R) light and has a light-receiving function, the light-emitting element 270G that emits green (G) light, and the light-emitting element 270B that emits blue (B) light.

Each of the light-emitting elements includes the pixel electrode 271, the hole-injection layer 281, the hole-transport layer 282, a light-emitting layer, the electron-transport layer 284, the electron-injection layer 285, and the common electrode 275 which are stacked in this order. The light-emitting element 270G includes the light-emitting layer 283G, and the light-emitting element 270B includes the light-emitting layer 283B. The light-emitting layer 283G contains a light-emitting substance that emits green light, and the light-emitting layer 283B contains a light-emitting substance that emits blue light.

The light-emitting and light-receiving element 270MER includes the pixel electrode 271, the hole-injection layer 281, the hole-transport layer 282, the active layer 273, the light-emitting layer 283R, the electron-transport layer 284, the electron-injection layer 285, and the common electrode 275 which are stacked in this order.

Note that the light-emitting and light-receiving element 270MER included in the display device 280C has the same structure as the light-emitting element 270R and the light-receiving element 270PD included in the display device 280B. Furthermore, the light-emitting elements 270G and 270B included in the display device 280C also have the same structures as the light-emitting elements 270G and 270B included in the display device 280B.

FIG. 18A illustrates a case where the light-emitting and light-receiving element 270MER functions as a light-emitting element. In the example of FIG. 18A, the light-emitting element 270B emits blue light, the light-emitting element 270G emits green light, and the light-emitting and light-receiving element 270MER emits red light.

FIG. 18B illustrates a case where the light-emitting and light-receiving element 270MER functions as a light-receiving element. In the example of FIG. 18B, the light-emitting and light-receiving element 270MER detects blue light emitted from the light-emitting element 270B and green light emitted from the light-emitting element 270G.

The light-emitting element 270B, the light-emitting element 270G, and the light-emitting and light-receiving element 270MER each include the pixel electrode 271 and the common electrode 275. In this embodiment, the case where the pixel electrode 271 functions as an anode and the common electrode 275 functions as a cathode is described as an example.

This embodiment is described assuming that, also in the light-emitting and light-receiving element 270MER, the pixel electrode 271 functions as an anode and the common electrode 275 functions as a cathode as in the light-emitting element. In other words, when the light-emitting and light-receiving element 270MER is driven by application of reverse bias between the pixel electrode 271 and the common electrode 275, light entering the light-emitting and light-receiving element 270MER can be detected and electric charge can be generated and extracted as a current.

Note that it can be said that the light-emitting and light-receiving element 270MER illustrated in FIG. 18A and FIG. 18B has a structure in which the active layer 273 is added to the light-emitting element. That is, the light-emitting and light-receiving element 270MER can be formed concurrently with the formation of the light-emitting element only by adding a step of depositing the active layer 273 in the manufacturing process of the light-emitting element. The light-emitting element and the light-emitting and light-receiving element can be formed over one substrate. Thus, the display portion can be provided with one or both of an imaging function and a sensing function without a significant increase in the number of manufacturing steps.

The stacking order of the light-emitting layer 283R and the active layer 273 is not limited. FIG. 18A and FIG. 18B each illustrate an example in which the active layer 273 is provided over the hole-transport layer 282 and the light-emitting layer 283R is provided over the active layer 273. The light-emitting layer 283R may be provided over the hole-transport layer 282, and the active layer 273 may be provided over the light-emitting layer 283R.

As illustrated in FIG. 18A and FIG. 18B, the active layer 273 and the light-emitting layer 283R may be in contact with each other. Furthermore, a buffer layer may be interposed between the active layer 273 and the light-emitting layer 283R. As the buffer layer, at least one layer of a hole-injection layer, a hole-transport layer, an electron-transport layer, an electron-injection layer, a hole-blocking layer, an electron-blocking layer, and the like can be used.

The buffer layer provided between the active layer 273 and the light-emitting layer 283R can inhibit transfer of excitation energy from the light-emitting layer 283R to the active layer 273. Furthermore, the buffer layer can also be used to adjust the optical path length (cavity length) of the microcavity structure. Thus, high emission efficiency can be obtained from a light-emitting and light-receiving element including the buffer layer between the active layer 273 and the light-emitting layer 283R.

The light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

The light-emitting and light-receiving element may include, instead of including the active layer 273 and the light-emitting layer 283R, a layer serving as both a light-emitting layer and an active layer. As the layer serving as both a light-emitting layer and an active layer, it is possible to use, for example, a layer containing three materials which are an n-type semiconductor that can be used for the active layer 273, a p-type semiconductor that can be used for the active layer 273, and a light-emitting substance that can be used for the light-emitting layer 283R.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving element, a conductive film that transmits visible light is used as the electrode through which light is extracted. A conductive film that reflects visible light is preferably used as the electrode through which light is not extracted.

The functions and materials of the layers constituting the light-emitting and light-receiving element are similar to those of the layers constituting the light-emitting elements and the light-receiving element and are not described in detail.

A detailed structure of the display device of one embodiment of the present invention is described below with reference to FIG. 19 and FIG. 20.

[Display Device 100A]

Figure 19A:
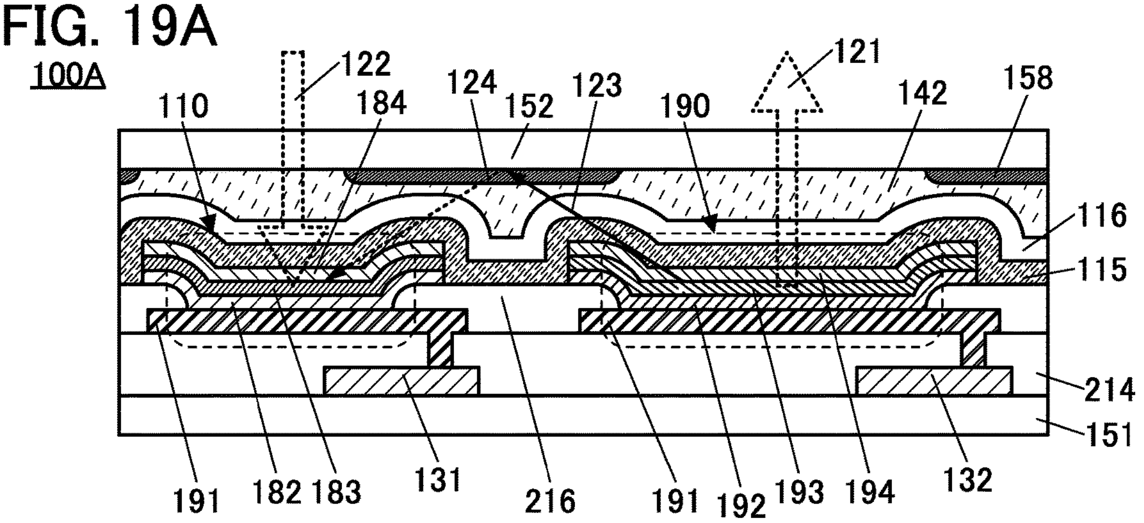
FIG. 19A to FIG. 19C are cross-sectional views illustrating examples of display devices.

FIG. 19A is a cross-sectional view of a display device 100A.

The display device 100A includes a light-receiving element 110 and a light-emitting element 190.

The light-emitting element 190 includes a pixel electrode 191, a buffer layer 192, a light-emitting layer 193, a buffer layer 194, and a common electrode 115 which are stacked in this order. The buffer layer 192 can include one or both of a hole-injection layer and a hole-transport layer. The light-emitting layer 193 contains an organic compound. The buffer layer 194 can include one or both of an electron-injection layer and an electron-transport layer. The light-emitting element 190 has a function of emitting visible light 121. Note that the display device 100A may also include a light-emitting element having a function of emitting infrared light.

The light-receiving element 110 includes the pixel electrode 191, a buffer layer 182, an active layer 183, a buffer layer 184, and the common electrode 115 which are stacked in this order. The buffer layer 182 can include a hole-transport layer. The active layer 183 contains an organic compound. The buffer layer 184 can include an electron-transport layer. The light-receiving element 110 has a function of detecting visible light. Note that the light-receiving element 110 may also have a function of detecting infrared light.

This embodiment is described assuming that the pixel electrode 191 functions as an anode and the common electrode 115 functions as a cathode in both of the light-emitting element 190 and the light-receiving element 110. In other words, the light-receiving element 110 is driven by application of reverse bias between the pixel electrode 191 and the common electrode 115, so that light entering the light-receiving element 110 can be detected and electric charge can be generated and extracted as a current in the display device 100A.

The pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrodes 191 are positioned over an insulating layer 214. The pixel electrodes 191 can be formed using the same material in the same step. End portions of the pixel electrodes 191 are covered with a partition 216. The two pixel electrodes 191 adjacent to each other are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. A partition that blocks visible light may be provided instead of the partition 216.

The common electrode 115 is a layer shared by the light-receiving element 110 and the light-emitting element 190.

The material, thickness, and the like of the pair of electrodes can be the same between the light-receiving element 110 and the light-emitting element 190. Accordingly, the manufacturing cost of the display device can be reduced and the manufacturing process of the display device can be simplified.

The display device 100A includes the light-receiving element 110, the light-emitting element 190, a transistor 131, a transistor 132, and the like between a pair of substrates (a substrate 151 and a substrate 152).

In the light-receiving element 110, the buffer layer 182, the active layer 183, and the buffer layer 184, which are positioned between the pixel electrode 191 and the common electrode 115, can each be referred to as an organic layer (a layer containing an organic compound). The pixel electrode 191 preferably has a function of reflecting visible light. The common electrode 115 has a function of transmitting visible light. Note that in the case where the light-receiving element 110 is configured to detect infrared light, the common electrode 115 has a function of transmitting infrared light. Furthermore, the pixel electrode 191 preferably has a function of reflecting infrared light.

The light-receiving element 110 has a function of detecting light. Specifically, the light-receiving element 110 is a photoelectric conversion element that receives light 122 entering from the outside of the display device 100A and converts it into an electric signal. The light 122 can also be expressed as light that is emitted from the light-emitting element 190 and then reflected by an object. The light 122 may enter the light-receiving element 110 through a lens or the like provided in the display device 100A.

In the light-emitting element 190, the buffer layer 192, the light-emitting layer 193, and the buffer layer 194, which are positioned between the pixel electrode 191 and the common electrode 115, can be collectively referred to as an EL layer. The EL layer includes at least the light-emitting layer 193. As described above, the pixel electrode 191 preferably has a function of reflecting visible light. The common electrode 115 has a function of transmitting visible light. Note that in the case where the display device 100A includes a light-emitting element that emits infrared light, the common electrode 115 has a function of transmitting infrared light. Furthermore, the pixel electrode 191 preferably has a function of reflecting infrared light.

The light-emitting element included in the display device of this embodiment preferably employs a micro optical resonator (microcavity) structure.

The buffer layer 192 or the buffer layer 194 may have a function of an optical adjustment layer. By changing the thickness of the buffer layer 192 or the buffer layer 194, light of a particular color can be intensified and taken out from each light-emitting element.

The light-emitting element 190 has a function of emitting visible light. Specifically, the light-emitting element 190 is an electroluminescent element that emits light to the substrate 152 side by being supplied with a voltage between the pixel electrode 191 and the common electrode 115 (see the visible light 121).

The pixel electrode 191 included in the light-receiving element 110 is electrically connected to a source or a drain of the transistor 131 through an opening provided in the insulating layer 214.

The pixel electrode 191 included in the light-emitting element 190 is electrically connected to a source or a drain of the transistor 132 through an opening provided in the insulating layer 214.

The transistor 131 and the transistor 132 are over and in contact with the same layer (the substrate 151 in FIG. 19A).

At least part of a circuit electrically connected to the light-receiving element 110 and a circuit electrically connected to the light-emitting element 190 are preferably formed using the same material in the same step. In that case, the thickness of the display device can be reduced compared with the case where the two circuits are separately formed, resulting in simplification of the manufacturing steps.

The light-receiving element 110 and the light-emitting element 190 are preferably covered with a protective layer 116. In FIG. 19A, the protective layer 116 is provided over and in contact with the common electrode 115. Providing the protective layer 116 can inhibit entry of impurities such as water into the light-receiving element 110 and the light-emitting element 190, so that the reliability of the light-receiving element 110 and the light-emitting element 190 can be increased. The protective layer 116 and the substrate 152 are bonded to each other with an adhesive layer 142.

A light shielding layer 158 is provided on a surface of the substrate 152 on the substrate 151 side. The light shielding layer 158 has openings in a position overlapping with the light-emitting element 190 and in a position overlapping with the light-receiving element 110.

Here, the light-receiving element 110 detects light that is emitted from the light-emitting element 190 and then reflected by an object. However, in some cases, light emitted from the light-emitting element 190 is reflected inside the display device 100A and enters the light-receiving element 110 without through an object. The light shielding layer 158 can reduce the influence of such stray light. For example, in the case where the light shielding layer 158 is not provided, light 123 emitted from the light-emitting element 190 is reflected by the substrate 152 and reflected light 124 enters the light-receiving element 110 in some cases. Providing the light shielding layer 158 can inhibit entry of the reflected light 124 into the light-receiving element 110. Consequently, noise can be reduced, and the sensitivity of a sensor using the light-receiving element 110 can be increased.

For the light shielding layer 158, a material that blocks light emitted from the light-emitting element can be used. The light shielding layer 158 preferably absorbs visible light. As the light shielding layer 158, a black matrix can be formed using a metal material or a resin material containing pigment (e.g., carbon black) or dye, for example. The light shielding layer 158 may have a stacked-layer structure of a red color filter, a green color filter, and a blue color filter.

[Display Device 100B]

Figure 19B:
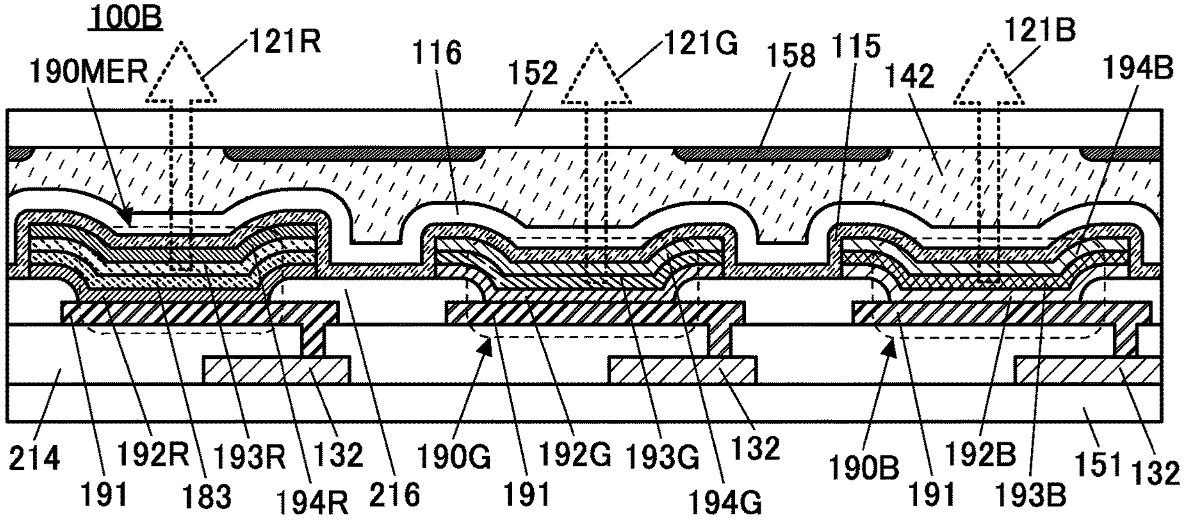
Figure 19C:
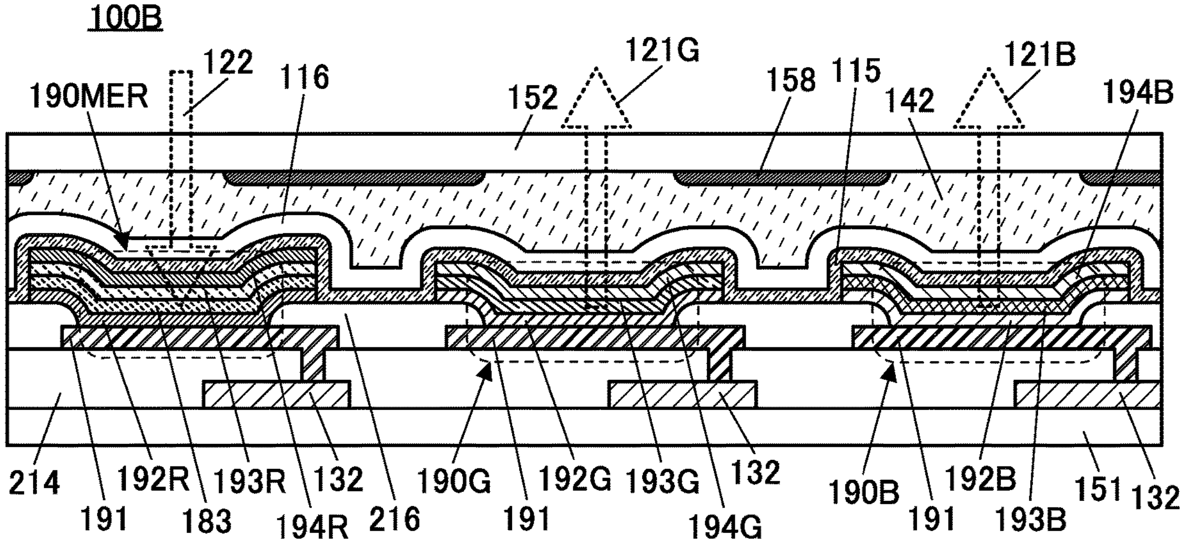

FIG. 19B and FIG. 19C are cross-sectional views of a display device 100B. Note that in the description of the display device below, description of components similar to those of the above-described display device are omitted in some cases.

The display device 100B includes a light-emitting element 190B, a light-emitting element 190G, and a light-emitting and light-receiving element 190MER.

The light-emitting element 190B includes the pixel electrode 191, a buffer layer 192B, a light-emitting layer 193B, a buffer layer 194B, and the common electrode 115 which are stacked in this order. The light-emitting element 190B has a function of emitting blue light 121B.

The light-emitting element 190G includes the pixel electrode 191, a buffer layer 192G, a light-emitting layer 193G, a buffer layer 194G, and the common electrode 115 which are stacked in this order. The light-emitting element 190G has a function of emitting green light 121G.

The light-emitting and light-receiving element 190MER includes the pixel electrode 191, a buffer layer 192R, the active layer 183, a light-emitting layer 193R, a buffer layer 194R, and the common electrode 115 which are stacked in this order. The light-emitting and light-receiving element 190MER has a function of emitting red light 121R and a function of detecting the light 122.

FIG. 19B illustrates a case where the light-emitting and light-receiving element 190MER functions as a light-emitting element. FIG. 19B illustrates an example in which the light-emitting element 190B emits blue light, the light-emitting element 190G emits green light, and the light-emitting and light-receiving element 190MER emits red light.

FIG. 19C illustrates a case where the light-emitting and light-receiving element 190MER functions as a light-receiving element. FIG. 19C illustrates an example in which the light-emitting and light-receiving element 190MER detects blue light emitted from the light-emitting element 190B and green light emitted from the light-emitting element 190G.

The display device 100B includes the light-emitting and light-receiving element 190MER, the light-emitting element 190G, the light-emitting element 190B, the transistor 132, and the like between the pair of substrates (the substrate 151 and the substrate 152).

The pixel electrode 191 is positioned over the insulating layer 214. The two pixel electrodes 191 adjacent to each other are electrically insulated from each other by the partition 216. The pixel electrode 191 is electrically connected to the source or the drain of the transistor 132 through the opening provided in the insulating layer 214.

The light-emitting and light-receiving element and the light-emitting elements are preferably covered with the protective layer 116. The protective layer 116 and the substrate 152 are bonded to each other with the adhesive layer 142. The light shielding layer 158 is provided on the surface of the substrate 152 on the substrate 151 side.

[Display Device 100C]

Figure 20A:
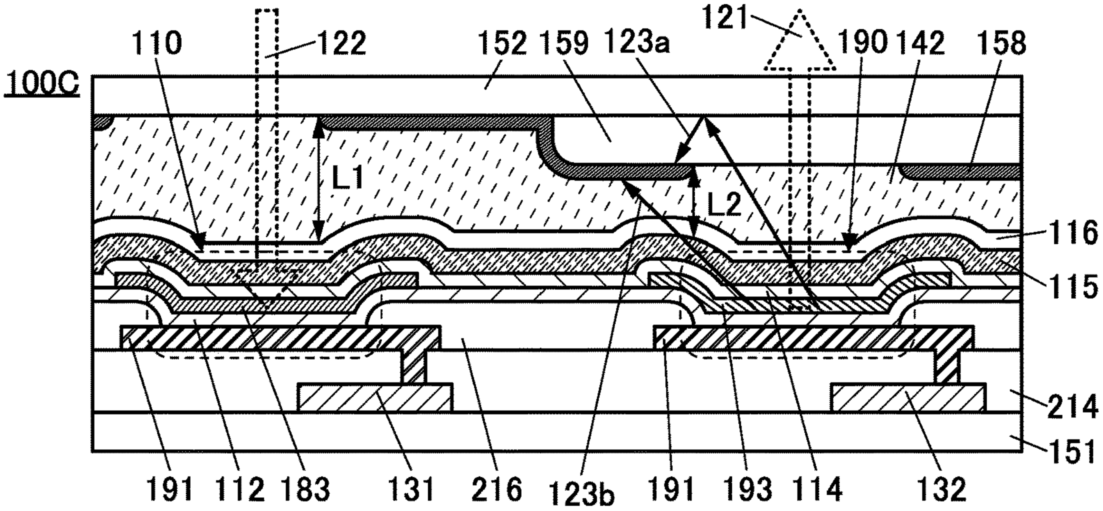
FIG. 20A is a cross-sectional view illustrating an example of a display device.

FIG. 20A is a cross-sectional view of a display device 100C.

The display device 100C includes the light-receiving element 110 and the light-emitting element 190.

The light-emitting element 190 includes the pixel electrode 191, a common layer 112, the light-emitting layer 193, a common layer 114, and the common electrode 115 in this order. The common layer 112 can include one or both of a hole-injection layer and a hole-transport layer. The light-emitting layer 193 contains an organic compound. The common layer 114 can include one or both of an electron-injection layer and an electron-transport layer. The light-emitting element 190 has a function of emitting visible light. Note that the display device 100C may also include a light-emitting element having a function of emitting infrared light.

The light-receiving element 110 includes the pixel electrode 191, the common layer 112, the active layer 183, the common layer 114, and the common electrode 115 which are stacked in this order. The active layer 183 contains an organic compound. The light-receiving element 110 has a function of detecting visible light. Note that the light-receiving element 110 may also have a function of detecting infrared light.

The pixel electrode 191, the common layer 112, the active layer 183, the light-emitting layer 193, the common layer 114, and the common electrode 115 may each have a single-layer structure or a stacked-layer structure.

The pixel electrode 191 is positioned over the insulating layer 214. The two pixel electrodes 191 adjacent to each other are electrically insulated from each other by the partition 216. The pixel electrode 191 is electrically connected to the source or the drain of the transistor 132 through the opening provided in the insulating layer 214.

The common layer 112, the common layer 114, and the common electrode 115 are layers shared by the light-receiving element 110 and the light-emitting element 190. At least some of the layers constituting the light-receiving element 110 and the light-emitting element 190 are preferably shared, so that the number of manufacturing steps of the display device can be reduced.

The display device 100C includes the light-receiving element 110, the light-emitting element 190, the transistor 131, the transistor 132, and the like between the pair of substrates (the substrate 151 and the substrate 152).

The light-receiving element 110 and the light-emitting element 190 are preferably covered with the protective layer 116. The protective layer 116 and the substrate 152 are bonded to each other with the adhesive layer 142.

A resin layer 159 is provided on the surface of the substrate 152 on the substrate 151 side. The resin layer 159 is provided in a position overlapping with the light-emitting element 190 and is not provided in a position overlapping with the light-receiving element 110.

Figure 20B:
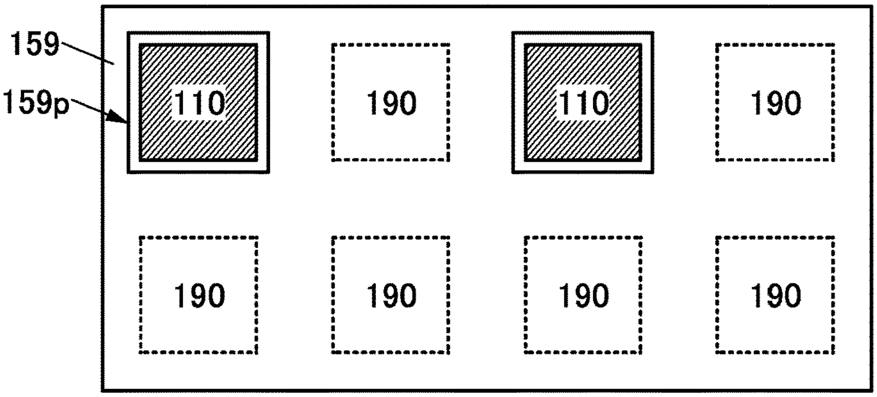
FIG. 20B and FIG. 20C are diagrams illustrating examples of a top layout of a resin layer.
Figure 20C:
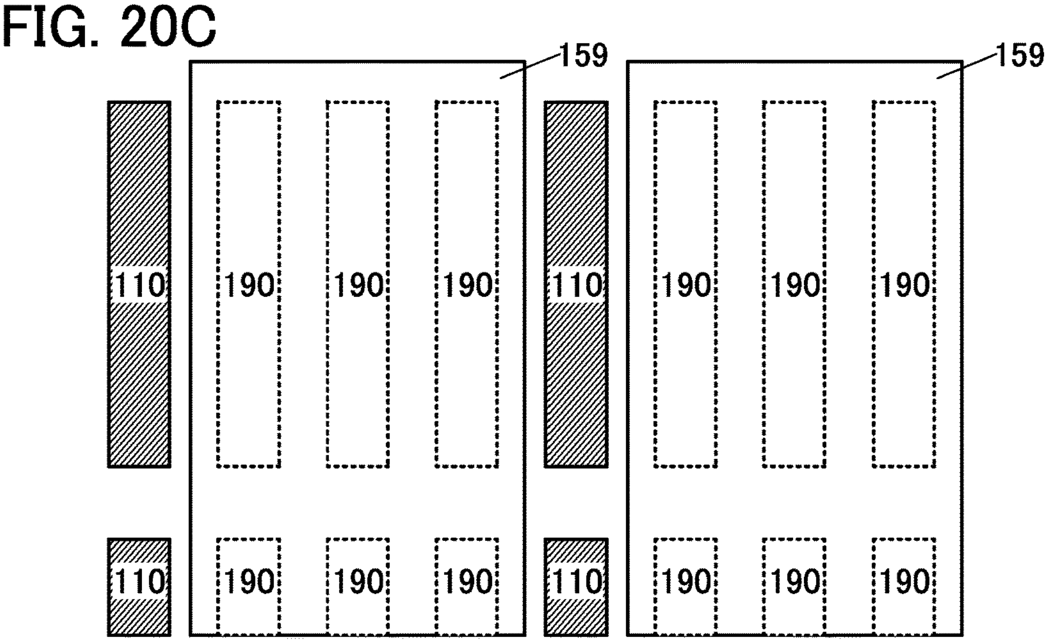

The resin layer 159 can be provided in the position overlapping with the light-emitting element 190 and have an opening 159*p* in the position overlapping with the light-receiving element 110, as illustrated in FIG. 20B, for example. Alternatively, as illustrated in FIG. 20C, the resin layer 159 can be provided to have an island shape in a position overlapping with the light-emitting element 190 but not in a position overlapping with the light-receiving element 110.

The light shielding layer 158 is provided on the surface of the substrate 152 on the substrate 151 side and on a surface of the resin layer 159 on the substrate 151 side. The light shielding layer 158 has openings in a position overlapping with the light-emitting element 190 and in a position overlapping with the light-receiving element 110.

Here, the light-receiving element 110 detects light that is emitted from the light-emitting element 190 and then reflected by an object. However, in some cases, light emitted from the light-emitting element 190 is reflected inside the display device 100C and enters the light-receiving element 110 without through an object. The light shielding layer 158 can absorb such stray light and thereby reduce entry of stray light into the light-receiving element 110. For example, the light shielding layer 158 can absorb stray light 123*a* that has passed through the resin layer 159 and has been reflected by the surface of the substrate 152 on the substrate 151 side. Moreover, the light shielding layer 158 can absorb stray light 123*b* before the stray light 123*b* reaches the resin layer 159. This can inhibit stray light from entering the light-receiving element 110. Consequently, noise can be reduced, and the sensitivity of a sensor using the light-receiving element 110 can be increased. It is particularly preferable that the light shielding layer 158 be positioned close to the light-emitting element 190, in which case stray light can be further reduced. This is preferable also in terms of improving display quality, because the light shielding layer 158 positioned close to the light-emitting element 190 can inhibit viewing angle dependence of display.

Providing the light shielding layer 158 can control the range where the light-receiving element 110 detects light. When the light shielding layer 158 is positioned apart from the light-receiving element 110, the imaging range is narrowed, and the imaging resolution can be increased.

In the case where the resin layer 159 has an opening, the light shielding layer 158 preferably covers at least part of the opening and at least part of the side surface of the resin layer 159 exposed in the opening.

In the case where the resin layer 159 is provided in an island shape, the light shielding layer 158 preferably covers at least part of the side surface of the resin layer 159.

Since the light shielding layer 158 is provided along the shape of the resin layer 159 in such a manner, the distance from the light shielding layer 158 to the light-emitting element 190 (specifically, the light-emitting region of the light-emitting element 190) is shorter than the distance from the light shielding layer 158 to the light-receiving element 110 (specifically, the light-receiving region of the light-receiving element 110). Accordingly, noise of the sensor can be reduced, the imaging resolution can be increased, and viewing angle dependence of display can be inhibited. Thus, both the display quality and the imaging quality of the display device can be increased.

The resin layer 159 is a layer that transmits light emitted from the light-emitting element 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light shielding layer 158 is not limited to the resin layer and may be an inorganic insulating film or the like. As the component becomes thicker, a larger difference occurs between the distance from the light shielding layer to the light-receiving element and the distance from the light shielding layer to the light-emitting element. An organic insulating film made of a resin or the like is suitable for the component because it is easily formed to have a large thickness.

In order to compare the distance from the light shielding layer 158 to the light-receiving element 110 and the distance from the light shielding layer 158 to the light-emitting element 190, it is possible to use, for example, the shortest distance L1 from an end portion of the light shielding layer 158 on the light-receiving element 110 side to the common electrode 115 and the shortest distance L2 from an end portion of the light shielding layer 158 on the light-emitting element 190 side to the common electrode 115. With the shortest distance L2 smaller than the shortest distance L1, stray light from the light-emitting element 190 can be inhibited, and the sensitivity of the sensor using the light-receiving element 110 can be increased. Furthermore, viewing angle dependence of display can be inhibited. With the shortest distance L1 larger than the shortest distance L2, the imaging range of the light-receiving element 110 can be narrowed, and the imaging resolution can be increased.

In addition, when the adhesive layer 142 is provided such that a portion overlapping with the light-receiving element 110 is made thicker than a portion overlapping with the light-emitting element 190, a difference also can be made between the distance from the light shielding layer 158 to the light-receiving element 110 and the distance from the light shielding layer 158 to the light-emitting element 190.

A more detailed structure of the display device of one embodiment of the present invention is described below with reference to FIG. 21 to FIG. 24.

[Display Device 100D]

Figure 21:
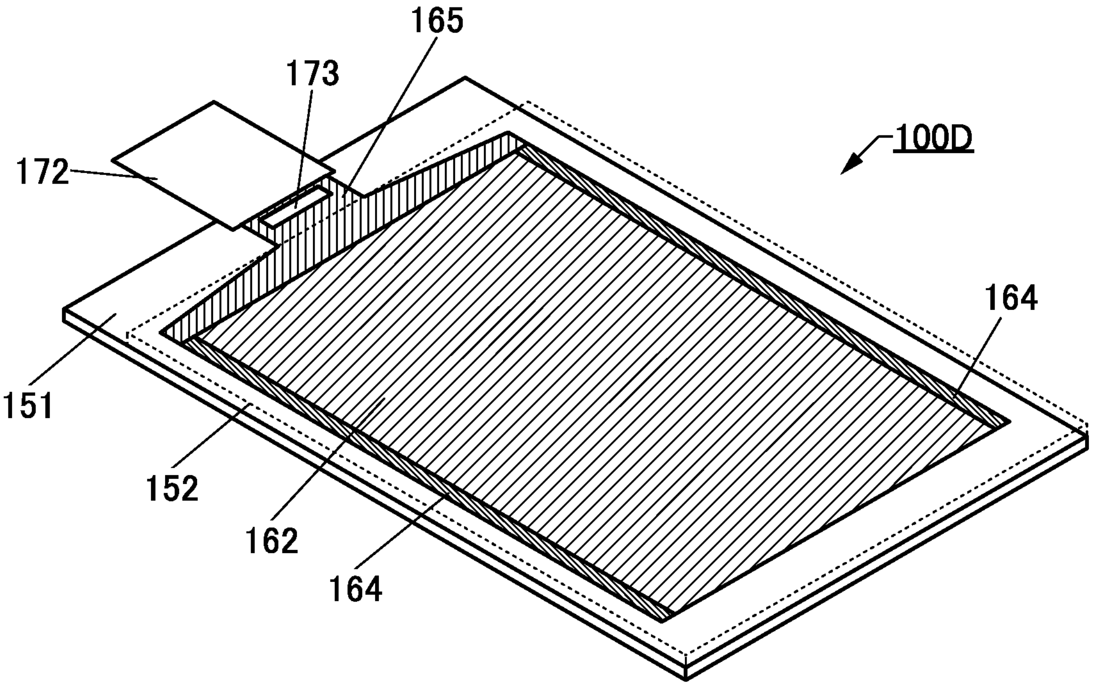
FIG. 21 is a perspective view illustrating an example of a display device.
Figure 22:
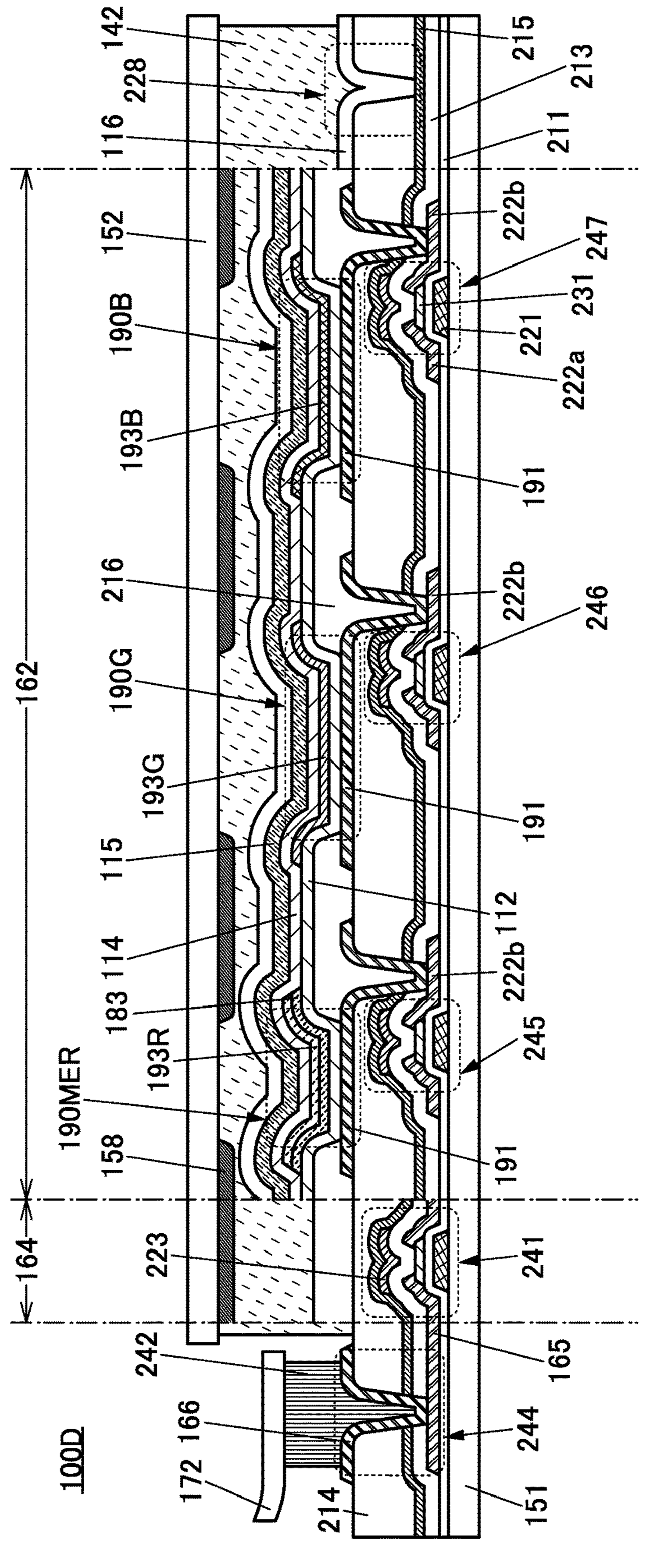
FIG. 22 is a cross-sectional view illustrating an example of a display device.

FIG. 21 is a perspective view of a display device 100D, and FIG. 22 is a cross-sectional view of the display device 100D.

The display device 100D has a structure in which the substrate 152 and the substrate 151 are bonded to each other. In FIG. 21, the substrate 152 is denoted by a dashed line.

The display device 100D includes a display portion 162, a circuit 164, a wiring 165, and the like. FIG. 21 illustrates an example in which an IC (integrated circuit) 173 and an FPC 172 are mounted on the display device 100D. Thus, the structure illustrated in FIG. 21 can be regarded as a display module including the display device 100D, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 21 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100D and the display module may have a structure that is not provided with an IC. The IC may be provided over the FPC by a COF method or the like.

FIG. 22 illustrates an example of cross sections of part of a region including the FPC 172, part of a region including the circuit 164, part of a region including the display portion 162, and part of a region including an end portion of the display device 100D illustrated in FIG. 21.

The display device 100D illustrated in FIG. 22 includes a transistor 241, a transistor 245, a transistor 246, a transistor 247, the light-emitting element 190B, the light-emitting element 190G, the light-emitting and light-receiving element 190MER, and the like between the substrate 151 and the substrate 152.

The substrate 152 and the protective layer 116 are bonded to each other with the adhesive layer 142. A solid sealing structure, a hollow sealing structure, or the like can be employed to seal the light-emitting element 190B, the light-emitting element 190G, and the light-emitting and light-receiving element 190MER. In FIG. 22, a space surrounded by the substrate 152, the adhesive layer 142, and the insulating layer 214 is sealed with the adhesive layer 142, and the solid sealing structure is employed.

The light-emitting element 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222*b* included in the transistor 247 through an opening provided in the insulating layer 214. The transistor 247 has a function of controlling the driving of the light-emitting element 190B. The end portion of the pixel electrode 191 is covered with the partition 216. The pixel electrode 191 contains a material that reflects visible light, and the common electrode 115 contains a material that transmits visible light.

The light-emitting element 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222*b* included in the transistor 246 through an opening provided in the insulating layer 214. The transistor 246 has a function of controlling the driving of the light-emitting element 190G.

The light-emitting and light-receiving element 190MER has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222*b* included in the transistor 245 through an opening provided in the insulating layer 214. The transistor 245 has a function of controlling the driving of the light-emitting and light-receiving element 190MER.

Light emitted from the light-emitting element 190B, the light-emitting element 190G, and the light-emitting and light-receiving element 190MER is emitted toward the substrate 152 side. Light enters the light-emitting and light-receiving element 190MER through the substrate 152 and the adhesive layer 142. For the substrate 152 and the adhesive layer 142, a material having a high visible-light-transmitting property is preferably used.

The pixel electrodes 191 included in the light-emitting element 190B, the light-emitting element 190G, and the light-emitting and light-receiving element 190MER can be formed using the same material in the same step. The common layer 112, the common layer 114, and the common electrode 115 are used in common in the light-emitting element 190B, the light-emitting element 190G, and the light-emitting and light-receiving element 190MER. The light-emitting and light-receiving element 190MER has the structure of the red-light-emitting element to which the active layer 183 is added. The light-emitting element 190B, the light-emitting element 190G, and the light-emitting and light-receiving element 190MER can have a common structure except for the active layer 183 and the light-emitting layer 193 of each color. Thus, the display portion 162 of the display device 100D can have a light-receiving function without a significant increase in the number of manufacturing steps.

The light shielding layer 158 is provided on the surface of the substrate 152 on the substrate 151 side. The light shielding layer 158 includes openings in positions overlapping with the light-emitting element 190B, the light-emitting element 190G, and the light-emitting and light-receiving element 190MER. Providing the light shielding layer 158 can control the range where the light-emitting and light-receiving element 190MER detects light. As described above, it is preferable to control light entering the light-emitting and light-receiving element by adjusting the position of the opening of the light shielding layer provided in a position overlapping with the light-emitting and light-receiving element 190MER. Furthermore, with the light shielding layer 158, light can be inhibited from directly entering the light-emitting and light-receiving element 190MER from the light-emitting element 190 without through an object. Hence, a sensor with less noise and high sensitivity can be achieved.

The transistor 241, the transistor 245, the transistor 246, and the transistor 247 are formed over the substrate 151. These transistors can be formed using the same material in the same step.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of the end portion of the display device 100D. This can inhibit entry of impurities from the end portion of the display device 100D through the organic insulating film. Alternatively, the organic insulating film may be formed such that an end portion of the organic insulating film is positioned on the inner side compared to the end portion of the display device 100D, to prevent the organic insulating film from being exposed at the end portion of the display device 100D.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

By provision of the protective layer 116 that covers the light-emitting element 190B, the light-emitting element 190G, and the light-emitting and light-receiving element 190MER, impurities such as water can be inhibited from entering the light-emitting element 190B, the light-emitting element 190G, and the light-emitting and light-receiving element 190MER, leading to an increase in the reliability of the light-emitting element 190B, the light-emitting element 190G, and the light-emitting and light-receiving element 190MER.

In a region 228 illustrated in FIG. 22, an opening is formed in the insulating layer 214. This can inhibit entry of impurities into the display portion 162 from the outside through the insulating layer 214 even when an organic insulating film is used as the insulating layer 214. Thus, the reliability of the display device 100D can be increased.

In the region 228 in the vicinity of the end portion of the display device 100D, the insulating layer 215 and the protective layer 116 are preferably in contact with each other through the opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Thus, the reliability of the display device 100D can be increased.

The protective layer 116 may have a single-layer structure or a stacked-layer structure. For example, the protective layer 116 may have a stacked-layer structure of an organic insulating film and an inorganic insulating film. In that case, an end portion of the inorganic insulating film preferably extends beyond an end portion of the organic insulating film.

Each of the transistor 241, the transistor 245, the transistor 246, and the transistor 247 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer where a channel is formed.

The structure in which the semiconductor layer where a channel is formed is provided between two gates is used for the transistor 241, the transistor 245, the transistor 246, and the transistor 247. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and any of an amorphous semiconductor, a semiconductor having crystallinity, and a single-crystal semiconductor (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 244 is provided in a region of the substrate 151 that does not overlap with the substrate 152. In the connection portion 244, the wiring 165 is electrically connected to the FPC 172 via a conductive layer 166 and a connection layer 242. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

A variety of optical members can be arranged on an outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outer surface of the substrate 152.

For each of the substrate 151 and the substrate 152, glass, quartz, ceramic, sapphire, resin, or the like can be used. When a flexible material is used for the substrate 151 and the substrate 152, the flexibility of the display device can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

For the structures, materials, and the like of the light-emitting elements 190G and 190B and the light-emitting and light-receiving element 190MER, the above description can be referred to.

As materials that can be used for a gate, a source, and a drain of a transistor and conductive layers such as a variety of wirings and electrodes included in a display device, metals such as aluminum, titanium, chromium, nickel, copper, yttrium, zirconium, molybdenum, silver, tantalum, and tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display device, and conductive layers (conductive layers functioning as a pixel electrode, a common electrode, or the like) included in a light-emitting element and a light-receiving element (or a light-emitting and light-receiving element).

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100E]

Figure 23:
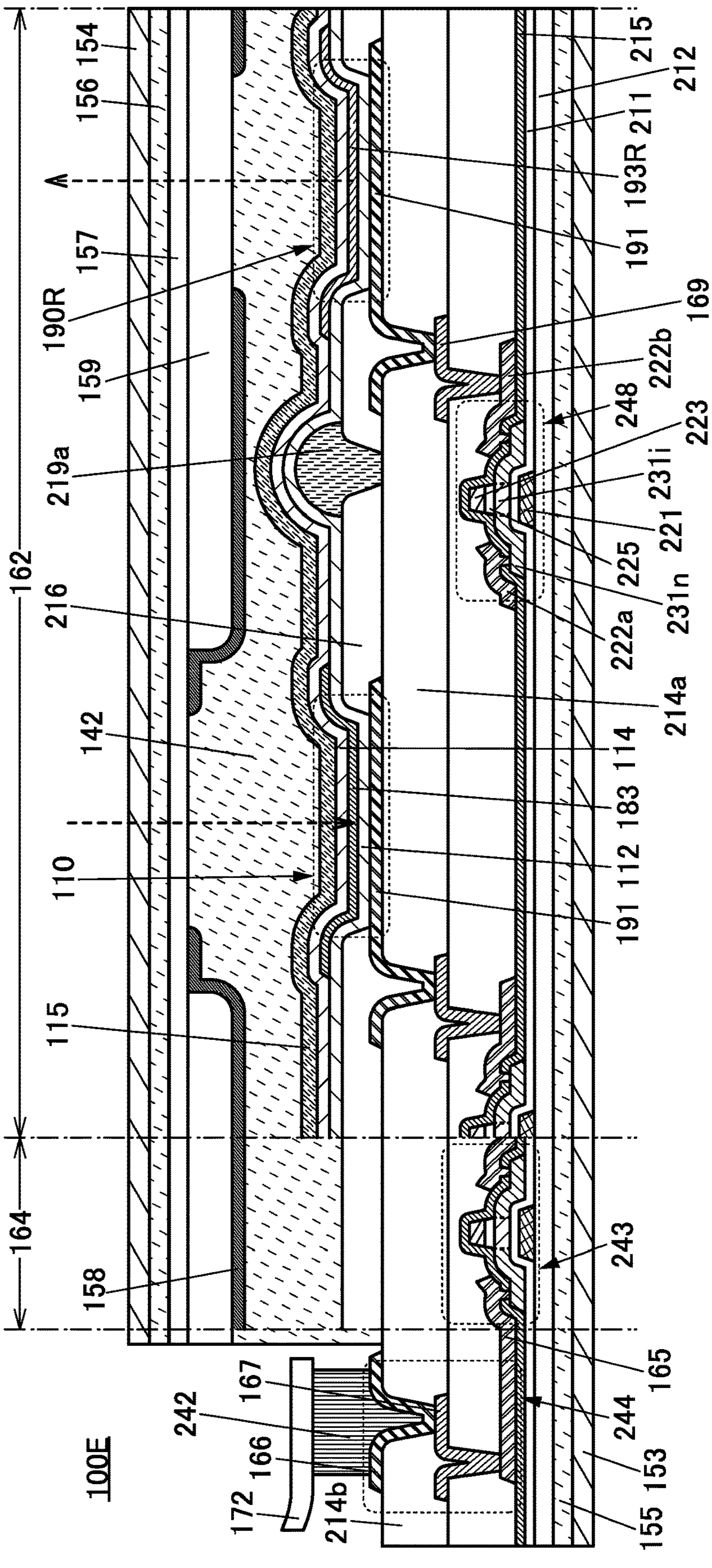
FIG. 23 is a cross-sectional view illustrating an example of a display device.
Figure 24A:
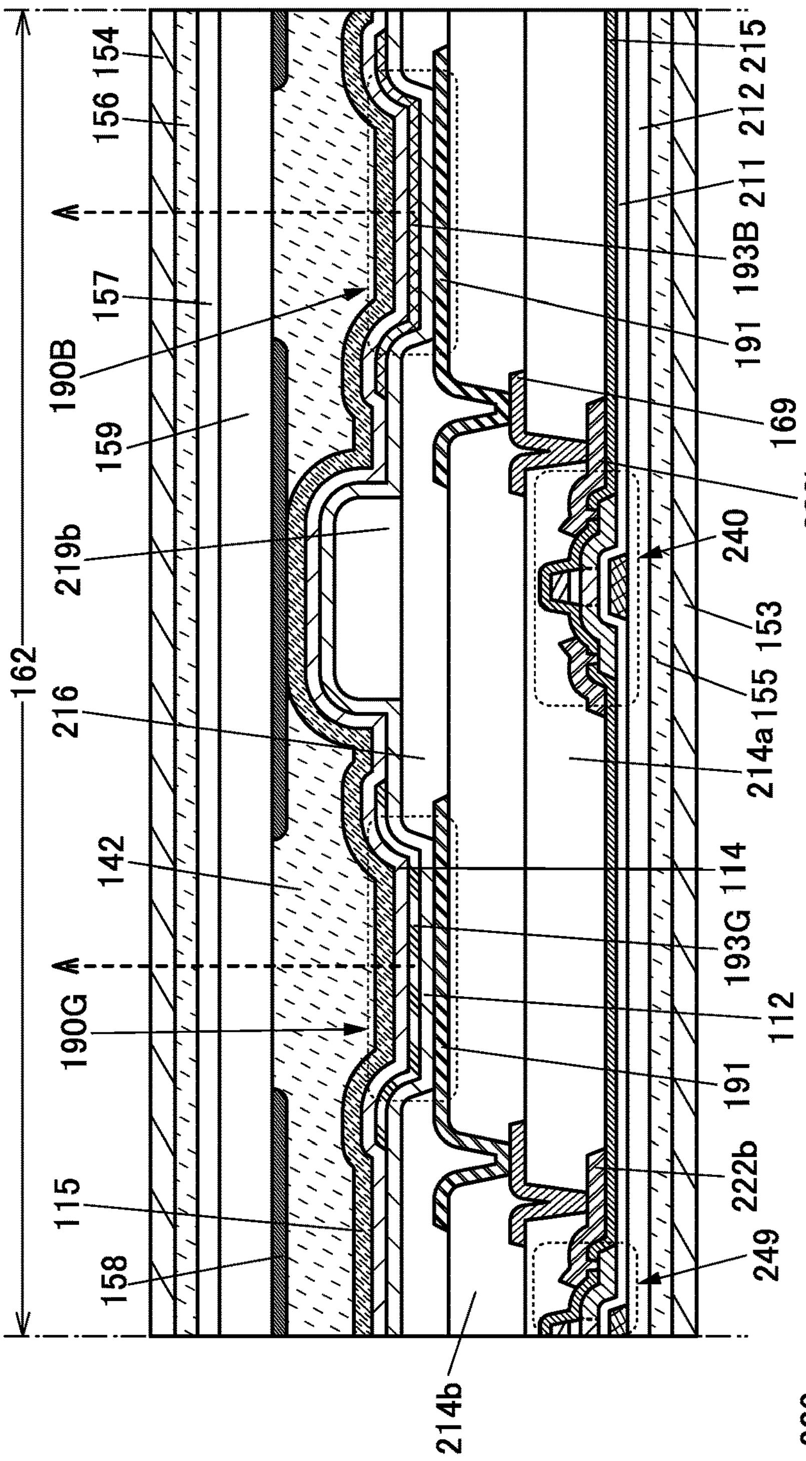
FIG. 24A is a cross-sectional view illustrating an example of a display device.

FIG. 23 and FIG. 24A illustrate cross-sectional views of a display device 100E. A perspective view of the display device 100E is similar to that of the display device 100D (FIG. 18). FIG. 23 illustrates an example of cross sections of part of a region including the FPC 172, part of the circuit 164, and part of the display portion 162 in the display device 100E. FIG. 24A illustrates an example of a cross section of part of the display portion 162 in the display device 100E. FIG. 23 specifically illustrates an example of a cross section of a region including the light-receiving element 110 and the light-emitting element 190R that emits red light in the display portion 162. FIG. 24A specifically illustrates an example of a cross section of a region including the light-emitting element 190G that emits green light and the light-emitting element 190B that emits blue light in the display portion 162.

The display device 100E illustrated in FIG. 23 and FIG. 24A includes a transistor 243, a transistor 248, a transistor 249, a transistor 240, the light-emitting element 190R, the light-emitting element 190G, the light-emitting element 190B, the light-receiving element 110, and the like between a substrate 153 and a substrate 154.

The resin layer 159 and the common electrode 115 are bonded to each other with the adhesive layer 142, and the display device 100E employs a solid sealing structure.

The substrate 153 and the insulating layer 212 are bonded to each other with an adhesive layer 155. The substrate 154 and an insulating layer 157 are bonded to each other with an adhesive layer 156.

To manufacture the display device 100E, first, a first formation substrate provided with the insulating layer 212, the transistors, the light-receiving element 110, the light-emitting elements, and the like and a second formation substrate provided with the insulating layer 157, the resin layer 159, the light shielding layer 158, and the like are bonded to each other with the adhesive layer 142. Then, the substrate 153 is bonded to a surface exposed by separation of the first formation substrate, and the substrate 154 is bonded to a surface exposed by separation of the second formation substrate, whereby the components formed over the first formation substrate and the second formation substrate are transferred to the substrate 153 and the substrate 154. The substrate 153 and the substrate 154 preferably have flexibility. Accordingly, the flexibility of the display device 100E can be increased.

The inorganic insulating film that can be used as the insulating layer 211, the insulating layer 213, and the insulating layer 215 can be used as the insulating layer 212 and the insulating layer 157.

The light-emitting element 190R has a stacked-layer structure in which the pixel electrode 191, the common layer 112, the light-emitting layer 193R, the common layer 114, and the common electrode 115 are stacked in this order from an insulating layer 214*b* side. The pixel electrode 191 is connected to a conductive layer 169 through an opening provided in the insulating layer 214*b*. The conductive layer 169 is connected to the conductive layer 222*b* included in the transistor 248 through an opening provided in an insulating layer 214*a*. The conductive layer 222*b* is connected to a low-resistance region 231*n* through an opening provided in the insulating layer 215. That is, the pixel electrode 191 is electrically connected to the transistor 248. The transistor 248 has a function of controlling the driving of the light-emitting element 190R.

Similarly, the light-emitting element 190G has a stacked-layer structure in which the pixel electrode 191, the common layer 112, the light-emitting layer 193G, the common layer 114, and the common electrode 115 are stacked in this order from the insulating layer 214*b* side. The pixel electrode 191 is electrically connected to the low-resistance region 231*n* of the transistor 249 through the conductive layer 169 and the conductive layer 222*b* of the transistor 249. That is, the pixel electrode 191 is electrically connected to the transistor 249. The transistor 249 has a function of controlling the driving of the light-emitting element 190G.

In addition, the light-emitting element 190B has a stacked-layer structure in which the pixel electrode 191, the common layer 112, the light-emitting layer 193B, the common layer 114, and the common electrode 115 are stacked in this order from the insulating layer 214*b* side. The pixel electrode 191 is electrically connected to the low-resistance region 231*n* of the transistor 240 through the conductive layer 169 and the conductive layer 222*b* of the transistor 240. That is, the pixel electrode 191 is electrically connected to the transistor 240. The transistor 240 has a function of controlling the driving of the light-emitting element 190B.

The light-receiving element 110 has a stacked-layer structure in which the pixel electrode 191, the common layer 112, the active layer 183, the common layer 114, and the common electrode 115 are stacked in this order from the insulating layer 214*b* side.

The end portion of the pixel electrode 191 is covered with the partition 216. The pixel electrode 191 contains a material that reflects visible light, and the common electrode 115 contains a material that transmits visible light.

Light emitted from the light-emitting elements 190R, 190G, and 190B is emitted toward the substrate 154 side. Light enters the light-receiving element 110 through the substrate 154 and the adhesive layer 142. For the substrate 154, a material having a high visible-light-transmitting property is preferably used.

The pixel electrodes 191 can be formed using the same material in the same step. The common layer 112, the common layer 114, and the common electrode 115 are used in common in the light-receiving element 110 and the light-emitting elements 190R, 190G, and 190B. The light-receiving element 110 and the light-emitting element of each color can have a common structure except for the active layer 183 and the light-emitting layer. Thus, the light-receiving element 110 can be incorporated into the display device 100E without a significant increase in the number of manufacturing steps.

The resin layer 159 and the light shielding layer 158 are provided on a surface of the insulating layer 157 on the substrate 153 side. The resin layer 159 is provided in positions overlapping with the light-emitting elements 190R, 190G, and 190B and is not provided in a position overlapping with the light-receiving element 110. The light shielding layer 158 is provided to cover the surface of the insulating layer 157 on the substrate 153 side, a side surface of the resin layer 159, and a surface of the resin layer 159 on the substrate 153 side. The light shielding layer 158 has openings in a position overlapping with the light-receiving element 110 and in positions overlapping with the light-emitting elements 190R, 190G, and 190B. Providing the light shielding layer 158 can control the range where the light-receiving element 110 detects light. Furthermore, with the light shielding layer 158, light can be inhibited from directly entering the light-receiving element 110 from the light-emitting elements 190R, 190G, and 190B without through an object. Hence, a sensor with less noise and high sensitivity can be obtained. Providing the resin layer 159 allows the distance from the light shielding layer 158 to the light-emitting element of each color to be shorter than the distance from the light shielding layer 158 to the light-receiving element 110. Accordingly, viewing angle dependence of display can be inhibited while noise of the sensor is reduced. Thus, both the display quality and the imaging quality can be increased.

As illustrated in FIG. 23, the partition 216 has an opening between the light-receiving element 110 and the light-emitting element 190R. A light shielding layer 219*a* is provided to fill the opening. The light shielding layer 219*a* is positioned between the light-receiving element 110 and the light-emitting element 190R. The light shielding layer 219*a* absorbs light emitted from the light-emitting element 190R. This can inhibit stray light from entering the light-receiving element 110.

A spacer 219*b* is provided over the partition 216 and positioned between the light-emitting element 190G and the light-emitting element 190B. A top surface of the spacer 219*b* is preferably closer to the light shielding layer 158 than a top surface of the light shielding layer 219*a* is. For example, the sum of the height (thickness) of the partition 216 and the height (thickness) of the spacer 219*b* is preferably larger than the height (thickness) of the light shielding layer 219*a*. Thus, filling with the adhesive layer 142 can be facilitated. As illustrated in FIG. 24A, the light shielding layer 158 may be in contact with the common electrode 115 (or the protective layer) in a portion where the spacer 219*b* and the light shielding layer 158 overlap with each other.

The connection portion 244 is provided in a region of the substrate 153 that does not overlap with the substrate 154. In the connection portion 244, the wiring 165 is electrically connected to the FPC 172 through a conductive layer 167, the conductive layer 166, and the connection layer 242. The conductive layer 167 can be obtained by processing the same conductive film as the conductive layer 169. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

Each of the transistor 243, the transistor 248, the transistor 249, and the transistor 240 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

In FIG. 23 and FIG. 24A, the insulating layer 225 overlaps with the channel formation region 231*i* of the semiconductor layer 231 and does not overlap with the low-resistance regions 231*n*. The structure illustrated in FIG. 23 and FIG. 24A can be formed by processing the insulating layer 225 using the conductive layer 223 as a mask, for example. In FIG. 23 and FIG. 24A, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer that covers the transistor may be provided.

Figure 24B:
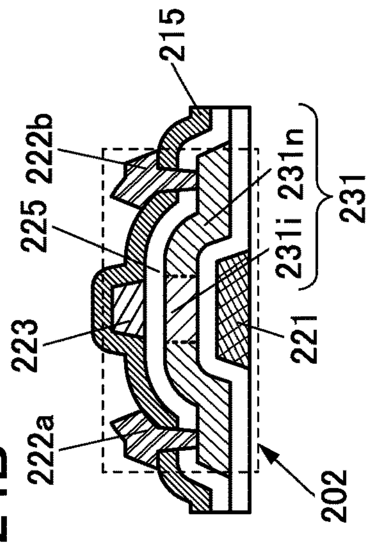
FIG. 24B is a cross-sectional view illustrating an example of a transistor.

Meanwhile, FIG. 24B illustrates an example in which the insulating layer 225 covers a top surface and a side surface of the semiconductor layer. The conductive layer 222*a* and the conductive layer 222*b* are connected to the corresponding low-resistance regions 231*n* through openings provided in the insulating layer 225 and the insulating layer 215.

At least part of this embodiment can be implemented in combination with the other embodiments described in this specification as appropriate.

Embodiment 3

Described in this embodiment is a metal oxide (also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including a completely amorphous structure), CAAC (c-axis-aligned crystalline), nc (nanocrystal-line), CAC (cloud-aligned composite), single crystal, and polycrystalline (poly crystal) structures can be given as examples of a crystal structure of an oxide semiconductor.

A crystal structure of a film or a substrate can be analyzed with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as “amorphous” unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS, an amorphous oxide semiconductor, or the like by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible; for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, a leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ) and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon, carbon, or the like, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, electronic devices of embodiments of the present invention are described with reference to FIG. 25 to FIG. 27.

The electronic device of one embodiment of the present invention can perform imaging, touch operation detection, or the like in the display portion, for example. Consequently, the electronic device can have improved functionality and convenience, for example.

Examples of electronic devices of embodiments of the present invention include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 25A:
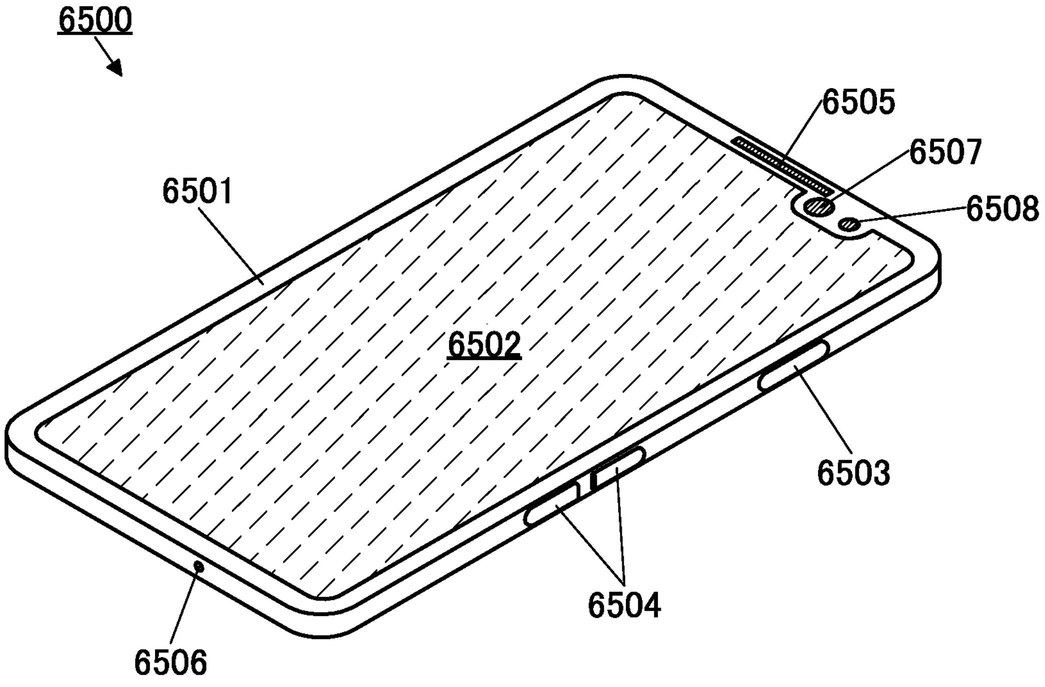
FIG. 25A and FIG. 25B are diagrams illustrating an example of an electronic device.

An electronic device 6500 illustrated in FIG. 25A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device described in Embodiment 2 can be used in the display portion 6502.

Figure 25B:
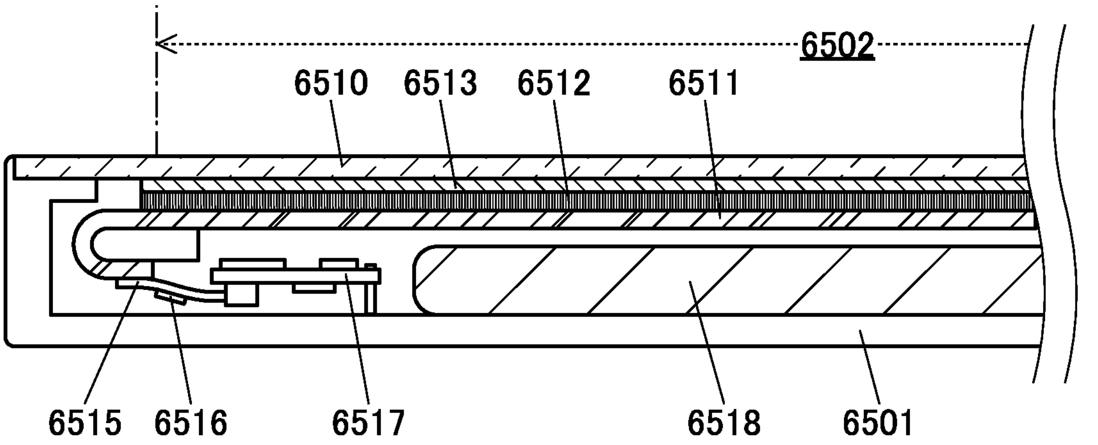

FIG. 25B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display device described in Embodiment 2 as the display panel 6511 allows imaging on the display portion 6502. For example, an image of a fingerprint is captured by the display panel 6511; thus, fingerprint identification can be performed.

When the display portion 6502 further includes the touch sensor panel 6513, the display portion 6502 can be provided with a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 26A:
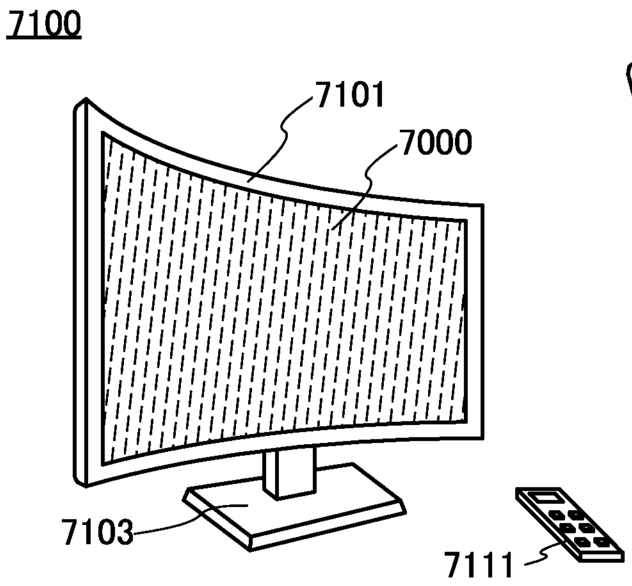
FIG. 26A to FIG. 26D are diagrams illustrating examples of electronic devices.

FIG. 26A illustrates an example of a television device. In a television device 7100, a display portion 7000 is incorporated in a housing 7101. Here, a structure in which the housing 7101 is supported by a stand 7103 is illustrated.

The display device described in Embodiment 2 can be used in the display portion 7000.

Operation of the television device 7100 illustrated in FIG. 26A can be performed with an operation switch provided in the housing 7101, a separate remote controller 7111, or the like. Alternatively, the display portion 7000 may include a touch sensor, and the television device 7100 may be operated by a touch on the display portion 7000 with a finger or the like. The remote controller 7111 may include a display portion for displaying information output from the remote controller 7111. With operation keys or a touch panel provided in the remote controller 7111, channels and volume can be controlled, and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 26B:
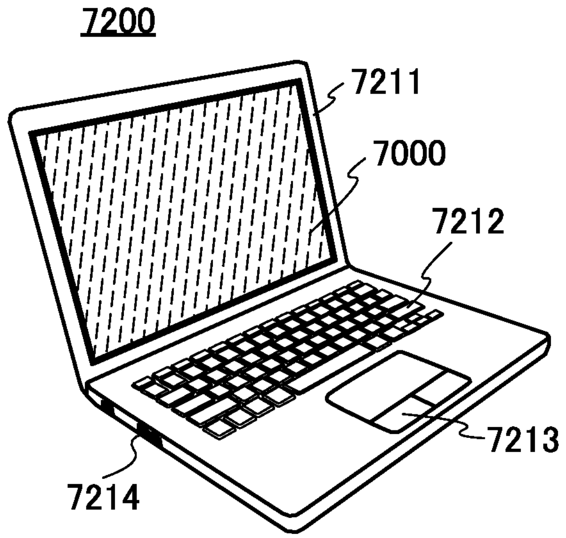

FIG. 26B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display device described in Embodiment 2 can be used in the display portion 7000.

Figure 26C:
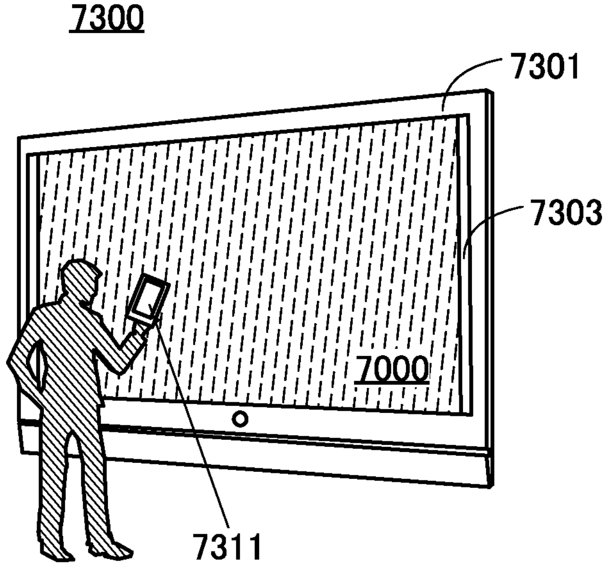
Figure 26D:
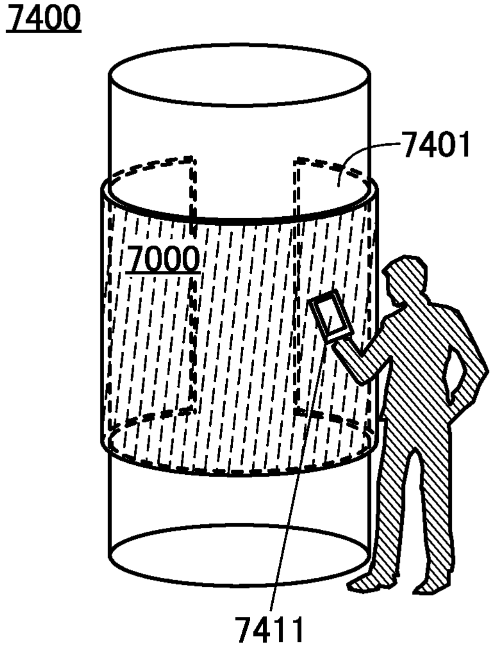

FIG. 26C and FIG. 26D illustrate examples of digital signage.

Digital signage 7300 illustrated in FIG. 26C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 26D illustrates digital signage 7400 attached to a cylindrical pillar 7401. The digital signage 7400 includes the display portion 7000 provided along a curved surface of the pillar 7401.

A larger area of the display portion 7000 can increase the amount of information that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 26C and FIG. 26D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

The display device described in Embodiment 2 can be used in the display portion of the information terminal 7311 or the information terminal 7411 in FIG. 26C and FIG. 26D.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 27A to FIG. 27F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 27A to FIG. 27F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image, a moving image, or the like and storing the taken image in a recording medium (an external recording medium or a recording medium incorporated in the camera), a function of displaying the taken image on the display portion, or the like.

The details of the electronic devices illustrated in FIG. 27A to FIG. 27F are described below.

Figure 27A:
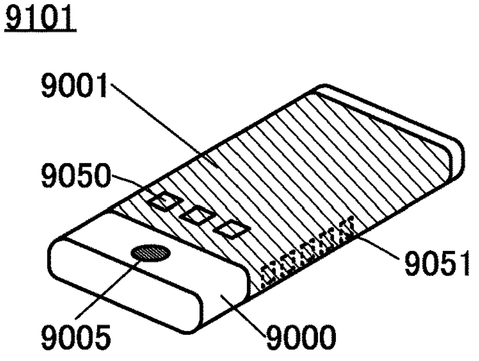
FIG. 27A to FIG. 27F are diagrams illustrating examples of electronic devices.

FIG. 27A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters, image information, or the like on its plurality of surfaces. FIG. 27A illustrates an example where three icons 9050 are displayed. Information 9051 indicated by dashed rectangles can be displayed on another surface of the display portion 9001. Examples of the information 9051 include notification of reception of an e-mail, SNS, an incoming call, or the like, the title and sender of an e-mail, SNS, or the like, the date, the time, remaining battery, and the reception strength of an antenna. Alternatively, the icon 9050 or the like may be displayed at the position where the information 9051 is displayed.

Figure 27B:
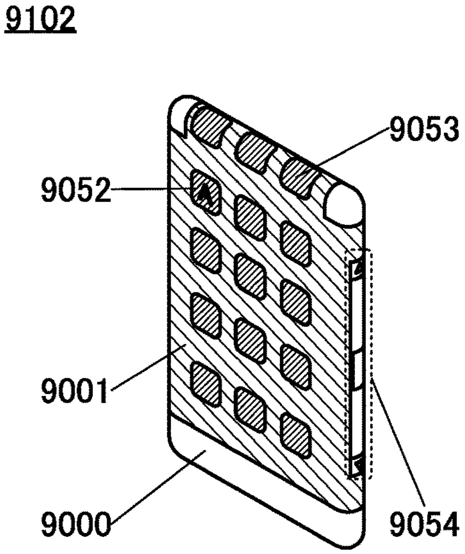

FIG. 27B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 27C:
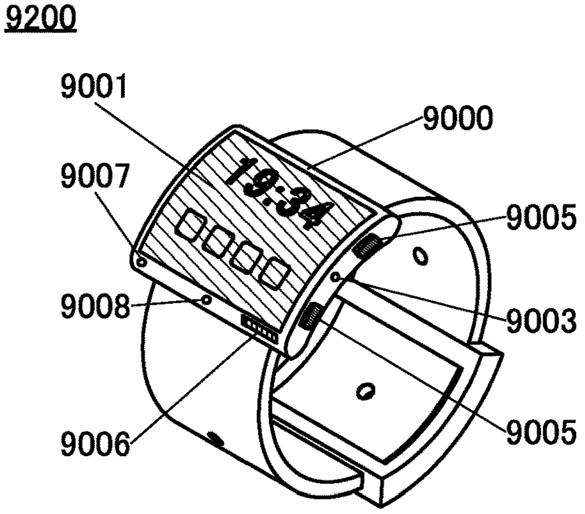

FIG. 27C is a perspective view illustrating a watch-type portable information terminal 9200. The information terminal 9200 can be used as a smartwatch, for example. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal, charging, and the like. Note that the charging operation may be performed by wireless power feeding.

Figure 27D:
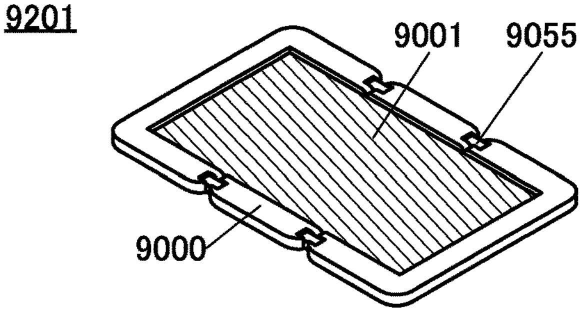
Figure 27E:
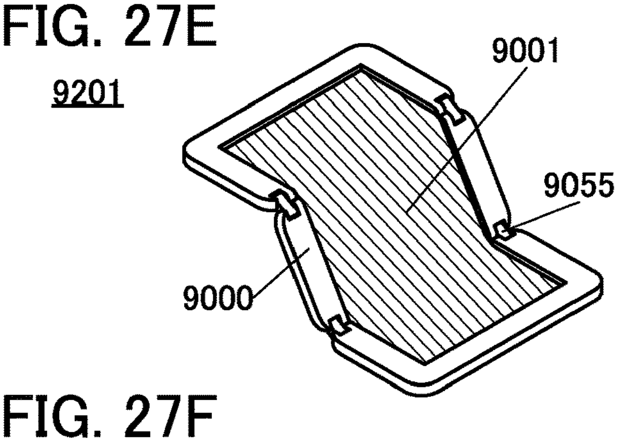
Figure 27F:
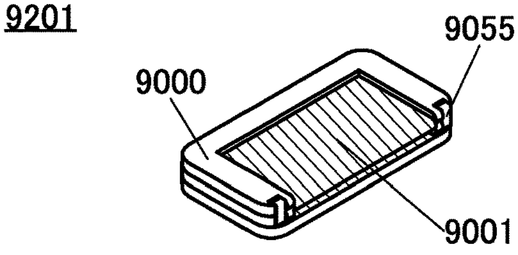

FIG. 27D to FIG. 27F are perspective views illustrating a foldable portable information terminal 9201. FIG. 27D is a perspective view of an opened state of the portable information terminal 9201, FIG. 27F is a perspective view of a folded state thereof, and FIG. 27E is a perspective view of a state in the middle of change from one of FIG. 27D and FIG. 27F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

GL, SLR, SLB, SLG, SE, RS, TX: wiring, ELR, ELB, ELG: light-emitting element, PD, PDG, PDR: light-receiving element, MER: light-emitting and light-receiving element, AL, CL, REN, VCP, VPI, VRS: wiring, M1 to M3: transistor, M10 to M14: transistor, C1, C2: capacitor, ADC: converter circuit, DAC: converter circuit, AMP: amplifier circuit, HLD: holding circuit, PA: amplifier circuit, SR, SB, SG: video signal, $S_{OUT}$: output signal, 10, 10A, 10B, 10C: display device, 11: display portion, 12, 13, 14: circuit portion, 20, 21R, 21B, 21G: pixel, 22, 22R, 22B, 22G: light-receiving pixel, 30, 30R, 30B, 30G: pixel, 31R: circuit, 32: circuit, 41, 42, 43: circuit portion

The invention claimed is:

1. A display device comprising:

a first pixel, a second pixel, and a first wiring, wherein the first pixel comprises a light-emitting element, wherein the second pixel comprises a light-receiving element, wherein the first pixel is supplied with image data from the first wiring, wherein the second pixel outputs received-light data to the first wiring, wherein the second pixel comprises a third transistor, a fourth transistor, and a fifth transistor, wherein one of a source and a drain of the third transistor is electrically connected to the first wiring, and the other of the source and the drain of the third transistor is electrically connected to one of a source and a drain of the fourth transistor, wherein a gate of the fourth transistor is electrically connected to one of a source and a drain of the fifth transistor, and wherein the one of the source and the drain of the fifth transistor is electrically connected to one electrode of the light-receiving element.

2. The display device according to claim 1, wherein the first pixel comprises a first transistor and a second transistor, wherein one of a source and a drain of the first transistor is electrically connected to the first wiring, and the other of the source and the drain of the first transistor is electrically connected to a gate of the second transistor, and wherein one of a source and a drain of the second transistor is electrically connected to one electrode of the light-emitting element.

3. The display device according to claim 1, further comprising a selector circuit, a digital-analog converter circuit, an analog-digital converter circuit, an eighth wiring, and a ninth wiring, wherein the selector circuit has a function of selecting electrical continuity between the first wiring and any one of the eighth wiring and the ninth wiring, wherein the digital-analog converter circuit comprises an output terminal electrically connected to the eighth wiring, and wherein the analog-digital converter circuit comprises an input terminal electrically connected to the ninth wiring.

4. A display device comprising:

first to seventh wirings and first to sixth pixels, wherein the first pixel, the third pixel, and the fifth pixel comprise light-emitting elements emitting light of different colors, wherein the second pixel, the fourth pixel, and the sixth pixel each comprise a light-receiving element, wherein the first pixel is supplied with first image data from the first wiring, wherein the third pixel is supplied with second image data from the second wiring, wherein the fifth pixel is supplied with third image data from the third wiring, wherein the second pixel outputs first received-light data to the first wiring, wherein the fourth pixel outputs second received-light data to the second wiring, wherein the sixth pixel outputs third received-light data to the third wiring, wherein the first pixel is supplied with a first selection signal from the fourth wiring, wherein the third pixel is supplied with a second selection signal from the fifth wiring, wherein the fifth pixel is supplied with a third selection signal from the sixth wiring, and wherein the second pixel, the fourth pixel, and the sixth pixel are supplied with a fourth selection signal from the seventh wiring.

5. The display device according to claim 4, wherein the second pixel, the fourth pixel, and the sixth pixel comprise light-receiving elements receiving light of different colors.

6. A display device comprising:

a first pixel and a first wiring, wherein the first pixel comprises first to fourth transistors and a light-emitting and light-receiving element, wherein the light-emitting and light-receiving element has a function of emitting light in accordance with an electric field and a function of performing photoelectric conversion on incident light, wherein one of a source and a drain of the first transistor is electrically connected to the first wiring and the other of the source and the drain of the first transistor is electrically connected to a gate of the second transistor, wherein one of a source and a drain of the second transistor is electrically connected to one electrode of the light-emitting and light-receiving element, wherein one of a source and a drain of the third transistor is electrically connected to the first wiring and the other of the source and the drain of the third transistor is electrically connected to one of a source and a drain of the fourth transistor, wherein a gate of the fourth transistor is electrically connected to the one electrode of the light-emitting and light-receiving element, wherein the first pixel is supplied with image data from the first wiring, and wherein the first pixel outputs received-light data to the first wiring.

7. The display device according to claim 6, wherein the first pixel comprises fifth and sixth transistors, wherein the one of the source and the drain of the second transistor is electrically connected to one of a source and a drain of the sixth transistor, wherein the gate of the fourth transistor is electrically connected to one of a source and a drain of the fifth transistor, wherein the other of the source and the drain of the fifth transistor is electrically connected to the one electrode of the light-emitting and light-receiving element, and wherein the other of the source and the drain of the sixth transistor is electrically connected to the one electrode of the light-emitting and light-receiving element.

8. A display device comprising:

first to third wirings and first to fifth pixels, wherein the first pixel, the second pixel, and the fourth pixel each comprise a light-emitting and light-receiving element, wherein the light-emitting and light-receiving element has a function of emitting light in accordance with an electric field and a function of performing photoelectric conversion on incident light, wherein the third pixel and the fifth pixel comprise light-emitting elements emitting light of different colors, wherein the first pixel is supplied with first image data from the first wiring, wherein the second pixel is supplied with second image data from the first wiring, wherein the third pixel is supplied with third image data from the second wiring, wherein the fourth pixel is supplied with fourth image data from the first wiring, wherein the fifth pixel is supplied with fifth image data from the third wiring, wherein the first pixel outputs first received-light data to the first wiring, wherein the second pixel outputs second received-light data to the second wiring, and wherein the fourth pixel outputs third received-light data to the third wiring.

9. The display device according to claim 8, further comprising fourth to seventh wirings, wherein the first pixel is supplied with a first selection signal from the fourth wiring, wherein the second pixel and the third pixel are supplied with a second selection signal from the fifth wiring, wherein the fourth pixel and the fifth pixel are supplied with a third selection signal from the sixth wiring, and wherein the first pixel, the second pixel, and the fourth pixel are supplied with a fourth selection signal from the seventh wiring.

* * * * *